US012733280B2

(12) United States Patent
Cho et al.

(10) Patent No.: US 12,733,280 B2
(45) Date of Patent: Sep. 8, 2026

(54) IMAGE SENSOR AND ELECTRONIC APPARATUS INCLUDING THE SAME

(71) Applicant: SAMSUNG ELECTRONICS CO., LTD., Suwon-si (KR)

(72) Inventors: Choonlae Cho, Suwon-si (KR); Sangeun Mun, Suwon-si (KR); Sungmo Ahn, Suwon-si (KR); Sookyoung Roh, Suwon-si (KR); Hyunsung Park, Suwon-si (KR); Seokho Yun, Suwon-si (KR); Sangyun Lee, Suwon-si (KR); Junho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 452 days.

(21) Appl. No.: 18/236,122

(22) Filed: Aug. 21, 2023

(65) Prior Publication Data

US 2024/0079430 A1 Mar. 7, 2024

(30) Foreign Application Priority Data

Sep. 2, 2022 (KR) ........................ 10-2022-0111593

(51) Int. Cl.
*H10F 39/00* (2025.01)
*H10F 39/18* (2025.01)

(52) U.S. Cl.
CPC ....... *H10F 39/8063* (2025.01); *H10F 39/182* (2025.01); *H10F 39/8053* (2025.01); *H10F 39/807* (2025.01)

(58) Field of Classification Search
CPC ............... H10F 39/8063; H10F 39/182; H10F 39/8053; H10F 39/807; H10F 39/8023;
(Continued)

(56) References Cited

U.S. PATENT DOCUMENTS 9,653,501 B2 * 5/2017 Ungnapatanin ....... H10F 39/024
11,177,303 B2 * 11/2021 Yang .................. H10F 39/8063
(Continued)

FOREIGN PATENT DOCUMENTS

KR 10-2021-0048400 A 5/2021
KR 10-2021-0049670 A 5/2021
(Continued)

OTHER PUBLICATIONS

Communication issued on Jan. 1, 2024 by the Korean Intellectual Property Office for Korean Patent Application No. 10-2022-0111593.

(Continued)

*Primary Examiner* — Vu A Vu
(74) *Attorney, Agent, or Firm* — Sughrue Mion, PLLC

(57) ABSTRACT

An image sensor includes a sensor substrate includes first, second, and third pixels respectively sensing first, second and third wavelengths of light, A color separating lens array changes phase of light of the first, second, and third wavelengths, and condenses the phase-changed light onto the first, second and third pixels, respectively. The color separating lens array includes first to third pixel corresponding regions respectively facing the first to third pixels. The first pixel corresponding region includes a plurality of first nanoposts, the second pixel corresponding region includes a plurality of second nanoposts, and the third pixel corresponding region includes a plurality of third nanoposts, a second center nanopost having a greatest cross-sectional width among the second nanoposts overlaps a center of the second pixel, and a third center nanopost having a greatest cross-sectional width among the third nanoposts does not overlap a center of the third pixel.

20 Claims, 33 Drawing Sheets

(58) Field of Classification Search
CPC ...... H10F 39/151; H10F 39/156; H10F 39/18; H10F 39/802; H10F 39/806; G01J 3/50; H04N 25/70
USPC .......................................................... 257/432
See application file for complete search history.

(56) References Cited

U.S. PATENT DOCUMENTS

| | | | | |
|---|---|---|---|---|
| 2021/0125301 | A1* | 4/2021 | Park | G06T 1/0007 |
| 2021/0126032 | A1* | 4/2021 | Roh | H10F 39/8023 |
| 2021/0126035 | A1 | 4/2021 | Roh et al. | |
| 2021/0167110 | A1* | 6/2021 | Roh | H10F 39/8023 |
| 2021/0249459 | A1* | 8/2021 | Yun | H10F 39/8053 |
| 2021/0366964 | A1* | 11/2021 | Ito | H10F 39/8053 |
| 2022/0137268 | A1 | 5/2022 | Yun et al. | |
| 2023/0139533 | A1 | 5/2023 | Mun et al. | |
| 2023/0230191 | A1 | 7/2023 | Park et al. | |
| 2023/0251403 | A1 | 8/2023 | Park et al. | |
| 2023/0324586 | A1 | 10/2023 | Yun et al. | |
| 2024/0063241 | A1 | 2/2024 | Mun et al. | |
| 2024/0063242 | A1 | 2/2024 | Yun et al. | |
| 2024/0079429 | A1 | 3/2024 | Ahn et al. | |
| 2024/0079430 | A1 | 3/2024 | Cho et al. | |
| 2024/0080577 | A1 | 3/2024 | Lee et al. | |

FOREIGN PATENT DOCUMENTS

| | | | |
|---|---|---|---|
| KR | 10-2022-0058386 | A | 5/2022 |
| KR | 10-2022-0058388 | A | 5/2022 |

OTHER PUBLICATIONS

Communication issued on Mar. 4, 2024 by the European Patent Office for European Patent Application No. 23194269.9.

* cited by examiner

130

GL1

131 132 131 132 131 132
133 134 133 134 133 134
131 132 131 132 131 132
133 134 133 134 133 134
131 132 131 132 131 132
133 134 133 134 133 134

Y
Z
X

130
BL
Y
Z
X

| 131 | 132 | 131 | 132 | 131 | 132 |
|---|---|---|---|---|---|
| 133 | 134 | 133 | 134 | 133 | 134 |
| 131 | 132 | 131 | 132 | 131 | 132 |
| 133 | 134 | 133 | 134 | 133 | 134 |
| 131 | 132 | 131 | 132 | 131 | 132 |
| 133 | 134 | 133 | 134 | 133 | 134 |

130
RL

| 131 | 132 | 131 | 132 | 131 | 132 |
|---|---|---|---|---|---|
| 133 | 134 | 133 | 134 | 133 | 134 |
| 131 | 132 | 131 | 132 | 131 | 132 |
| 133 | 134 | 133 | 134 | 133 | 134 |
| 131 | 132 | 131 | 132 | 131 | 132 |
| 133 | 134 | 133 | 134 | 133 | 134 |

Y
Z
X

130
GL2

| 131 | 132 | 131 | 132 | 131 | 132 |
|---|---|---|---|---|---|
| 133 | 134 | 133 | 134 | 133 | 134 |
| 131 | 132 | 131 | 132 | 131 | 132 |
| 133 | 134 | 133 | 134 | 133 | 134 |
| 131 | 132 | 131 | 132 | 131 | 132 |
| 133 | 134 | 133 | 134 | 133 | 134 |

Y
Z
X

IMAGE SENSOR AND ELECTRONIC APPARATUS INCLUDING THE SAME

CROSS-REFERENCE TO RELATED APPLICATION

This application is based on and claims priority under 35 U.S.C. § 119 to Korean Patent Application No. 10-2022-0111593, filed on Sep. 2, 2022, in the Korean Intellectual Property Office, the disclosure of which is incorporated by reference herein in its entirety.

BACKGROUND

1. Field

The disclosure relates to an image sensor and an electronic apparatus including the same.

2. Description of Related Art

In general, an image sensor senses the color of incident light by using a color filter. However, because the color filter absorbs light of colors other than light of a corresponding color, the light utilization efficiency thereof may be degraded. For example, in the case of using an RGB color filter, because only ⅓ of the incident light is transmitted and the other portion of light, that is, ⅔ of the incident light, is absorbed, the light utilization efficiency thereof is just about 33%. Most of the light loss of the image sensor occurs in the color filter. Accordingly, a scheme for separating colors by each pixel without using a color filter has been attempted.

SUMMARY

Provided is an image sensor including a color separating lens array capable of separating and condensing incident light by wavelength.

Provided is an image sensor with improved light efficiency and autofocus performance.

Additional aspects will be set forth in the description which follows. Additional aspects will be apparent from the description, or may be learned by practice of example embodiments of the disclosure.

According to an aspect of the disclosure, an image sensor includes a sensor substrate including a first pixel sensing light of a first wavelength, a second pixel sensing light of a second wavelength shorter than the first wavelength, and a third pixel sensing light of a third wavelength longer than the first wavelength, wherein each of the first to third pixels includes a plurality of light sensing cells, and a color separating lens array changing phase of the light of the first wavelength, the second wavelength, and the third wavelength and condensing the phase-changed light of the first wavelength, the second wavelength, and the third wavelength onto the first pixel, the second pixel, and the third pixel respectively, wherein the color separating lens array includes a first pixel corresponding region, a second pixel corresponding region, and a third pixel corresponding region respectively facing the first pixel, the second pixel and the third pixel, wherein the first pixel corresponding region includes a plurality of first nanoposts, the second pixel corresponding region includes a plurality of second nanoposts, and the third pixel corresponding region includes a plurality of third nanoposts, a second center nanopost having a greatest cross-sectional width among the plurality of second nanoposts is arranged at a position overlapping a center of the second pixel, and a third center nanopost having a greatest cross-sectional width among the plurality of third nanoposts is arranged at a position not overlapping a center of the third pixel.

A width of the second center nanopost may be greater than or equal to a width of the third center nanopost.

Each of the first to third pixels may include an isolation structure having a shape separating adjacent light sensing cells, wherein the light sensing cells are disposed in a first direction and a second direction, the first direction and the second direction being perpendicular to each other, and when viewed in a third direction perpendicular to the first direction and the second direction, the second center nanopost may be arranged to overlap a center of the isolation structure included in the second pixel.

When viewed in the third direction, second nanoposts other than the second center nanopost among the plurality of second nanoposts may be arranged not to overlap the isolation structure included in the second pixel.

When viewed in the third direction, all of the plurality of first nanoposts may be arranged not to overlap the isolation structure included in the first pixel.

A first center nanopost having a greatest cross-sectional width among the plurality of first nanoposts may be arranged closer to a center of the first pixel corresponding region than other of the plurality of first nanoposts.

The second center nanopost and other second nanoposts among the plurality of second nanoposts may be arranged to partially overlap each other when viewed in the first direction, and the first center nanopost and other first nanoposts among the plurality of first nanoposts may be arranged to partially overlap each other when viewed in the first direction.

Degrees of the overlapping may be different from each other in the second pixel corresponding region and the first pixel corresponding region.

A width of the first center nanopost may be less than or equal to the width of the second center nanopost and the width of the third center nanopost.

The third center nanopost among the plurality of third nanoposts may be arranged closer to a center of the third pixel corresponding region than other of the plurality of third nanoposts.

The width of the third center nanopost may be greater than or equal to a width of a first center nanopost having a greatest cross-sectional width among the plurality of first nanoposts.

When viewed in the third direction, a first center nanopost having a greatest cross-sectional width among the plurality of first nanoposts may be arranged to overlap a center of the isolation structure included in the first pixel.

The second center nanopost and other second nanoposts among the plurality of second nanoposts may be arranged to partially overlap each other when viewed in the first direction, and the first center nanopost and other first nanoposts among the plurality of first nanoposts may be arranged to partially overlap each other when viewed in the first direction.

Degrees of the overlapping may be different from each other in the second pixel corresponding region and the first pixel corresponding region.

A width of the first center nanopost may be less than or equal to the width of the second center nanopost.

Each of the plurality of first to third nanoposts may be stacked and arranged as a plurality of layers.

The sensor substrate may further include a fourth pixel sensing a light of the first wavelength, and the first to fourth pixels may be arranged in a Bayer pattern form.

A distance between the sensor substrate and the color separating lens array may be less than a focal length of the light of the first wavelength by the color separating lens array.

The image sensor may further include a color filter arranged between the sensor substrate and the color separating lens array, wherein a distance between the color separating lens array and the color filter may be about 1 μm or more and about 2 μm or less.

According to another aspect of the disclosure, an electronic apparatus includes a lens assembly including one or more lenses and forming an optical image of an object, an image sensor converting the optical image formed by the lens assembly into an electrical signal, and a processor configured to process the electrical signal generated by the image sensor, wherein the image sensor includes a sensor substrate including a first pixel sensing light of a first wavelength, a second pixel sensing light of a second wavelength shorter than the first wavelength, and a third pixel sensing light of a third wavelength longer than the first wavelength, wherein each of the first to third pixels includes a plurality of light sensing cells, and a color separating lens array changing phase of the light of the first wavelength, the second wavelength, and the third wavelength and condensing the phase-changed light of the first wavelength, the second wavelength, and the third wavelength onto the first pixel, the second pixel, and the third pixel respectively, wherein the color separating lens array includes a first pixel corresponding region, a second pixel corresponding region, and a third pixel corresponding region respectively facing the first pixel, the second pixel and the third pixel, wherein the first pixel corresponding region includes a plurality of first nanoposts, the second pixel corresponding region includes a plurality of second nanoposts, and the third pixel corresponding region includes a plurality of third nanoposts, a second center nanopost having a greatest cross-sectional width among the plurality of second nanoposts is arranged at a position overlapping a center of the second pixel, and a third center nanopost having a greatest cross-sectional width among the plurality of third nanoposts is arranged at a position not overlapping a center of the third pixel.

BRIEF DESCRIPTION OF THE DRAWINGS

The above and other aspects, features, and advantages of example embodiments of the disclosure will be more apparent from the following description taken in conjunction with the accompanying drawings, in which.

DETAILED DESCRIPTION

Figure 1:
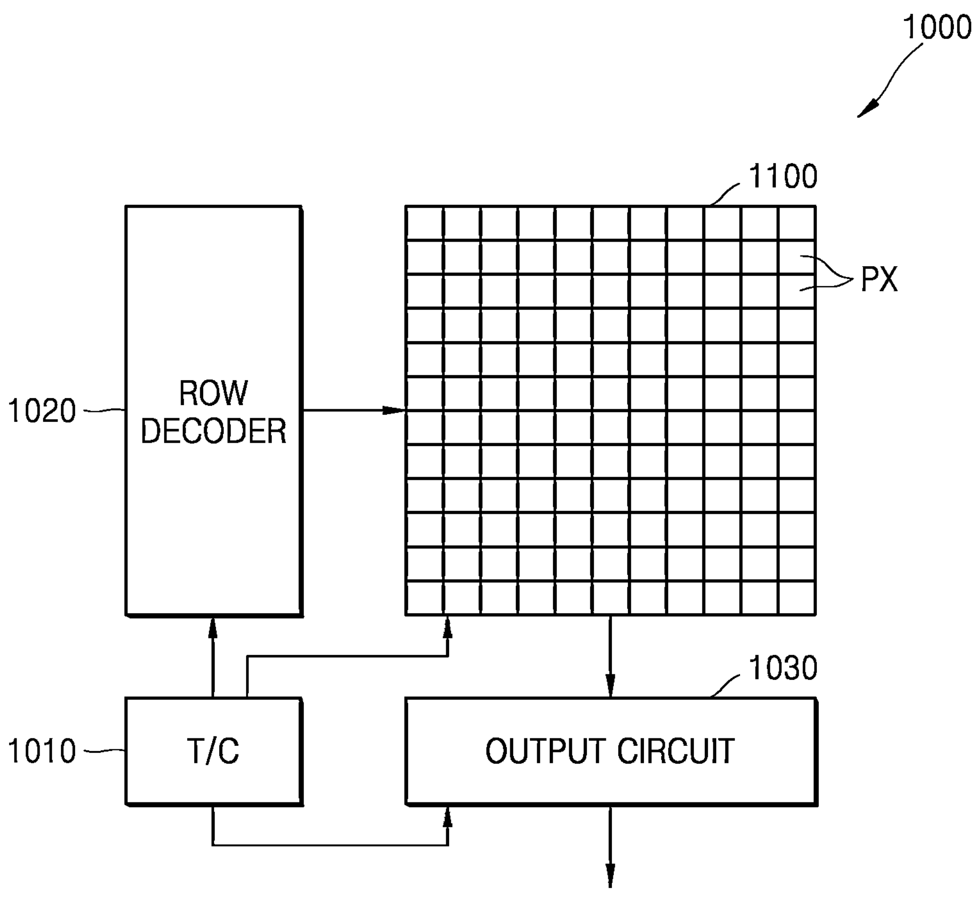
FIG. 1 is a block diagram of an image sensor according to an embodiment.

Reference will now be made in detail to embodiments, examples of which are illustrated in the accompanying drawings, wherein like reference numerals refer to like elements throughout. In this regard, example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. The described embodiments are merely examples, and various modifications may be made therein. In the drawings, like reference numerals may denote like elements, and the size of each element may be exaggerated for clarity and convenience of description.

As used herein, the terms "over" or "on" may include not only "directly over" or "directly on" but also "indirectly over" or "indirectly on".

Although terms such as "first" and "second" may be used herein to describe various elements, these terms are only used to distinguish an element from another element. These terms are not intended to limit that the materials or structures of elements are different from each other.

As used herein, the singular forms "a", "an", and "the" are intended to include the plural forms as well, unless the context clearly indicates otherwise. Also, when something is referred to as "including" a component, another component may be further included unless specified otherwise.

Also, as used herein, the terms "units" and "modules" may refer to units that perform at least one function or operation, and the units may be implemented as hardware or software or a combination of hardware and software.

The use of the terms "a", "an", and "the" and other similar indicative terms may be construed to cover both the singular and the plural.

Operations of a method described herein may be performed in any suitable order unless otherwise specified. Also, example terms (e.g., "such as" and "and/or the like") used herein are merely intended to describe the technical concept of the disclosure, and the scope of the disclosure is not limited by the examples unless otherwise defined in the appended claims.

Referring to FIG. 1, an image sensor 1000 may include a pixel array 1100, a timing controller 1010, a row decoder 1020, and an output circuit 1030. The image sensor 1000 may include a charge coupled device (CCD) image sensor or a complementary metal oxide semiconductor (CMOS) image sensor.

The pixel array 1100 may include pixels that are two-dimensionally arranged in a plurality of rows and columns. The row decoder 1020 may select one of the rows of the pixel array 1100 in response to a row address signal output from the timing controller 1010. The output circuit 1030 may output a light sensing signal in a column unit from a plurality of pixels arranged in the selected row. For this purpose, the output circuit 1030 may include a column decoder and an analog-to-digital converter (ADC). For example, the output circuit 1030 may include a plurality of ADCs arranged respectively for the columns between the column decoder and the pixel array 1100, or one ADC arranged at an output terminal of the column decoder. The timing controller 1010, the row decoder 1020, and the output circuit 1030 may be implemented as one chip or as separate chips. A processor for processing an image signal output from the output circuit 1030 may be implemented as one chip with the timing controller 1010, the row decoder 1020, and the output circuit 1030.

The pixel array 1100 may include a plurality of pixels PX that sense light of different wavelengths. The pixel arrangement may be implemented in various ways. The pixel array 1100 may include a color separating lens array that separates incident light by wavelength such that light of different wavelengths may be incident on the plurality of pixels PX.

Figure 2A:
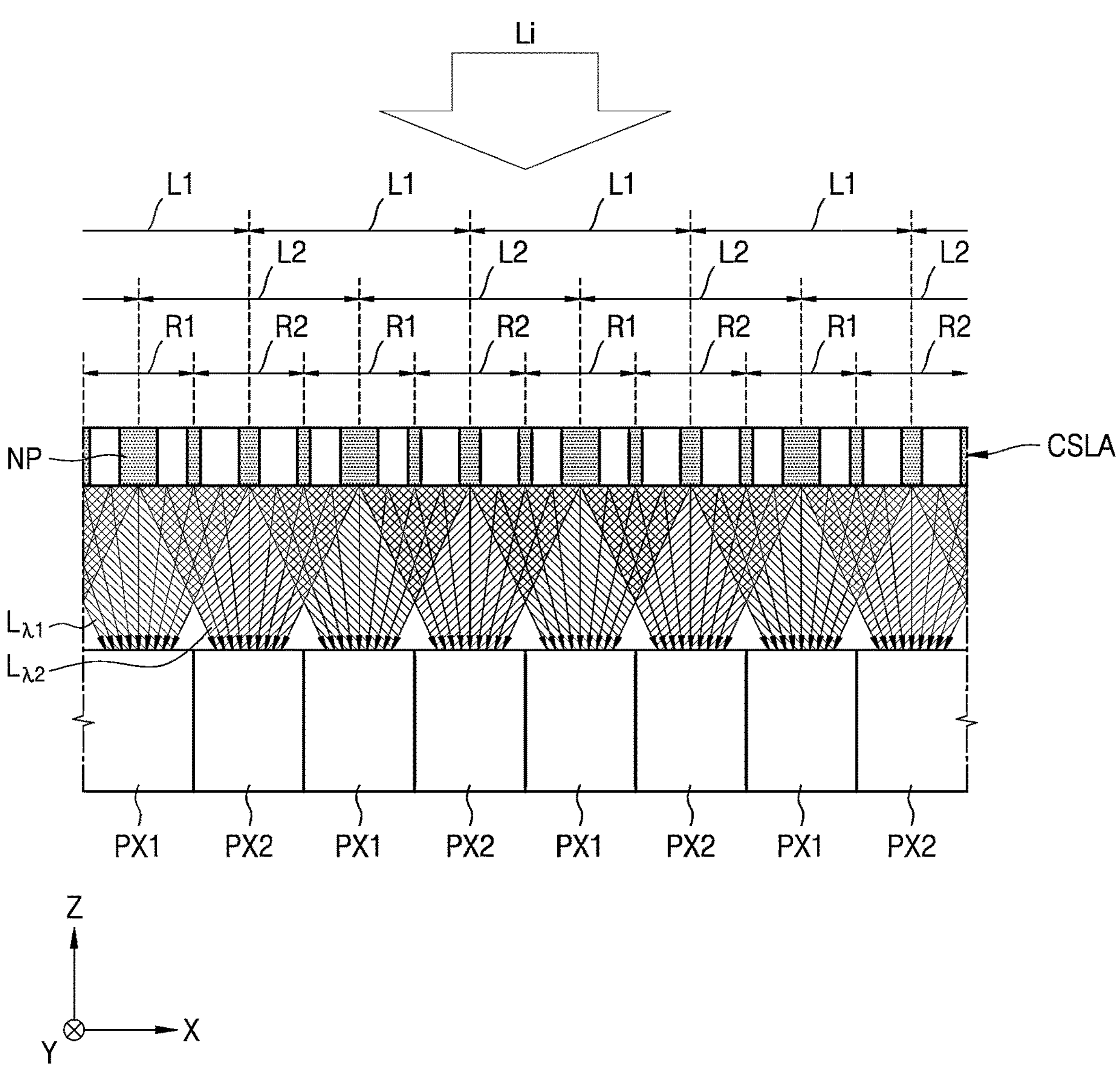
FIGS. 2A and 2B are conceptual diagrams illustrating a schematic structure and operation of a color separating lens array included in an image sensor according to an embodiment.
Figure 2B:
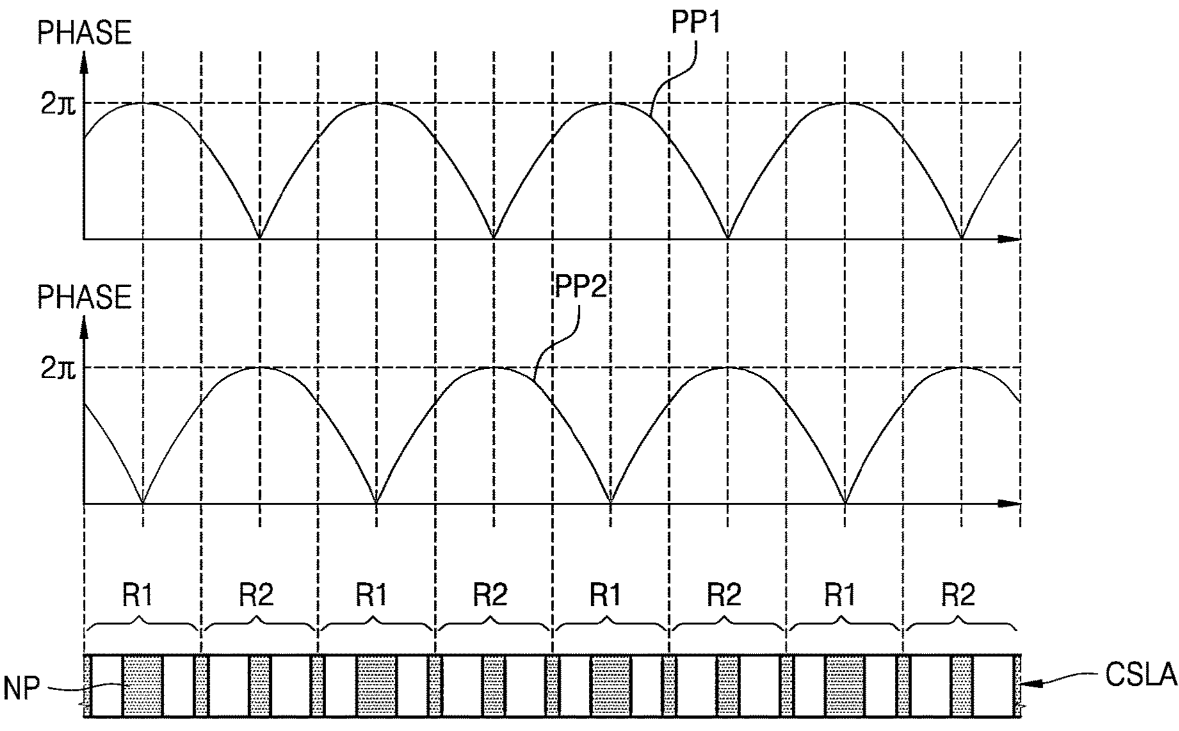
Figure 2B:
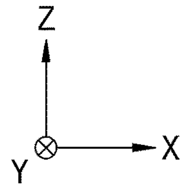

FIGS. 2A and 2B are conceptual diagrams illustrating a schematic structure and operation of a color separating lens array included in an image sensor according to an embodiment.

Referring to FIG. 2A, a color separating lens array CSLA may include a plurality of nanoposts NP that change the phase of incident light Li differently according to incident positions thereof. The color separating lens array CSLA may be partitioned in various ways. For example, the color separating lens array CSLA may be partitioned into a first pixel corresponding region R1 corresponding to a first pixel PX1 onto which first wavelength light $L_{\lambda 1}$ included in the incident light Li is condensed and a second pixel corresponding region R2 corresponding to a second pixel PX2 onto which second wavelength light $L_{\lambda 2}$ included in the incident light Li is condensed. Each of the first and second pixel corresponding regions R1 and R2 may include one or more nanoposts NP of various dimension, and the first and second pixel corresponding regions R1 and R2 may be arranged respectively facing the first and second pixels PX1 and PX2. As another example, the color separating lens array CSLA may be partitioned into a first wavelength light condensing region L1 for condensing the first wavelength light $L_{\lambda 1}$ onto the first pixel PX1 and a second wavelength light condensing region L2 for condensing the second wavelength light $L_{\lambda 2}$ onto the second pixel PX2. The first wavelength light condensing region L1 and the second wavelength light condensing region L2 may partially overlap each other.

The color separating lens array CSLA may generate different phase profiles of the first wavelength light $L_{\lambda 1}$ and the second wavelength light $L_{\lambda 2}$ included in the incident light Li such that the first wavelength light $L_{\lambda 1}$ may be condensed onto the first pixel PX1 and the second wavelength light $L_{\lambda 2}$ may be condensed onto the second pixel PX2.

For example, referring to FIG. 2B, the color separating lens array CSLA may allow the first wavelength light $L_{\lambda 1}$ to have a first phase profile PP1 and the second wavelength light $L_{\lambda 2}$ to have a second phase profile PP2 at a position immediately after passing through the color separating lens array CSLA, that is, on a lower surface of the color separating lens array CSLA, such that the first wavelength light Lid and the second wavelength light $L_{\lambda 2}$ may be respectively condensed onto the first pixel PX1 and the second pixel PX2 corresponding thereto. Particularly, the first wavelength light $L_{\lambda 1}$ that passed through the color separating lens array CSLA may have a phase profile that is greatest at the center of the first pixel corresponding region R1 and decreases away from the center of the first pixel corresponding region R1, that is, toward the second pixel corresponding region R2. This phase profile may be similar to a phase profile of light converging on one point after passing through a convex lens, for example, a micro-lens having a convex center in the first wavelength light condensing region L1, and the first wavelength light $L_{\lambda 1}$ may be condensed onto the first pixel PX1. Also, the second wavelength light $L_{\lambda 2}$ that passed through the color separating lens array CSLA may have a phase profile that is greatest at the center of the second pixel corresponding region R2 and decreases away from the center of the second pixel corresponding region R2, that is, toward the first pixel corresponding region R1, and thus, the second wavelength light $L_{\lambda 2}$ may be condensed onto the second pixel PX2.

Because the refractive index of a material varies depending on the wavelength of light, the color separating lens array CSLA may provide different phase profiles with respect to the first and second wavelength light $L_{\lambda 1}$ and $L_{\lambda 2}$. In other words, because the same material has a different refractive index according to the wavelength of light reacting with the material and a phase delay of the light that passed through the material is different according to the wavelength, the phase profile may vary depending on the wavelength. For example, because the refractive index of the first pixel corresponding region R1 with respect to the first wavelength light $L_{\lambda 1}$ and the refractive index of the first pixel corresponding region R1 with respect to the second wavelength light $L_{\lambda 2}$ may be different from each other and the phase delay of the first wavelength light Lid that passed through the first pixel corresponding region R1 and the phase delay of the second wavelength light $L_{\lambda 2}$ that passed through the first pixel corresponding region R1 may be different from each other, when the color separating lens array CSLA is designed based on the characteristics of light, different phase profiles may be provided with respect to the first wavelength light $L_{\lambda 1}$ and the second wavelength light $L_{\lambda 2}$.

The color separating lens array CSLA may include nanoposts NP that are arranged according to a certain rule such that the first and second wavelength light $L_{\lambda 1}$ and $L_{\lambda 2}$ may respectively have the first and second phase profiles PP1 and PP2. Here, the rule may be applied to parameters such as the shape of the nanoposts NP, sizes (width and height), an interval between the nanoposts NP, and the arrangement form thereof, and these parameters may be determined according to a phase profile to be implemented by the color separating lens array CSLA.

A rule in which the nanoposts NP are arranged in the first pixel corresponding region R1 and a rule in which the nanoposts NP are arranged in the second pixel corresponding region R2 may be different from each other. In other words, the sizes, shapes, intervals, and/or arrangement of the nanoposts NP in the first pixel corresponding region R1 may be different from the sizes, shapes, intervals, and/or arrangement of the nanoposts NP in the second pixel corresponding region R2.

The nanopost NP may have a shape dimension of a sub-wavelength. Here, the sub-wavelength may refer to a wavelength that is less than a wavelength band of light to be branched. The nanopost NP may have a dimension that is less than a shorter wavelength among the first wavelength and the second wavelength. The nanopost NP may have a cylindrical shape having a cross-sectional diameter of a sub-wavelength. However, the shape of the nanopost NP is not limited thereto and may be an elliptical column shape or a polygonal column shape. The nanoposts NP may have post shapes having symmetrical or asymmetrical cross-sectional shapes. Although the nanoposts NP are illustrated as having a uniform width perpendicular to the height direction (Z direction), that is, a cross-section thereof parallel to the height direction is illustrated as having a rectangular shape, this is merely an example. Alternatively, the nanoposts NP may not have a uniform width perpendicular to the height direction; for example, a cross-section thereof parallel to the height direction may have a trapezoidal or inverted trapezoidal shape. When the incident light Li is visible light, the cross-sectional diameter of the nanopost NP may be less than, for example, 400 nm, 300 nm, or 200 nm. Moreover, the height of the nanopost NP may be about 500 nm to about 1,500 nm and may be greater than the cross-sectional diameter. The nanopost NP may be obtained by combining two or more posts stacked in the height direction (Z direction). The height of the nanoposts NP may reach the sub-wavelength or several times the wavelength. For example, the height of the nanoposts NP may be 5 times or less, or 4 times or less, or 3 times or less of the center wavelength of a wavelength band where the color separating lens array CSLA branches. All of the nanoposts NP included in different pixel corresponding regions (R1 and R2) are illustrated as having the same height; however, the disclosure is not limited thereto and all of the arrangement, width, and number of nanoposts NP are merely examples. The width, height, number, and arrangement of nanoposts NP may be suitably determined to form a phase profile for color separation and may also be determined considering detailed manufacturing process conditions.

The space between the nanoposts NP may be filled with a peripheral material layer having a different refractive index than the nanopost NP. The nanopost NP may include a material having a higher refractive index than a peripheral material. For example, the nanopost NP may include c-Si, p-Si, a-Si, a Group III-V compound semiconductor (GaP, GaN, GaAs, or the like), SiC, TiO2, SiN, or any combination thereof. The nanopost NP having a different refractive index than the peripheral material may change the phase of light passing through the nanopost NP. This may be caused by a phase delay that occurs due to the shape dimension of the sub-wavelength of the nanoposts NP, and a degree at which the phase is delayed may be determined by a detailed shape dimension and/or arrangement form of the nanoposts NP. A peripheral material around the nanopost NP may include a dielectric material having a lower refractive index than the nanopost NP. For example, the peripheral material may include $SiO_2$ or air. However, this is merely an example, and the materials of the nanopost NP and the peripheral material may be set such that the nanopost NP may have a lower refractive index than the peripheral material.

The region division of the color separating lens array CSLA and the shape and arrangement of the nanoposts NP may be set to form a phase profile for separating incident light according to wavelengths to be condensed onto a plurality of pixels PX1 and PX2. This wavelength separation may include color separation in the visible light band; however, the disclosure is not limited thereto and the wavelength band may be extended to a range of visible light or infrared light or various other ranges. A first wavelength $\lambda_1$ and a second wavelength $\lambda_2$ may be in a wavelength band of infrared rays or visible rays; however, the disclosure is not limited thereto and various wavelength bands may be included according to the arrangement rule of the array of the plurality of nanoposts NP. Also, it has been described as an example that two wavelengths are branched and condensed; however, the incident light may be branched and condensed in three or more directions according to wavelengths.

Also, a case where the nanoposts NP of the color separating lens array CSLA are arranged as a single layer has been described as an example; however, the color separating lens array CSLA may have a stack structure in which the nanoposts NP are arranged as a plurality of layers.

Figure 3A:
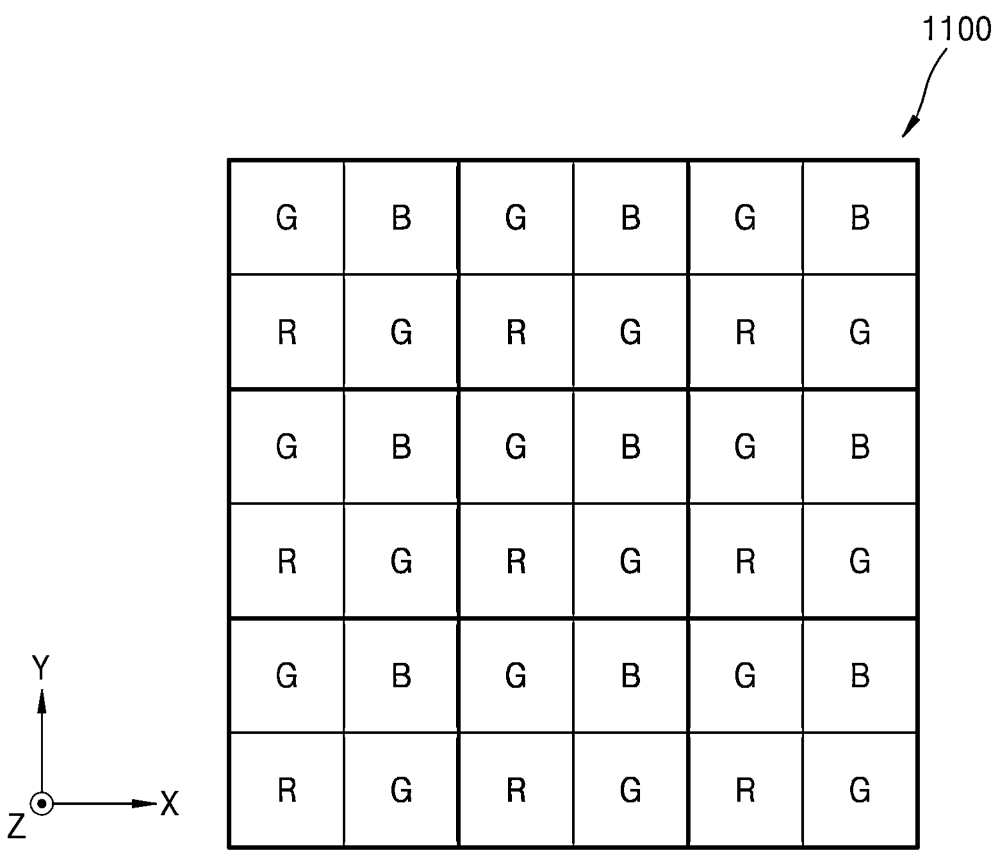
FIG. 3A is a plan view illustrating a color arrangement by a pixel array of an image sensor according to an embodiment.

FIG. 3A is a plan view illustrating a color arrangement by a pixel array of an image sensor according to an embodiment.

The color arrangement illustrated in FIG. 3A may be a Bayer pattern arrangement used in a general image sensor. As illustrated, one unit pattern may include four quadrant regions, and first to fourth quadrants may respectively represent blue (B), green (G), red (R), and green (G). The unit patterns may be repeatedly and two-dimensionally arranged in a first direction (X direction) and a second direction (Y direction). For this color arrangement, two green pixels may be arranged in one diagonal direction in a unit pattern of a 2×2 array type, and one blue pixel and one red pixel may be arranged in the other diagonal direction. In other words, a first row in which a plurality of green pixels and a plurality of blue pixels are alternately arranged in the first direction and a second row in which a plurality of red pixels and a plurality of green pixels are alternately arranged in the first direction may be repeatedly arranged in the second direction.

The color arrangement of FIG. 3A is merely an example and the disclosure is not limited thereto. For example, a CYGM arrangement in which magenta, cyan, yellow, and green appear in one unit pattern or a RGBW arrangement in which green, red, blue, and white appear in one unit pattern may be used. Also, the unit pattern may be implemented as a 3×2 array type. In addition, the pixels of the pixel array 1100 may be arranged in various ways according to the color characteristics of the image sensor 1000. Hereinafter, it will be described as an example that the pixel array 1100 of the image sensor 1000 has a Bayer pattern; however, the operation principles may also be applied to other patterns of pixel arrangement other than the Bayer pattern.

In order to correspond to this color arrangement, the pixel array 1100 of the image sensor 1000 may include a color separating lens array condensing light of a color corresponding to a particular pixel. That is, the region division and the shape and arrangement of the nanoposts NP may be set such that the wavelengths separated by the color separating lens array CSLA illustrated in FIGS. 2A and 2B may be a red wavelength, a green wavelength, and a blue wavelength.

Figure 3B:
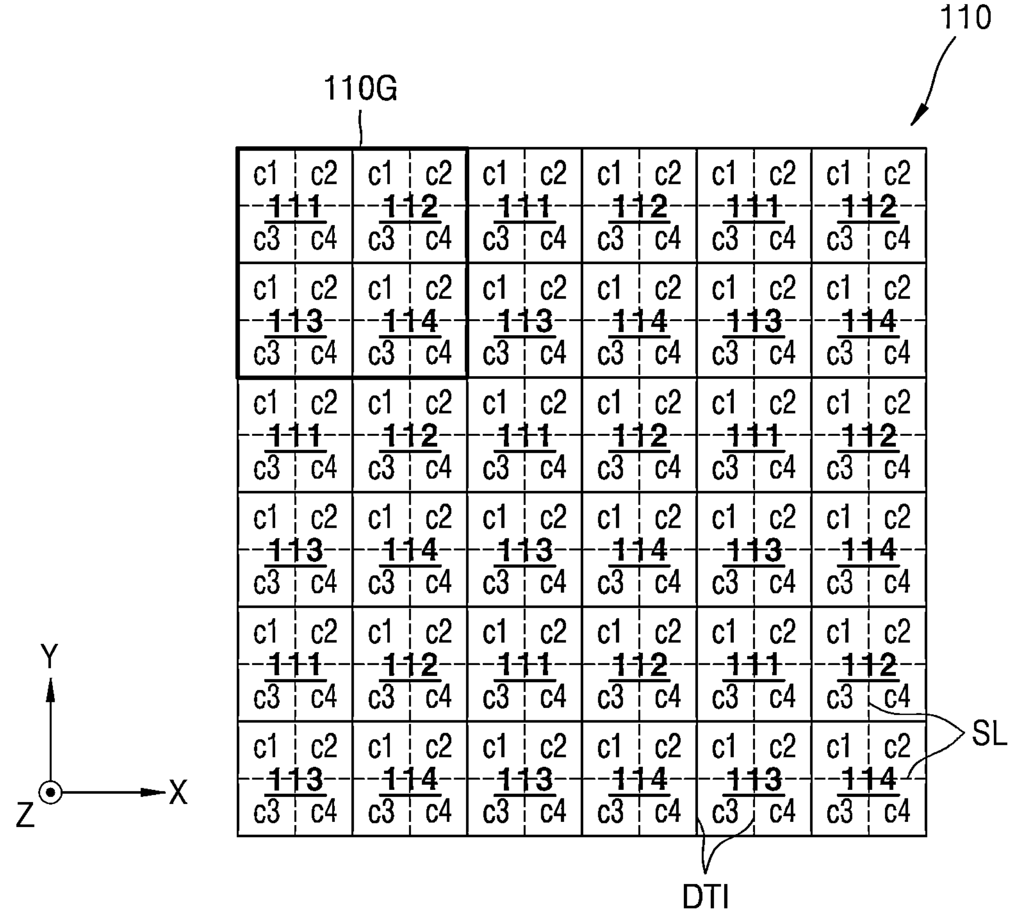
FIGS. 3B and 3C are plan views illustrating a sensor substrate and a color separating lens array included in a pixel array of an image sensor according to an embodiment.
Figure 3C:
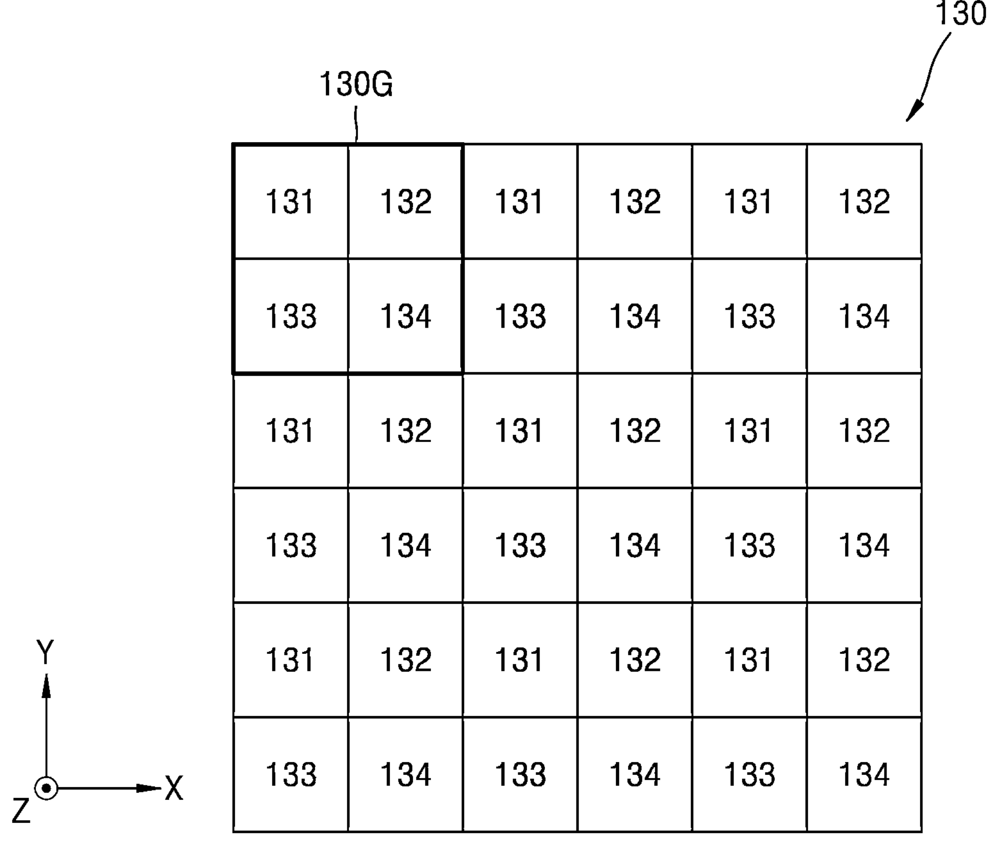

FIGS. 3B and 3C are plan views illustrating a sensor substrate and a color separating lens array included in a pixel array of an image sensor according to an embodiment.

Referring to FIG. 3B, a sensor substrate 110 may include a plurality of pixels sensing incident light. The sensor substrate 110 may include a plurality of unit pixel groups 110G. The unit pixel group 110G may include a first pixel 111, a second pixel 112, a third pixel 113, and a fourth pixel 114 that generate an image signal by converting the incident light into an electrical signal. The unit pixel group 110G may have a pixel arrangement of a Bayer pattern type. The pixel arrangement of the sensor substrate 110 may be to divide and sense the incident light in a unit pattern such as a Bayer pattern as illustrated in FIG. 3A. For example, the first pixel 111 and the fourth pixel 114 may be green pixels sensing green light, the second pixel 112 may be a blue pixel sensing blue light, and the third pixel 113 may be a red pixel sensing red light. Hereinafter, the pixel arrangement of the image sensor may be used interchangeably with the pixel arrangement of the sensor substrate. Also, hereinafter, the first pixel 111 and the fourth pixel 114 may also be referred to as a first green pixel and a second green pixel respectively, the second pixel 112 may also be referred to as a blue pixel, and the third pixel 113 may also be referred to as a red pixel. However, this is merely for convenience of description and the disclosure is not limited thereto.

Each of the first to fourth pixels 111, 112, 113, and 114 may include a plurality of light sensing cells independently sensing the incident light. For example, each of the first to fourth pixels 111, 112, 113, and 114 may include first to fourth light sensing cells c1, c2, c3, and c4. The first to fourth light sensing cells c1, c2, c3, and c4 may be two-dimensionally arranged in the first direction (X direction) and the second direction (Y direction). For example, in each of the first to fourth pixels 111, 112, 113, and 114, the first to fourth light sensing cells c1, c2, c3, and c4 may be arranged in a 2×2 array form.

FIG. 3B illustrates that each of the first to fourth pixels 111, 112, 113, and 114 includes four light sensing cells; however, four or more independent light sensing cells may be grouped and two-dimensionally arranged. For example, each of the first to fourth pixels 111, 112, 113, and 114 may include a plurality of independent light sensing cells grouped and arranged in a 3×3 array or a 4×4 array. Hereinafter, for convenience, a case where each of the first to fourth pixels 111, 112, 113, and 114 includes light sensing cells arranged in a 2×2 array will be described.

According to an embodiment, some of a plurality of pixels including a plurality of light sensing cells sensing light of the same color as described above may be used as autofocus pixels. In the autofocus pixel, an autofocus signal may be obtained from the difference between the output signals of adjacent light sensing cells. For example, an autofocus signal in the first direction (X direction) may be generated from the difference between the output signal of the first light sensing cell c1 and the output signal of the second light sensing cell c2, the difference between the output signal of the third light sensing cell c3 and the output signal of the fourth light sensing cell c4, or the difference between the sum of the output signals of the first light sensing cell c1 and the third light sensing cell c3 and the sum of the output signals of the second light sensing cell c2 and the fourth light sensing cell c4. Also, an autofocus signal in the second direction (Y direction) may be generated from the difference between the output signal of the first light sensing cell c1 and the output signal of the third light sensing cell c3, the difference between the output signal of the second light sensing cell c2 and the output signal of the fourth light sensing cell c4, or the difference between the sum of the output signals of the first light sensing cell c1 and the second light sensing cell c2 and the sum of the output signals of the third light sensing cell c3 and the fourth light sensing cell c4.

Moreover, there are a sum mode and a full mode as a method of obtaining a general image signal. In the sum mode, an image signal may be obtained by summing the output signals of the first to fourth light sensing cells c1, c2, c3, and c4. For example, a first green image signal may be generated by summing the output signals of the first to fourth light sensing cells c1, c2, c3, and c4 of the first pixel 111, a blue image signal may be generated by summing the output signals of the first to fourth light sensing cells c1, c2, c3, and c4 of the second pixel 112, a red image signal may be generated by summing the output signals of the first to fourth light sensing cells c1, c2, c3, and c4 of the third pixel 113, and a second green image signal may be generated by summing the output signals of the first to fourth light sensing cells c1, c2, c3, and c4 of the fourth pixel 114. In the full mode, each output signal may be obtained by using each of the first to fourth light sensing cells c1, c2, c3, and c4 as an individual pixel. In this case, a high-resolution image may be obtained.

The first to fourth light sensing cells c1, c2, c3, and c4 may be electrically separated by an isolation structure DTI.

The isolation structure may be formed as, for example, a deep trench isolation structure. The deep trench may be filled with air or an electrically insulative material. A plurality of electrically separated cells may be formed by forming a light sensing layer and then forming an isolation structure DTI on the light sensing layer. The isolation structure may electrically separate the first to fourth pixels 111, 112, 113, and 114 and also electrically separate each of the first to fourth pixels 111, 112, 113 and 114 into four regions. A cross-shaped separation line SL illustrated in the drawings indicates a center line of the isolation structure DTI that is included in each of the first to fourth pixels 111, 112, 113, and 114 and separates the same into a plurality of light sensing cells c1, c2, c3, and c4. The isolation structure DTI is illustrated as a line without a thickness; however, this is for convenience and the isolation structure DTI may have a thickness that physically separates adjacent light sensing cells. The isolation structure DTI included in the first to fourth pixels 111, 112, 113, and 114 may be a region that does not sense light. Accordingly, a scheme for reducing performance degradation due to the isolation structure may be considered in the design of a color separating lens array described below.

Referring to FIG. 3C, a color separating lens array 130 may include a plurality of pixel corresponding regions. The color separating lens array 130 may include a plurality of pixel corresponding groups 130G respectively corresponding to the plurality of unit pixel groups 110G of the sensor substrate 110 illustrated in FIG. 3B. The pixel corresponding group 130G may include first to fourth pixel corresponding regions 131, 132, 133, and 134 corresponding to the first to fourth pixels 111, 112, 113, and 114. Each of the first to fourth pixel corresponding regions 131, 132, 133, and 134 may include a plurality of nanoposts. The plurality of nanoposts may be configured to separate incident light according to wavelengths and condense the separated light onto the first to fourth pixels 111, 112, 113, and 114 corresponding to the respective wavelengths. As described with reference to FIG. 3B, the first pixel 111 and the fourth pixel 114 may be a first green pixel and a second green pixel respectively, the second pixel 112 may be a blue pixel, and the third pixel 113 may be a red pixel. In this case, the first pixel corresponding region 131 and the fourth pixel corresponding region 134 may also be referred to as a first green pixel corresponding region and a second green pixel corresponding region respectively, and the second pixel corresponding region 132 may also be referred to as a blue pixel corresponding region, and the third pixel corresponding region 133 may also be referred to as a red pixel corresponding region.

The shape and arrangement of the plurality of nanoposts included in the color separating lens array 130 may be set to form a phase profile suitable for this wavelength separation.

Figure 3D:
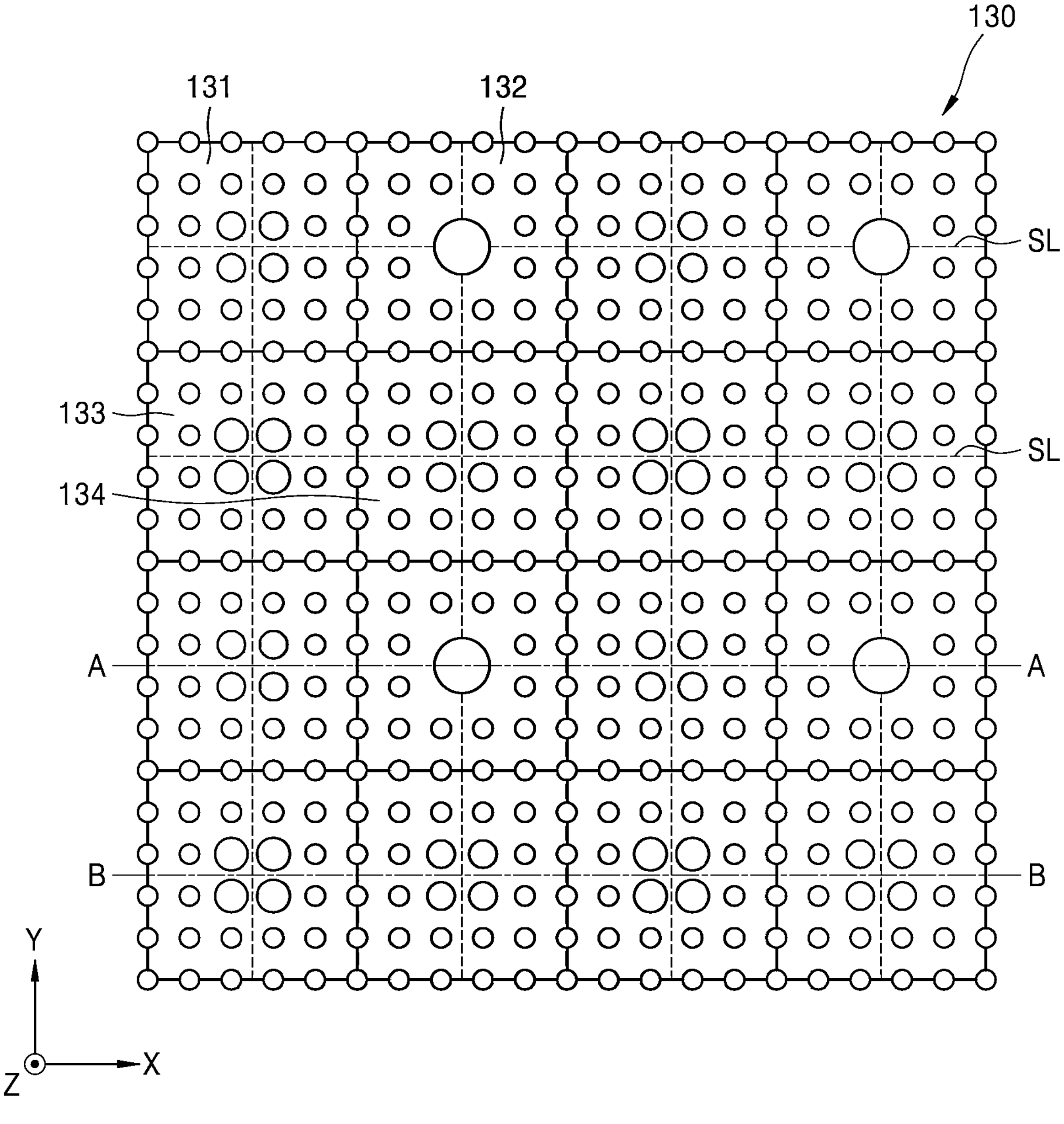
FIG. 3D is a plan view illustrating an arrangement form of nanoposts included in a pixel corresponding region of a color separating lens array.
Figure 3E:
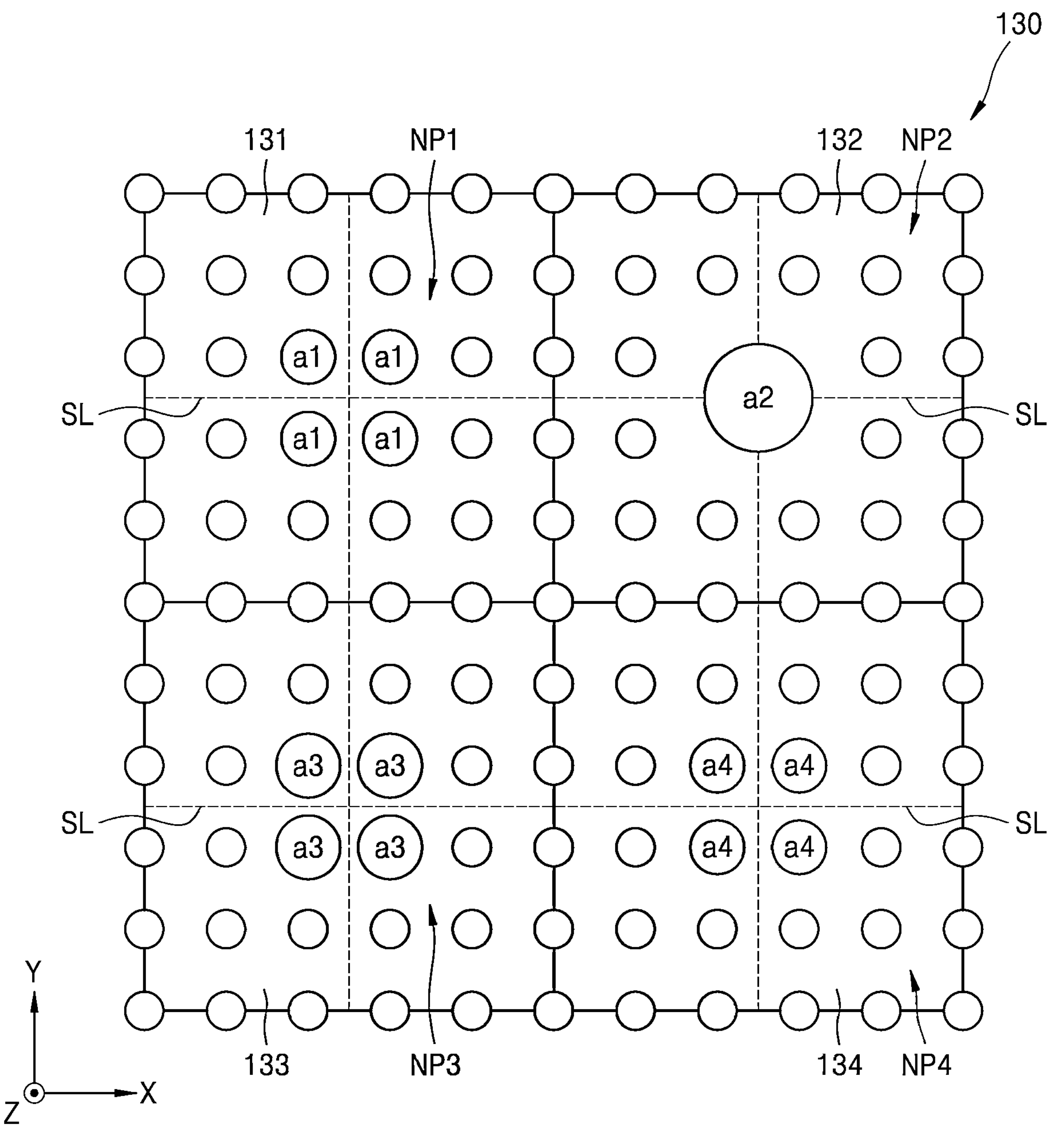
FIG. 3E is an enlarged plan view of a partial region of FIG. 3D.

FIG. 3D is a plan view illustrating an arrangement form of nanoposts included in a pixel corresponding region of a color separating lens array, and FIG. 3E is an enlarged plan view of a partial region of FIG. 3D.

Referring to the drawings, the pixel corresponding regions 131, 132, 133, and 134 may include cylindrical nanoposts having circular cross-sections. The first pixel corresponding region 131 may include a first arrangement NP1 of a plurality of first nanoposts. The second pixel corresponding region 132 may include a second arrangement NP2 of a plurality of second nanoposts, the third pixel corresponding region 133 may include a third arrangement NP3 of a plurality of third nanoposts, and the fourth pixel corresponding region 134 may include a fourth arrangement NP4 of a plurality of fourth nanoposts. The nanopost located at the boundary between adjacent pixel corresponding regions, for example, the nanopost located at the boundary between the first pixel corresponding region 131 and the second pixel corresponding region 132 may be considered as part of the plurality of first nanoposts NP1 or the second nanoposts NP2. Likewise, the nanopost located at the boundary between the first pixel corresponding region 131 and the third pixel corresponding region 133 may be as part of the plurality of first nanoposts NP1 or the third nanoposts NP3.

The cross-shaped separation line SL represented in each of the pixel corresponding regions 131, 132, 133, and 134 may be a center line of the isolation structure DTI included in each of the pixels 111, 112, 113, and 114 respectively facing the pixel corresponding regions 131, 132, 133, and 134 and is represented overlapping each of the pixel corresponding regions 131, 132, 133, and 134 for convenience of description.

A nanopost having a greater cross-sectional area may be arranged in a center portion of each of the pixel corresponding regions 131, 132, 133, and 134. A nanopost having a smaller cross-sectional area may be arranged in a peripheral portion of the pixel corresponding regions. A nanopost having the greatest cross-sectional area in each of the pixel corresponding regions 131, 132, 133, and 134 may be arranged in a center portion of each of the pixel corresponding regions 131, 132, 133, and 134. A first center nanopost a1 having the greatest cross-sectional width among the plurality of first nanoposts NP1 may be arranged in a center portion thereof. Also, a second center nanopost a2 having the greatest cross-sectional width among the plurality of second nanoposts NP2 may be arranged in a center portion of the second pixel corresponding region 132. Likewise, a third center nanopost a3 having the greatest cross-sectional width among the plurality of third nanoposts NP3 and a fourth center nanopost a4 having the greatest cross-sectional width among the plurality of fourth nanoposts NP4 may be respectively arranged in a center portion of the third pixel corresponding region 133 and a center portion of the fourth pixel corresponding region 134.

One second center nanopost a2 may be included in one second pixel 112 and may be arranged at the center of the second pixel 112. When viewed in a third direction (Z direction), the second center nanopost a2 may be arranged to overlap the center of the isolation structure DTI included in the second pixel 112 facing thereto In other words, nanopost a2 overlaps the center of the separation line SL. In contrast, a plurality of third center nanoposts a3 may be included in the third pixel 113 and may be arranged apart from the center of the third pixel 113. When viewed in the third direction (Z direction), the third center nanopost a3 may be arranged not to overlap the center of the separation line SL of the third pixel 113 facing thereto. Like in the third pixel corresponding region 133, in the first pixel corresponding region 131 and the fourth pixel corresponding region 134, the first center nanoposts a1 may be arranged not to overlap the center of the separation line SL of the first pixel 111 facing thereto and the fourth center nanoposts a4 may be arranged not to overlap the center of the separation line SL of the fourth pixel 114 facing thereto.

The size of the cross-sectional area may be in the order of the second center nanopost a2, the third center nanopost a3, and the first center nanopost a1. The width of the cross-section of the second center nanopost a2 may be greater than or equal to the width of the cross-section of the third center nanopost a3. The width of the third center nanopost a3 may be greater than or equal to the width of the first center nanopost a1. The first center nanopost a1 and the fourth center nanopost a4, each included in the pixel corresponding region related to the same color, may have the same size. When the widths of the cross-sections of the first center nanopost a1, the second center nanopost a2, and the third center nanopost a3 are respectively r1, r2, and r3, a relationship of r2≥r3≥r1 may be satisfied.

In the first to fourth pixel corresponding regions 131, 132, 133, and 134, the other nanoposts other than the second center nanopost a2 may be arranged not to overlap the separation line SL of each of the first to fourth pixels 111, 112, 113, and 114 facing thereto. This arrangement may be to minimize the region where the arrangement of nanoposts NP1, NP2, NP3, and NP4 overlap the isolation structure DTI in order to reduce performance degradation due to the isolation structure DTI formed therein. Moreover, because the separation line SL refers to the center line of the isolation structure DTI having a physical thickness, the nanoposts NP1, NP2, NP3, and NP4 not overlapping the separation line SL may partially overlap the isolation structure DTI. Alternatively, the nanoposts NP1, NP2, NP3, and NP4 other than the second center nanopost a2 may be arranged not to overlap the isolation structure DTI in the pixel facing thereto at all.

As illustrated, nanoposts may be arranged at the boundary between the first to fourth pixel corresponding regions 131, 132, 133, and 134, that is, at the position overlapping the boundary between the first to fourth pixels 111, 112, 113, and 114 facing thereto. In other words, nanoposts may be arranged at the position overlapping the isolation structure for partitioning in units of pixels corresponding to different colors. However, within a pixel of one color, the nanoposts may not overlap the isolation structure for partitioning the inside of one pixel related to one color. Alternatively, nanoposts may not be arranged at the boundary position between the first to fourth pixel corresponding regions 131, 132, 133, and 134.

Moreover, in each of the first to fourth pixel corresponding regions 131, 132, 133, and 134, the center nanopost and the peripheral nanopost thereof may be arranged to overlap each other when viewed in the first direction (X direction) and when viewed in the second direction (Y direction). The overlapping degree thereof may vary depending on the pixel corresponding regions. This will be described again with reference to FIGS. 13 and 14.

All of the nanoposts in the arrangements NP1, NP2, NP3, and NP4 (other than the first center nanopost a1, the second center nanopost a2, the third center nanopost a3, and the fourth center nanopost a4) are illustrated as having the same size; however, this is merely an example and the disclosure is not limited thereto.

For example, the first nanoposts NP1 and the fourth nanoposts NP4 included in each of the first pixel corresponding region 131 and the fourth pixel corresponding region 134 that are green pixel corresponding regions may have different distribution rules in the first direction (X direction) and the second direction (Y direction). For example, the first nanoposts NP1 and the fourth nanoposts NP4 may have different size arrangements in the first direction (X direction) and the second direction (Y direction). Likewise, the cross-sectional area of the nanopost located at the boundary between the fourth pixel corresponding region 134 and the third pixel corresponding region 133 and the cross-sectional area of the nanopost located at the boundary between the fourth pixel corresponding region 134 and the second pixel corresponding region 132 may be different from each other.

On the other hand, the second arrangement of nanoposts NP2 of the second pixel corresponding region 132 that is the blue pixel corresponding region and the third arrangement of nanoposts NP3 of the third pixel corresponding region 133 that is the red pixel corresponding region may have a symmetric distribution rule in the first direction (X direction) and the second direction (Y direction). The cross-sectional area of the nanopost located at the boundary between the second pixel corresponding region 132 and the first pixel corresponding region 131 and the cross-sectional area of the nanopost located at the boundary between the second pixel corresponding region 132 and the fourth pixel corresponding region 134 may be equal to each other. Also, the cross-sectional area of the nanopost located at the boundary between the third pixel corresponding region 133 and the first pixel corresponding region 131 and the cross-sectional area of the nanopost located at the boundary between the third pixel corresponding region 133 and the fourth pixel corresponding region 134 may be equal to each other.

The arrangements NP1, NP2, NP3 and NP4 of the first to fourth nanoposts in the first to fourth pixel corresponding regions 131, 132, 133, and 134 may reflect the pixel arrangement characteristic of a Bayer pattern. In the pixel arrangement of the Bayer pattern, pixels adjacent to the blue pixel 112 and to the red pixel 113 in the first direction (X direction) and the second direction (Y direction) may be the same as each other as green pixels 111 and 114. On the other hand, a pixel adjacent to the first green pixel 111 in the first direction (X direction) and a pixel adjacent to the first green pixel 111 in the second direction (Y direction) may be different from each other as a blue pixel 112 and a red pixel 113 respectively, and a pixel adjacent to the second green pixel 114 in the first direction (X direction) and a pixel adjacent to the second green pixel 114 in the second direction (Y direction) may be different from each other as a red pixel 113 and a blue pixel 114 respectively. Also, pixels adjacent to the first and second green pixels 111 and 114 in four diagonal directions may be green pixels, pixels adjacent to the blue pixel 112 in four diagonal directions may be the same as each other as red pixels 113, and pixels adjacent to the red pixel 113 in four diagonal directions may be the same as each other as blue pixels 112. Thus, the second nanoposts NP2 and the third nanoposts NP3 may be arranged in the form of 4-fold symmetry in the blue and red pixel corresponding regions 132 and 133 corresponding to the blue pixel 112 and the red pixel 113, and the first nanoposts NP1 and the fourth nanoposts NP4 may be arranged in the form of 2-fold symmetry in the first and second green pixel corresponding regions 131 and 134. Particularly, the first and second green pixel corresponding regions 131 and 134 may have nanopost size arrangements that are rotated by 90° with respect to each other.

All of the first to fourth nanoposts arrangements NP1, NP2, NP3, and NP4 are all illustrated as having a symmetrical cross-sectional shape having the same width in the first direction (X direction) and the second direction (Y direction). However, alternately, the first and fourth nanoposts arrangements NP1 and NP4 of the first and second green pixel corresponding regions 131 and 134 may have an asymmetrical cross-sectional shape having different widths in the first direction (X direction) and the second direction (Y direction).

The arrangement of the first to fourth nanoposts NP1, NP2, NP3, and NP4 is merely an example for wavelength separation corresponding to the pixel arrangement and is not limited to the described example or the illustrated pattern.

Figure 4A:
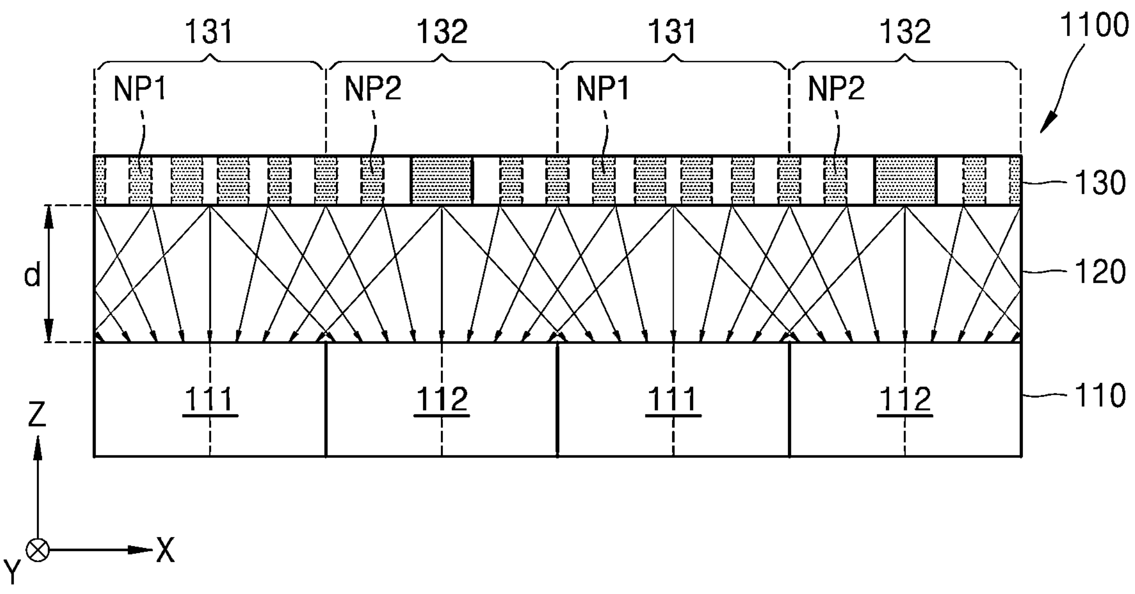
FIGS. 4A and 4B are cross-sectional views respectively illustrating different cross-sections of a pixel array of an image sensor according to an embodiment.
Figure 4B:
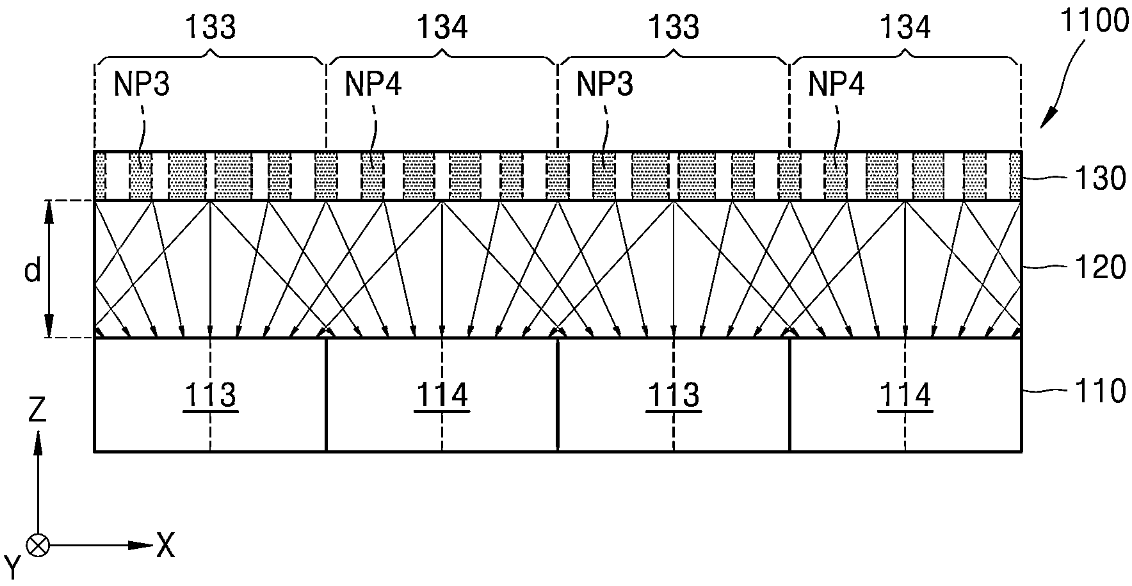

FIGS. 4A and 4B are cross-sectional views respectively illustrating different cross-sections of the pixel array 1100 of the image sensor of FIG. 1. FIG. 4A illustrates a cross-section taken along line AA of FIG. 3D, and FIG. 4B illustrates a cross-section taken along line BB of FIG. 3D.

Referring to FIGS. 4A and 4B, the pixel array 1100 of the image sensor 1000 may include a sensor substrate 110 and a color separating lens array 130 arranged on the sensor substrate 110.

As described with reference to FIG. 3B, the sensor substrate 110 may include a first pixel 111, a second pixel 112, a third pixel 113, and a fourth pixel 114 that sense light, and each of the first pixel 111, the second pixel 112, the third pixel 113, and the fourth pixel 114 may include a plurality of light sensing cells.

The color separating lens array 130 may include a first arrangement NP1 of a plurality of first nanoposts in the first pixel corresponding region 131, a second arrangement NP2 of a plurality of second nanoposts in the second pixel corresponding region 132, a third arrangement NP3 of a plurality of third nanoposts in the third pixel corresponding region 133, and a fourth arrangement NP4 of a plurality of fourth nanoposts in the fourth pixel corresponding region 134. The above description of the nanoposts NP may be commonly applied to the first to fourth nanoposts NP1, NP2, NP3, and NP4.

A transparent spacer layer 120 may be arranged between the sensor substrate 110 and the color separating lens array 130. A color filter array may be further arranged between the sensor substrate 110 and the spacer layer 120. The color filter array may include a red filter, a green filter, and a blue filter, and these filters may be arranged in a form corresponding to the color arrangement illustrated in FIG. 3A. In an embodiment, because the color separating lens array 130 performs color separation, when a color filter array is additionally included, it may improve the color purity by compensating for some errors that may appear during color separation by the color separating lens array 130.

The spacer layer 120 may support the color separating lens array 130 and may have a thickness d satisfying the requirement for the distance between the sensor substrate 110 and the color separating lens array 130, that is, the distance between the upper surface of the sensor substrate 110 and the lower surface of the color separating lens array 130. Thus, the thickness of the spacer layer 120 may vary depending on whether a color filter array is arranged between the color separating lens array 130 and the sensor substrate 110.

The spacer layer 120 may include a material transparent with respect to visible light, for example, a dielectric material such as $SiO_2$ or siloxane-based spin-on-glass (SOG) having a lower refractive index than the nanoposts NP and having a low absorptance in the visible light band. When a peripheral material layer filling the space between the nanoposts NP includes a material having a higher refractive index than the nanopost NP, the spacer layer 120 may include a material having a lower refractive index than the peripheral material layer.

The thickness d of the spacer layer 120, that is, the distance between the lower surface of the color separating lens array 130 and the upper surface of the sensor substrate 110, may be set based on the focal length (distance) of light condensed by the color separating lens array 130 and may be, for example, ½ or less of the focal length of light of a reference wavelength $\lambda_0$ as described below. When the refractive index of the spacer layer 120 with respect to the reference wavelength $\lambda_0$ is n and the pitch between pixels is p, a focal length f of light of the reference wavelength $\lambda_0$ condensed by the color separating lens array 130 may be represented as Equation 1 below.

$$f = \frac{np^2}{\lambda_0} - \frac{\lambda_0}{4n} \quad \text{[Equation 1]}$$

Assuming that the reference wavelength $\lambda_0$ is 540 nm as green light, the pitch between the pixels 111, 112, 113, and 114 is 0.8 μm, and the refractive index n of the spacer layer 120 with respect to light of a wavelength of 540 nm is 1.46, the focal length f of the green light, that is, the distance between the lower surface of the color separating lens array 130 and a point where the green light converges, may be about 1.64 μm and the thickness d of the spacer layer 120 may be 0.82 μm. As another example, assuming that the reference wavelength $\lambda_0$ is 540 nm as green light, the pitch between the pixels 111, 112, 113, and 114 is 1.2 μm, and the refractive index n of the spacer layer 120 at a wavelength of 540 nm is 1.46, the focal length f of the green light may be about 3.80 μm and the thickness d of the spacer layer 120 may be 1.90 μm or less.

In other words, as for the thickness d of the spacer layer 120 described above, the thickness d of the spacer layer 120 may be about 70% to about 120% of the pixel pitch when the pixel pitch is about 0.5 μm to about 0.9 μm and may be about 110% to about 180% of the pixel pitch when the pixel pitch is about 0.9 μm to about 1.3 μm.

When a color filter array is arranged between the sensor substrate 110 and the color separating lens array 130, considering the thickness of the color filter array, the thickness of the spacer layer 120 may be set to be less than the focal length of light of a center wavelength among the wavelength band separated by the color separating lens array 130, by the color separating lens array 130. For example, the thickness thereof may be set to be less than the focal length of green light by the color separating lens array 130.

An etch stop layer may be further included between the spacer layer 120 and the color separating lens array 130. In the process of manufacturing the color separating lens array 130, the etch stop layer may be provided to protect the spacer layer 120 that is a structure under the color separating lens array 130. For example, the requirement for the distance between the lower surface of the color separating lens array 130 and the upper surface of the sensor substrate 110 may be well maintained by the etch stop layer.

Also, a protection layer protecting the color separating lens array 130 may be further arranged on the color separating lens array 130. The protection layer may include a material functioning as an anti-reflection layer.

The first green pixel corresponding region 131 may correspond to the first green pixel 111 and may be arranged over the first green pixel 111, the blue pixel corresponding region 132 may correspond to the blue pixel 112 and may be arranged over the blue pixel 112, the red pixel corresponding region 133 may correspond to the red pixel 113 and may be arranged over the red pixel 113, and the second green pixel corresponding region 134 may correspond to the second green pixel 114 and may be arranged over the second green pixel 114. That is, the pixel corresponding regions 131, 132, 133, and 134 of the color separating lens array 130 may be arranged respectively facing the pixels 111, 112, 113, and 114 of the sensor substrate 110. As illustrated in FIG. 3C, the pixel corresponding regions 131, 132, 133, and 134 may be two-dimensionally arranged in the first direction (X direction) and the second direction (Y direction) such that a first row in which the first green pixel corresponding region and the blue pixel corresponding region (131 and 132) are alternately arranged and a second row in which the red pixel corresponding region and the second green pixel corresponding region (133 and 134) are alternately arranged may be alternately repeated.

Moreover, as in the description given with reference to FIG. 2A, the region of the color separating lens array 130 may be described as including a green light condensing region for condensing green light, a blue light condensing region for condensing blue light, and a red light condensing region for condensing red light.

The size, shape, interval, and/or arrangement of the plurality of first to fourth arrangements of nanoposts NP1, NP2, NP3, and NP4 included in the color separating lens array 130 may be set such that green light may be branched and condensed onto the first and second green pixels 111 and 114, blue light may be branched and condensed onto the blue pixel 112, and red light may be branched and condensed onto the red pixel 113. The color separating lens array 130 illustrated in FIGS. 3D, 4A, and 4B illustrates an example for this color separation.

Figure 5A:
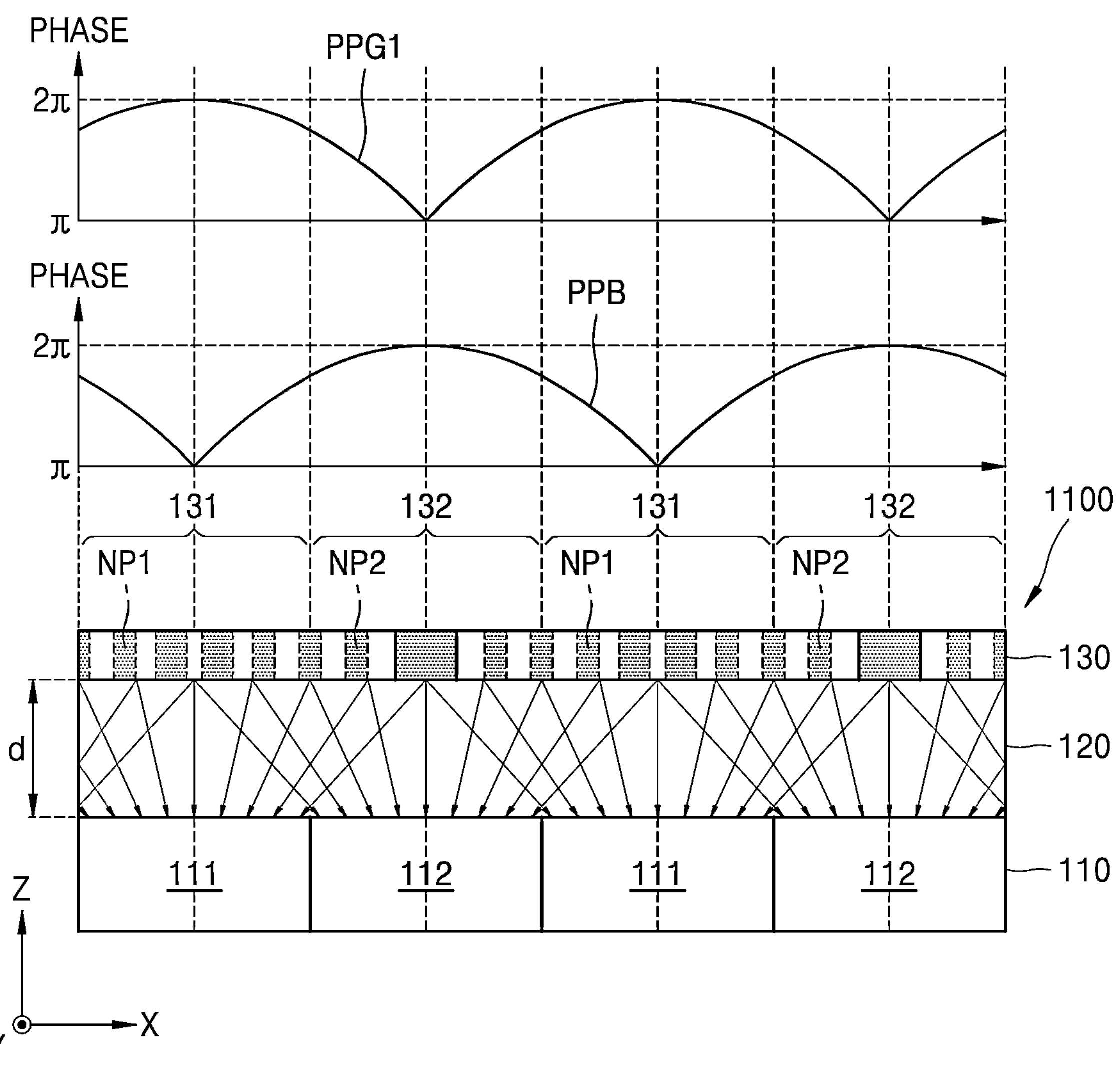
FIG. 5A illustrates phase profiles of green light and blue light that passed through a color separating lens array in the cross-section of FIG. 4A, FIGS. 5B and 5C illustrate a propagation direction of green light incident on a first green light condensing region and an array of the first green light condensing region.

FIG. 5A illustrates phase profiles of green light and blue light that passed through the color separating lens array 130 in the cross-section of FIG. 4A.

Referring to FIG. 5A, the green light that passed through the color separating lens array 130 may have a first green light phase profile PPG1 that is greatest at the center of the first green pixel corresponding region 131 and decreases away from the center of the first green pixel corresponding region 131. Particularly, immediately after passing through the color separating lens array 130, that is, on the lower surface of the color separating lens array 130 or the upper surface of the spacer layer 120, the phase of the green light is greatest at the center of the first green pixel corresponding region 131 and decreases away from the center of the first green pixel corresponding region 131 in the form of a concentric circle, and thus, the phase is smallest at the centers of the blue and red pixel corresponding regions 132 and 133 in the X direction and the Y direction and is smallest at the contact point between the first green pixel corresponding region 131 and the second green pixel corresponding region 134 in the diagonal direction. When the phase of the green light is set as $2\pi$ based on the phase of light emitted from the center of the first green pixel corresponding region 131, the light having a phase of about $0.9\pi$ to about $1.1\pi$ may be emitted from the centers of the blue and red pixel corresponding regions 132 and 133, and the light having a phase of about $1.1\pi$ to about $1.5\pi$ may be emitted from the contact point between the first green pixel corresponding region 131 and the second green pixel corresponding region 134. Thus, the difference between the phase of the green light that passed through the center of the first green pixel corresponding region 131 and the phase of the green light that passed through the centers of the blue and red pixel corresponding regions 132 and 133 may be about $0.9\pi$ to about $1.1\pi$.

Moreover, the first green light phase profile PPG1 may not mean that the phase delay amount of the light that passed through the center of the first green pixel corresponding region 131 is greatest, and when the phase of the light that passed through the first green pixel corresponding region 131 is set as $2\pi$ and a phase delay of the light that passed through another position is greater and has a phase value of more than $2\pi$, the first green light phase profile PPG1 may be a value remaining after subtracting $2n\pi$, that is, a wrapped phase profile. For example, when the phase of light that passed through the first green pixel corresponding region 131 is $2\pi$ and the phase of light that passed through the center of the blue pixel corresponding region 132 is $3\pi$, the phase in the blue pixel corresponding region 132 may be $\pi$ remaining after subtracting $2\pi$ (n=1) from $3\pi$.

The blue light that passed through the color separating lens array 130 may have a blue light phase profile PPB that is greatest at the center of the blue pixel corresponding region 132 and decreases away from the center of the blue pixel corresponding region 132. Particularly, immediately after passing through the color separating lens array 130, the phase of the blue light is greatest at the center of the blue pixel corresponding region 132 and decreases away from the center of the blue pixel corresponding region 132 in the form of a concentric circle, and thus, the phase is smallest at the centers of the first and second green pixel corresponding regions 131 and 134 in the X direction and the Y direction and is smallest at the center of the red pixel corresponding region 133 in the diagonal direction. When the phase of the blue light at the center of the blue pixel corresponding region 132 is 27, the phase at the centers of the first and second green pixel corresponding regions 131 and 134 may be, for example, about $0.9\pi$ to about $1.1\pi$ and the phase at the center of the red pixel corresponding region 133 may be smaller than the phase at the centers of the first and second green pixel corresponding regions 131 and 134 and may be, for example, about $0.5\pi$ to about $0.9\pi$.

Figures 5B, 5C:
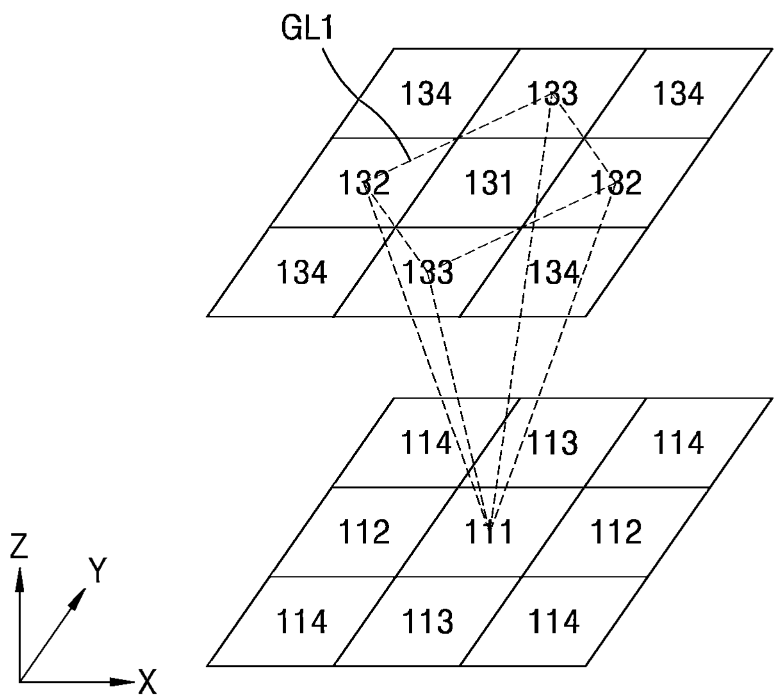
FIGS. 5D and 5E illustrate a propagation direction of blue light incident on a blue light condensing region and an array of the blue light condensing region.
Figures 5D, 5E:
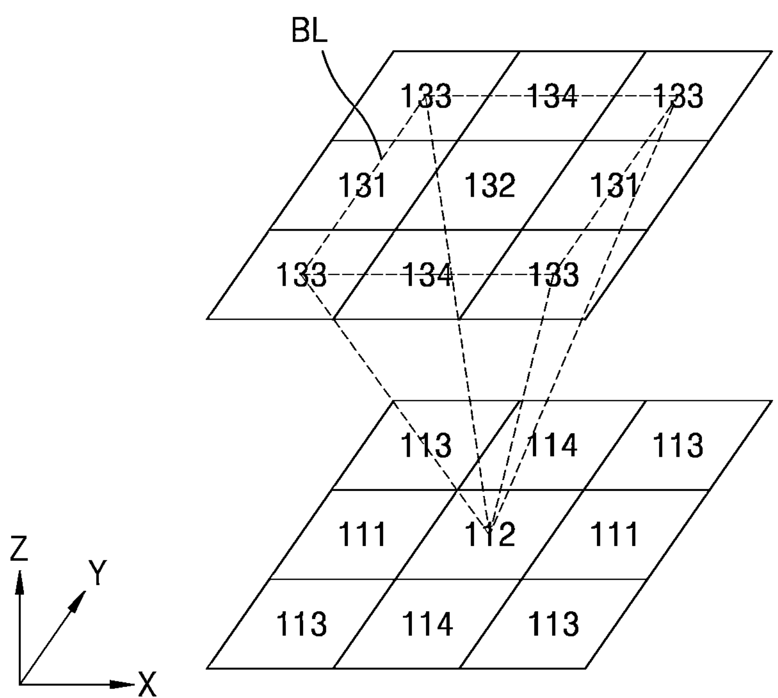

FIGS. 5B and 5C respectively illustrate a propagation direction of green light incident on a first green light condensing region and an array of the first green light condensing region, and FIGS. 5D and 5E respectively illustrate a propagation direction of blue light incident on a blue light condensing region and an array of the blue light condensing region.

The green light incident on and around the first green pixel corresponding region 131 may be condensed onto the first green pixel 111 by the color separating lens array 130, and the green light from the blue and red pixel corresponding regions 132 and 133, in addition to the first green pixel corresponding region 131, may be incident on the first green pixel 111. That is, according to the phase profile of the green light described with reference to FIG. 5A, the green light that passed through a first green light condensing region GL1 obtained by connecting the centers of two blue pixel corresponding regions 132 and two red pixel corresponding regions 133 adjacent to the first green pixel corresponding region 131 with one side facing thereto may be condensed onto the first green pixel 111. Thus, as illustrated in FIG. 5C, the color separating lens array 130 may operate as an array of the first green light condensing region GL1 for condensing the green light onto the first green pixel 111. The first green light condensing region GL1 may have a greater area than the first green pixel 111 corresponding thereto and may be, for example, about 1.2 times to about 2 times greater.

The blue light may be condensed onto the blue pixel 112 by the color separating lens array 130, and the blue light from the pixel corresponding regions 131, 132, 133, and 134 may be incident on the blue pixel 112. According to the phase profile of the blue light described above, the blue light that passed through a blue light condensing region BL obtained by connecting the centers of four red pixel corresponding regions 133 adjacent to the blue pixel corresponding region 132 with vertexes facing each other may be condensed onto the blue pixel 112. Thus, as illustrated in FIG. 5E, the color separating lens array 130 may operate as an array of the blue light condensing region BL for condensing the blue light onto the blue pixel. The blue light condensing region BL may have a greater area than the blue pixel 112 corresponding thereto and may be, for example, about 1.5 times to about 4 times greater. The blue light condensing region BL may partially overlap the first green light condensing region GL1 described above and a second green light condensing region GL2 and a red light condensing region RL described below.

Figure 6A:
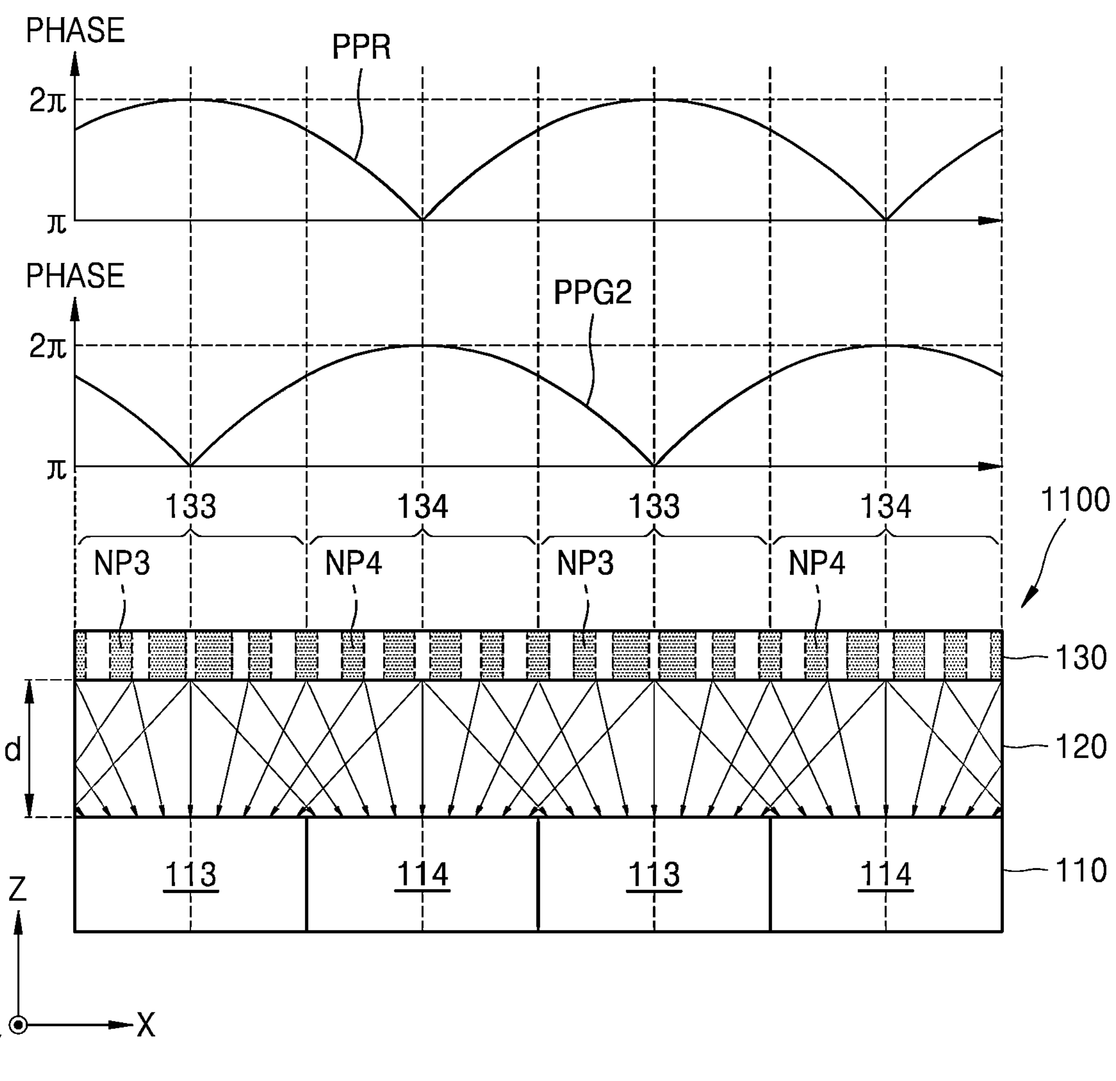
FIG. 6A illustrates phase profiles of red light and green light that passed through a color separating lens array in the cross-section of FIG. 4B, FIGS. 6B and 6C illustrate a propagation direction of red light incident on a red light condensing region and an array of the red light condensing region.

FIG. 6A illustrates phase profiles of red light and green light that passed through the color separating lens array 130 in the cross-section of FIG. 4B.

Referring to FIG. 6A, the red light that passed through the color separating lens array 130 may have a red light phase profile PPR that is greatest at the center of the red pixel corresponding region 133 and decreases away from the center of the red pixel corresponding region 133. When the phase of the red light at the center of the red pixel corresponding region 133 is $2\pi$, the phase at the centers of the first and second green pixel corresponding regions 131 and 134 may be, for example, about $0.9\pi$ to about $1.1\pi$ and the phase at the center of the blue pixel corresponding region 132 may be smaller than the phase at the centers of the first and second green pixel corresponding regions 131 and 134 and may be, for example, about $0.6\pi$ to about $0.9\pi$.

Referring to FIG. 6A, like the green light described with reference to FIG. 5A, the green light that passed through the color separating lens array 130 may have a second green light phase profile PPG2 that is greatest at the center of the second green pixel corresponding region 134 and decreases away from the center of the second green pixel corresponding region 134. When comparing the first green light phase profile PPG1 of FIG. 5A with the second green light phase profile PPG2 of FIG. 6A, the second green light phase profile PPG2 may be obtained by moving in parallel with the first green light phase profile PPG1 by one-pixel pitch in the X direction and the Y direction, and the description of the first green light phase profile PPG1 may be applied to the other features thereof.

Figures 6B, 6C:
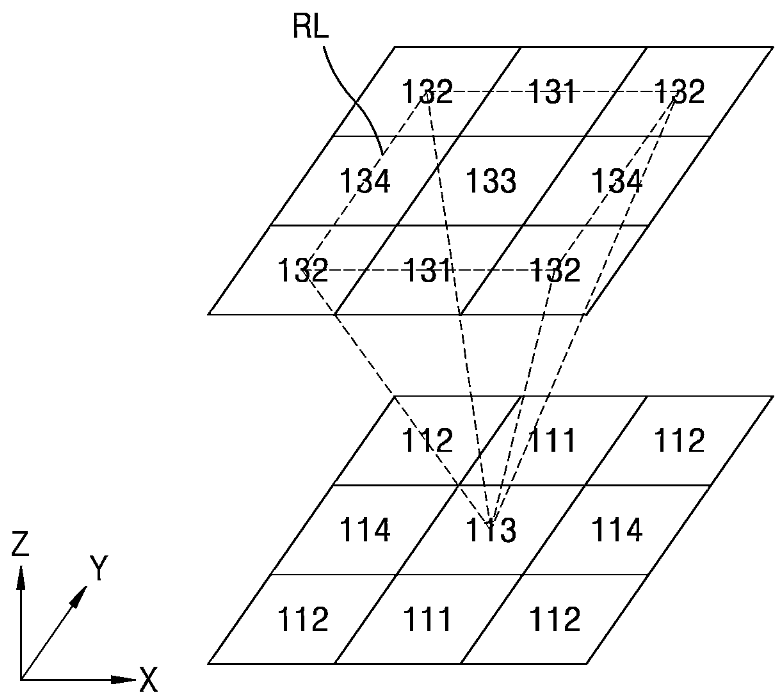
FIGS. 6D and 6E illustrate a propagation direction of green light incident on a second green light condensing region and an array of the second green light condensing region.
Figures 6D, 6E:
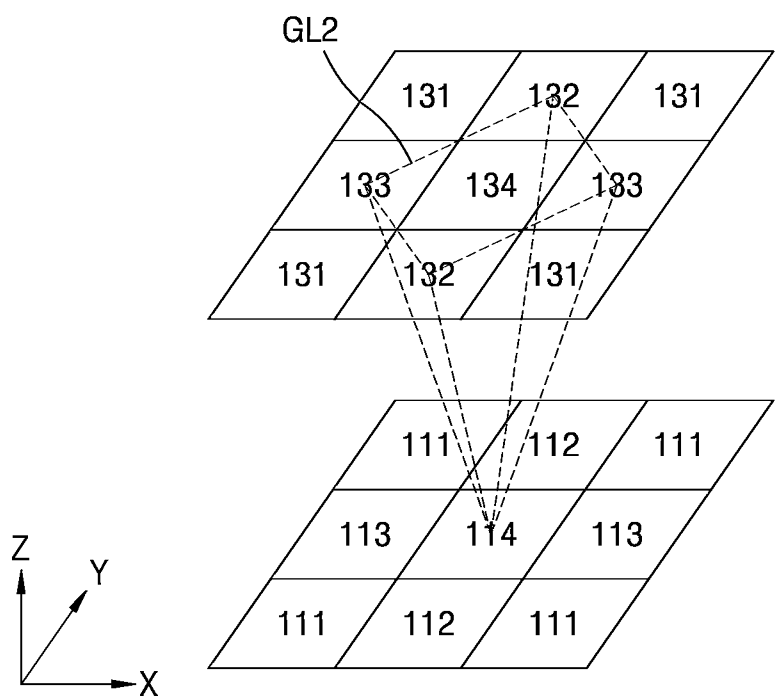

FIGS. 6B and 6C respectively illustrate a propagation direction of red light incident on a red light condensing region and an array of the red light condensing region, and FIGS. 6D and 6E respectively illustrate a propagation direction of green light incident on a second green light condensing region and an array of the second green light condensing region.

According to the phase profile of the red light described above with reference to FIG. 6A, the red light that passed through a red light condensing region RL obtained by connecting the centers of four blue pixel corresponding regions 132 adjacent to the red pixel corresponding region 133 with vertexes facing each other may be condensed onto the red pixel 113. Thus, as illustrated in FIG. 6C, the color separating lens array 130 may operate as an array of the red light condensing region RL for condensing the red light onto the red pixel. The red light condensing region RL may have a greater area than the red pixel 113 corresponding thereto and may be, for example, about 1.5 times to about 4 times greater. The red light condensing region RL may partially overlap the first and second green light condensing regions GL1 and GL2 and the blue light condensing region BL.

The green light incident on and around the second green pixel corresponding region 134 may propagate like the description of the green light incident on and around the first green pixel corresponding region 131 and may be condensed onto the second green pixel 114 as illustrated in FIG. 6D. Thus, as illustrated in FIG. 6E, the color separating lens array 130 may operate as an array of the second green light condensing region GL2 for condensing the green light onto the second green pixel 114. The second green light condensing region GL2 may have a greater area than the second green pixel 114 corresponding thereto and may be, for example, about 1.2 times to about 2 times greater.

The color separating lens array 130 satisfying the phase profile and performance described above may be automatically designed through various types of computer simulations. For example, the structures of the pixel corresponding regions 131, 132, 133, and 134 may be optimized through a nature-inspired algorithm such as a genetic algorithm, a particle swarm optimization algorithm, or an ant colony optimization algorithm or through a reverse design method based on an adjoint optimization algorithm.

For designing the color separating lens array 130, the structures of the green, blue, and red pixel corresponding regions may be optimized while evaluating the performances of a plurality of candidate color separating lens arrays based on evaluation factors such as color separation spectrum, optical efficiency, and signal-to-noise ratio. For example, the structures of the green, blue, and red pixel corresponding regions may be optimized in a manner that a target numerical value of each evaluation factor is determined in advance and the sum of the differences from the target numerical values of a plurality of evaluation factors is minimized. Alternatively, the performance may be indexed for each evaluation factor, and the structures of the green, blue, and red pixel corresponding regions may be optimized such that a value representing the performance may be maximized.

Moreover, it has been described that each of the first to fourth pixels 111, 112, 113, and 114 includes a plurality of light sensing cells, which is used for autofocus driving. As described with reference to FIG. 3B, when each of the plurality of pixels 111, 112, 113, and 114 includes the first to fourth light sensing cells c1, c2, c3, and c4, an autofocus signal may be obtained, for example, by using the difference between the sum of the output signals of the first light sensing cell c1 and the third light sensing cell c3 and the sum of the output signals of the second light sensing cell c2 and the fourth light sensing cell c4. When the difference value thereof is 0, it may be determined that the image sensor 1000 is well located on the focal plane of a module lens of a photographing apparatus including the image sensor 1000. When the difference value thereof is not 0, the module lens may be moved such that the image sensor 1000 may be located on the focal plane of the module lens according to the difference value and the sign thereof.

This difference value may be proportional to the incident angle; that is, when the angle of the light incident on the sensor substrate 110 is 0 degree, the difference value between the sum of the output signals of the first light sensing cell c1 and the third light sensing cell c3 and the sum of the output signals of the second light sensing cell c2 and the fourth light sensing cell c4 may be 0 and the difference value thereof may increase as the incident angle increases. This difference value may be referred to as an autofocus contrast (AF contrast). Depending on the detailed shapes of the nanoposts included in the color separating lens array 130, the autofocus contrast may appear differently even for the same incident angle. As the contrast increases, the autofocus sensitivity may increase; that is, the AF performance may be improved.

It has been described with reference to FIG. 3B that the isolation structure DTI is provided for this AF driving such that each of the first to fourth pixels 111, 112, 113, and 114 may be electrically separated into a plurality of light sensing cells. This isolation structure DTI may be a region that does not sense light. Because the isolation structure reflects, scatters, or absorbs the incident light, the light may not be sensed by the corresponding light sensing cell and the light efficiency may be degraded. In order to reduce the light efficiency degradation, a distance between the sensor substrate 110 and the color separating lens array 130 may be set.

FIGS. 7 to 12 are diagrams illustrating that the distance between the sensor substrate 110 and the color separating lens array 130 and the shape and arrangement of the first to fourth nanoposts NP1, NP2, NP3, and NP4 are set such that the light efficiency and AF performance of the image sensor 1000 of an embodiment may be improved.

Figure 7:
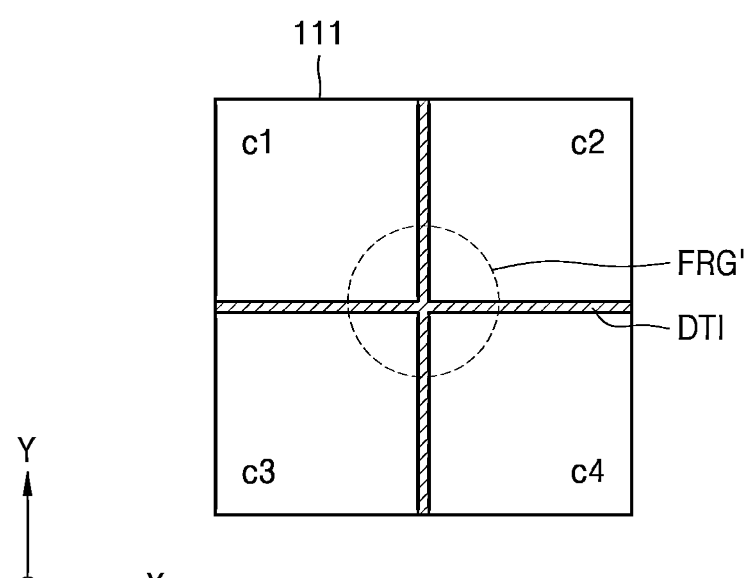
FIGS. 7 and 8 are diagrams for describing the relationship between a thickness of a spacer layer and a region on which light is condensed in an image sensor according to an embodiment.
Figure 8:
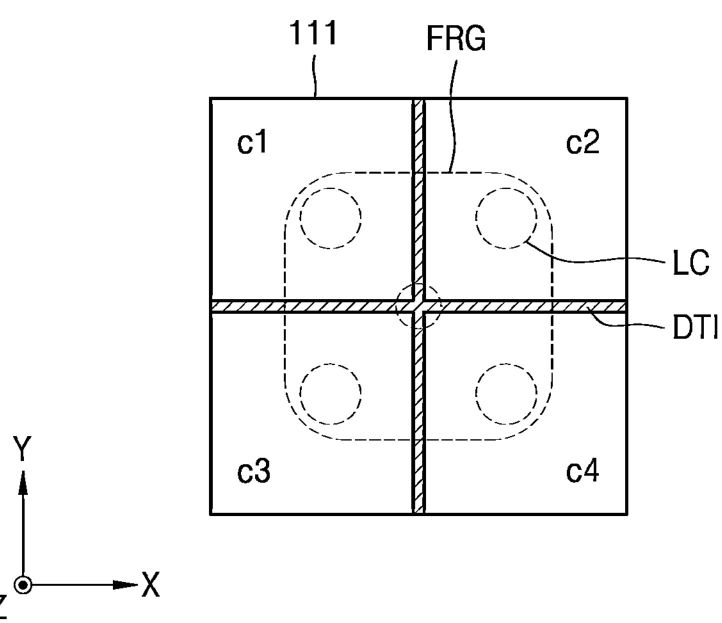

FIGS. 7 and 8 are diagrams for describing the relationship between the thickness of a spacer layer and a region on which light is condensed.

FIG. 7 illustrates a region where green light is condensed onto the first pixel 111 when the distance between the sensor substrate 110 and the color separating lens array 130, that is, the thickness of the spacer layer 120, is similar to the focal length of the green light by the color separating lens array 130.

Referring to FIG. 7, green light may be condensed onto a green light focus region FRG' indicated in a circle at the center of the green pixel 111. As the thickness of the spacer layer 120 approaches the focal length of the first green light condensing region GL1, the size of the green light focus region FRG may decrease. The first green pixel 111 may include four light sensing cells c1, c2, c3, and c4, and an isolation structure DTI for electrically separating adjacent light sensing cells and preventing a crosstalk may be formed between the light sensing cells. Thus, because a considerable number of photons among the photons condensed onto a green light focus region FRG may be incident on the isolation structure DTI between the light sensing cells and the photons incident on the isolation structure DTI may be reflected or scattered and thus may not be detected by the light sensing cell, degradation in the light utilization efficiency of the sensor substrate 110 may occur.

In order to reduce the degradation in the light utilization efficiency, as described above, based on the reference wavelength $\lambda_0$, for example, the green light, the distance between the sensor substrate 110 and the color separating lens array 130, that is, the thickness of the spacer layer 120, may be set to ½ or less of the focal length of the green light by the color separating lens array 130.

FIG. 8 illustrates a region where green light is condensed onto the first pixel 111 that is a green pixel when the thickness of the spacer layer 120 is ½ of the focal length of the green light by the color separating lens array 130.

Referring to FIG. 8, because the thickness d of the spacer layer 120 is less than the focal length of the first green light condensing region GL1 of the color separating lens array 130, green light may be condensed onto a corrected green light focus region FRG having a greater area than the green light focus region FRG' of FIG. 7. Particularly, the green light may be condensed onto the center of the green pixel 111 and five light condensing portions LC indicated by a circle in the light sensing cells c1, c2, c3, and c4. Compared to the green light focus region FRG' of FIG. 7, in the green light focus region FRG, because more light is incident onto the center portion of the light sensing cells c1, c2, c3, and c4 and less light is incident onto the isolation structure DTI, the number of photons lost by being reflected or scattered by the isolation structure DTI may be reduced. In other words, for example, in a structure in which one pixel includes four light sensing cells, when the thickness d of the spacer layer 120 is designed to be ½ of the focal length of the light condensing region, the light utilization efficiency of the sensor substrate 110 may be improved compared to the case where the thickness d of the layer 120 is set to the focal length of the light condensing region.

Moreover, the thickness of the spacer layer 120 may be set based on the green light, and accordingly, the light efficiency in the blue pixel 112 sensing light of a shorter wavelength than the green light may be different from that in the green pixel 111. Contrary to a general refractive lens, as for the focal length of the color separating lens array 130 using a nanostructure, the focal length for light of a short wavelength may be greater than the focal length for light of a long wavelength. Thus, the blue light may be condensed onto the blue pixel 112 with a focal length greater than a reference focal length and the light efficiency may be low. As described above as an example, the image sensor 1000 according to an embodiment may use the arrangement of the second nanoposts NP2 of the blue pixel corresponding region 132 such that the focal length at which the blue light is condensed onto the blue pixel 112 may be similar the focal length at which the green light is condensed onto the green pixel 111.

Figure 9A:
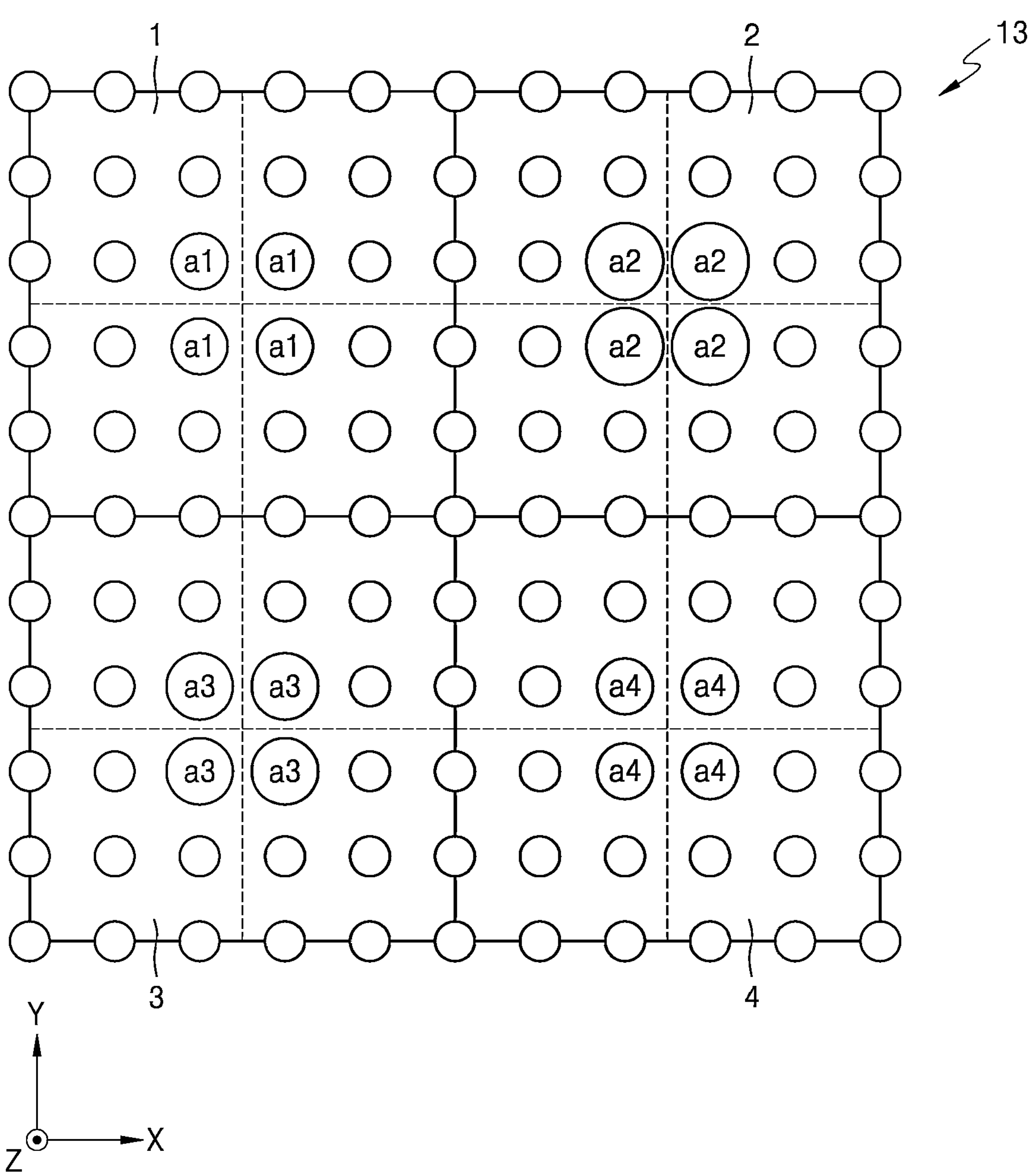
FIG. 9A is a plan view illustrating a shape and arrangement of nanoposts included in a first pixel corresponding region of a color separating lens array of an image sensor according to a comparative example.
Figure 9B:
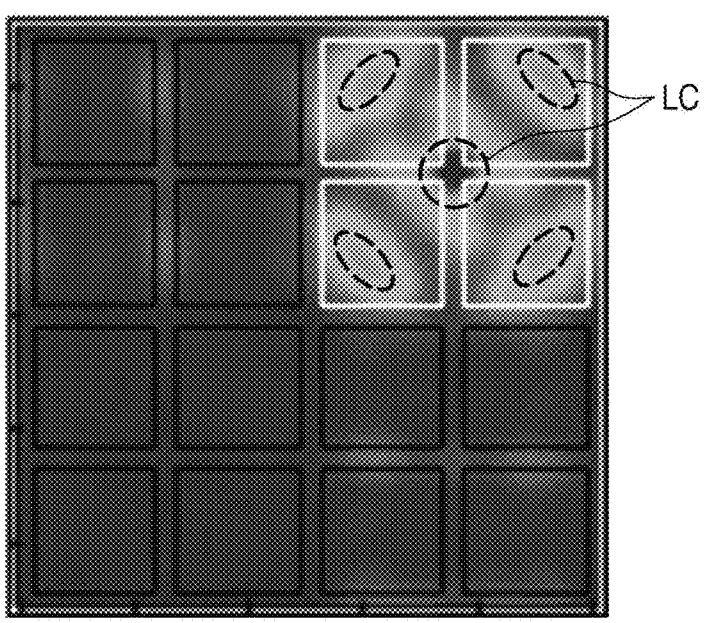
FIG. 9B is a diagram illustrating a simulation of a form in which second wavelength light is condensed onto a second pixel of a sensor substrate of an image sensor according to a comparative example.
Figure 10:
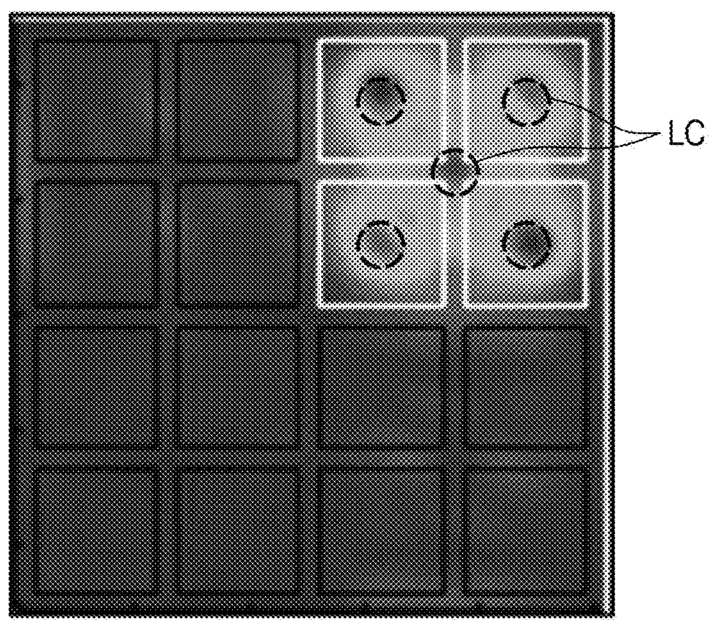
FIG. 10 is a diagram illustrating the simulation of a form in which second wavelength light is condensed onto a second pixel of a sensor substrate of an image sensor according to an embodiment.

FIG. 9A is a plan view illustrating a shape and arrangement of nanoposts included in a first pixel corresponding region of a color separating lens array of an image sensor according to a comparative example, and FIG. 9B is a diagram illustrating a simulation of a form in which second wavelength light (blue light) is condensed onto a second pixel of a sensor substrate of an image sensor according to a comparative example. FIG. 10 is a diagram illustrating the simulation of a form in which second wavelength light (blue light) is condensed onto a second pixel of a sensor substrate of an image sensor according to an embodiment.

A color separating lens array 13 illustrated in FIG. 9A may include a plurality of nanoposts in each of first to fourth pixel corresponding regions 1, 2, 3, and 4 and may be different from the color separating lens array 130 illustrated in FIG. 3E in that a second center nanopost a2 is arranged at a position deviating from the center of the second pixel corresponding region 132.

Referring to light condensing portions LC illustrated in FIGS. 9B and 10, they are similar in that the light condensing portion LC is formed at the center of the isolation structure and inside each of four light sensing cells. However, as for the light condensing portion LC illustrated in FIG. 9B, the light concentration degree is higher at the center portion of the isolation structure than in the light sensing cell, and the light condensing portion LC in the light sensing cell is formed biased toward the peripheral portion rather than the center of each light sensing cell. On the other hand, in the case of FIG. 10 as an embodiment, it may be seen that the light condensing portion LC formed in the light sensing cell is larger and has a higher light concentration degree than the light condensing portion LC formed at the center of the isolation structure. Also, the light condensing portion LC formed in each of the light sensing cells is also formed closer to the center of each light sensing cell.

From this distribution diagram, it may be seen that the image sensor of the embodiment may have a higher light efficiency than the image sensor of the comparative example and the autofocus contrast may also be increased.

Figure 11:
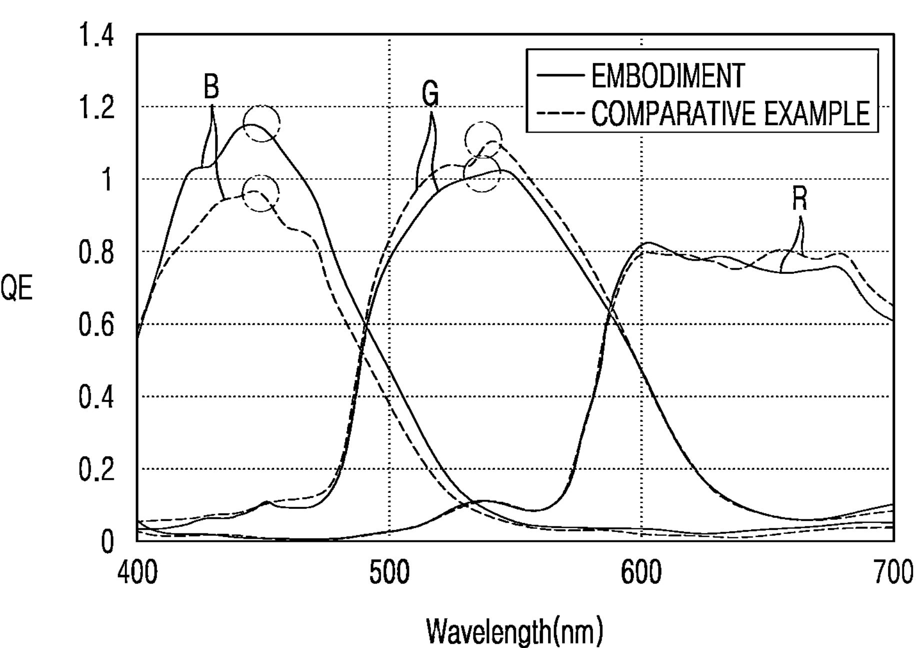
FIG. 11 is a graph illustrating a comparison for quantum efficiencies for each wavelength between an image sensor according to an embodiment and an image sensor according to a comparative example.

FIG. 11 is a graph illustrating a comparison for quantum efficiencies for each wavelength between an image sensor according to an embodiment and an image sensor according to a comparative example.

Referring to the graph, it may be seen that the embodiment exhibits a higher light efficiency than the comparative example.

Figure 12:
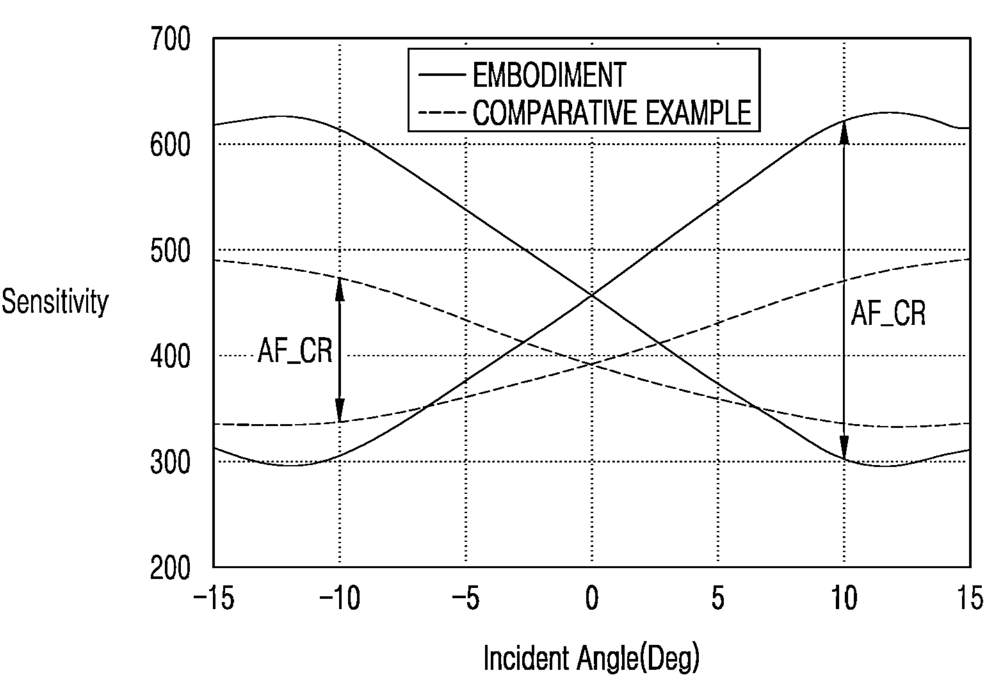
FIG. 12 is a graph illustrating a comparison for autofocus contrasts between an image sensor according to an embodiment and an image sensor according to a comparative example.

FIG. 12 is a graph illustrating a comparison for autofocus contrasts between an image sensor according to an embodiment and an image sensor according to a comparative example.

Referring to the graph, it may be seen that the autofocus contrast of the embodiment is higher than that of the comparative example; for example, with respect to an incident angle of 10°, an autofocus contrast AF_CR of the embodiment is greater than or equal to two times an autofocus contrast AF_CR of the comparative example.

Hereinafter, various examples of color separating lens arrays in which the light efficiency and autofocus performance may be improved will be described.

FIGS. 13 to 16F are plan views illustrating various color separating lens arrays that may be included in an image sensor according to an embodiment.

Figure 13:
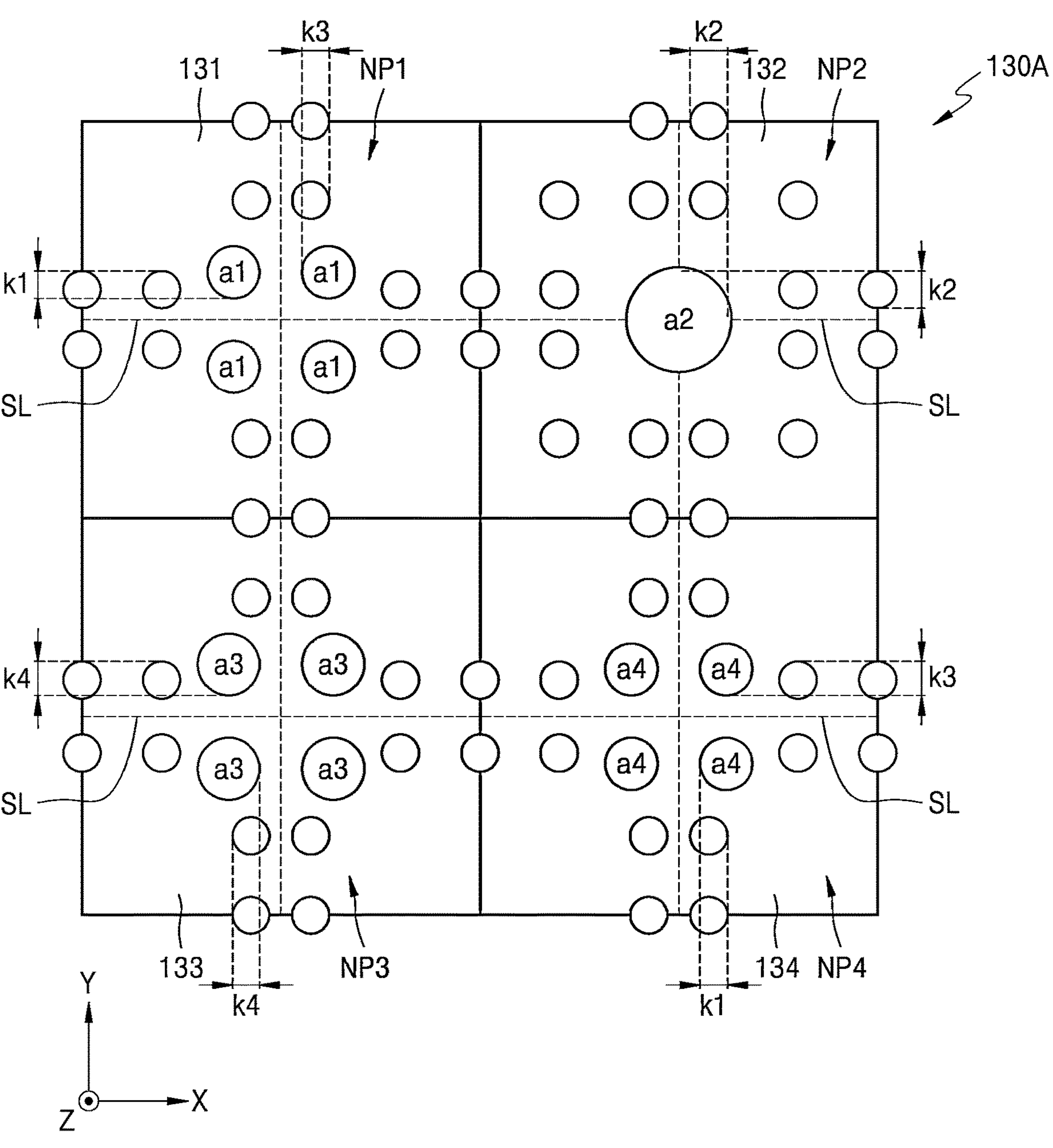
FIGS. 13, 14, 15 and 16A to 16F are plan views illustrating various color separating lens arrays that may be included in an image sensor according to an embodiment.

A color separating lens array 130A illustrated in FIG. 13 may be substantially the same as the color separating lens array 130 illustrated in FIG. 3E in terms of the arrangement of the first center nanopost a1, the second center nanopost a2, the third center nanopost a3, and the fourth center nanopost a4 respectively located at the centers of the first to fourth pixel corresponding regions 131, 132, and 133 among the first to fourth arrangements of nanoposts NP1, NP2, NP3, and NP4. However, the arrangements differ in that the number of nanoposts in arrangements NP1, NP2, NP3, and NP4 arranged at the peripheral portions of the first to fourth pixel corresponding regions 131, 132, 133, and 134 is modified.

All of the other nanoposts other the first center nanopost a1, the second center nanopost a2, the third center nanopost a3, and the fourth center nanopost a4 are illustrated as having the same cross-sectional area; however, this is merely an example and the disclosure is not limited thereto.

In the second pixel corresponding region 132, the second center nanopost a2 may be arranged to overlap other second nanoposts NP2 located around the second center nanopost a2 and having a smaller cross-sectional area than the second center nanopost a2, when viewed in the first direction (X direction) and the second direction (Y direction). The second pixel corresponding region 132 may have a form of 4-fold symmetry; that is, the overlapping width in the first direction and the overlapping width in the second direction may be equal to each other as k2.

In the first pixel corresponding region 131, the first center nanopost a1 may be arranged to overlap other first nanoposts NP1 located around the first center nanopost a1 and having a smaller cross-sectional area than the first center nanopost a1, when viewed in the first direction (X direction) and the second direction (Y direction). The overlapping width in the first direction may be k1, and the overlapping width in the second direction may be k3. As described above, the first pixel corresponding region 131 may have a form of 2-fold symmetry, and thus, k1 and k3 may be different from each other.

Also in the fourth pixel corresponding region 134, like the nanoposts of the first pixel corresponding region 131, the fourth center nanopost a4 and the nanoposts therearound may be arranged to overlap each other in the first direction (X direction) and the second direction (Y direction). As described above, the fourth pixel corresponding region 134 may have a shape rotated by 90° with respect to the first pixel corresponding region 131; that is, the overlapping width in the first direction may be k3 and the overlapping width in the second direction may be k1.

In the third pixel corresponding region 133, the third center nanopost a3 may be arranged to overlap other third nanoposts NP3 located around the third center nanopost a3 and having a smaller cross-sectional area than the third center nanopost a3, when viewed in the first direction (X direction) and the second direction (Y direction). The third pixel corresponding region 133 may have a form of 4-fold symmetry; that is, the overlapping width in the first direction and the overlapping width in the second direction may be equal to each other as k4.

In the pixel corresponding regions, the overlapping degrees between the center nanopost and the peripheral nanopost in the first direction and the second direction may vary depending on the pixel corresponding regions; that is, k1 and k2 may be different from each other and k3 and k4 may also be different from each other.

Figure 14:
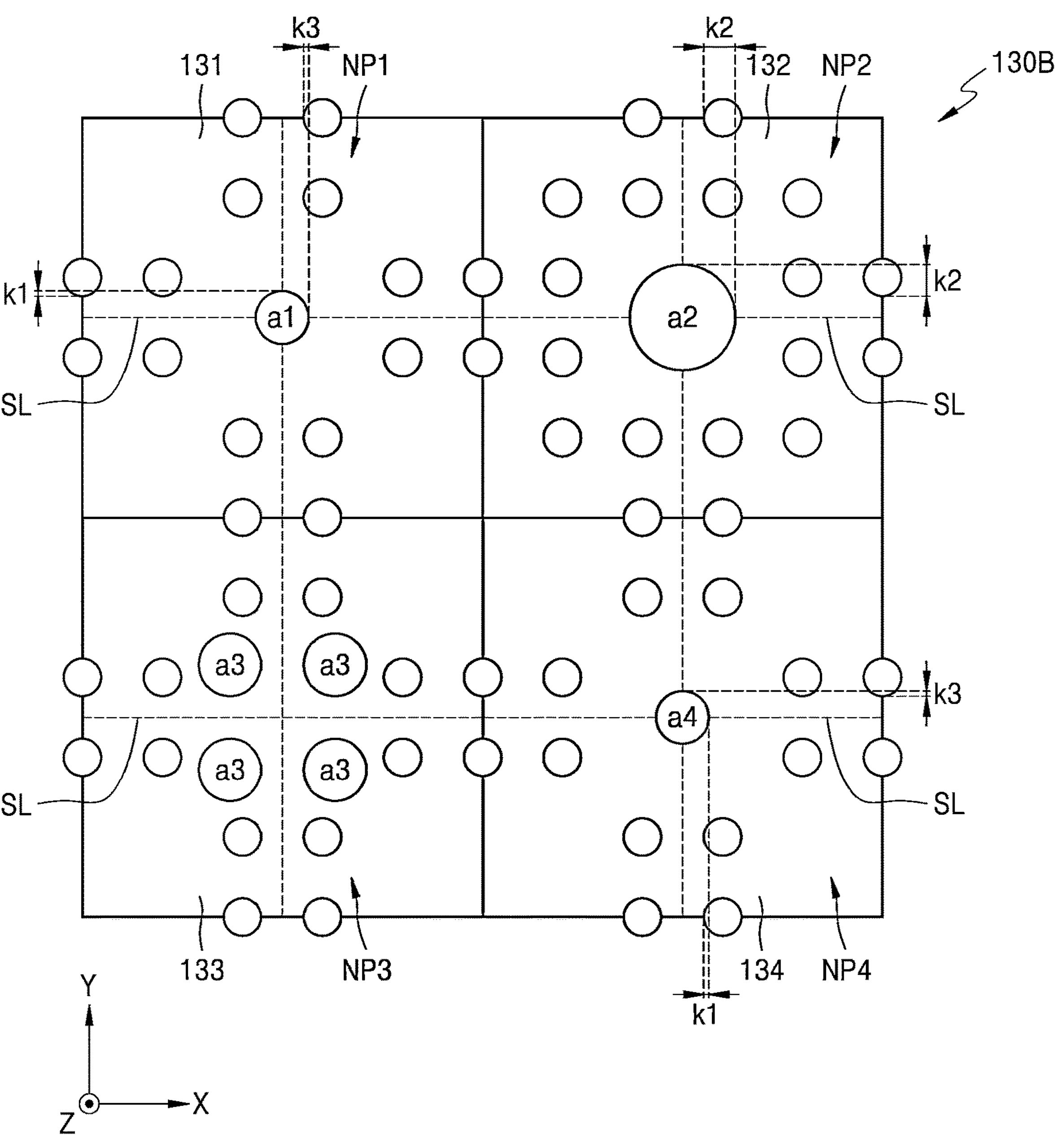

A color separating lens array 1308 illustrated in FIG. 14 may be different from the color separating lens array 130A of FIG. 13 in terms of the arrangement of the first center nanopost a1 and the fourth center nanopost a4 in the first and fourth pixel corresponding regions 131 and 134 that are green pixel corresponding regions. When viewed in the third direction (Z direction), the first center nanopost a1 may be arranged to overlap the center of the first pixel corresponding region 131, that is, the center of the cross-shaped separation line SL of the first pixel 111 facing thereto. The fourth center nanopost a4 may also be arranged to overlap the center of the fourth pixel corresponding region 134, that is, the center of the separation line SL of the fourth pixel 114 facing thereto.

Also in the present embodiment, like in FIG. 13, in the first pixel corresponding region 131, the first center nanopost a1 may be arranged to overlap other first nanoposts NP1 located around the first center nanopost a1 and having a smaller cross-sectional area than the first center nanopost a1, when viewed in the first direction (X direction) and the second direction (Y direction). The overlapping width in the first direction may be k1, and the overlapping width in the second direction may be k3. As described above, the first pixel corresponding region 131 may have a form of 2-fold symmetry, and thus, k1 and k3 may be different from each other.

Also in the fourth pixel corresponding region 134, like the nanoposts of the first pixel corresponding region 131, the fourth center nanopost a4 may be arranged to overlap other fourth nanoposts NP4 located around the fourth center nanopost a4 and having a smaller cross-sectional area than the fourth center nanopost a4, when viewed in the first direction (X direction) and the second direction (Y direction). As described above, the fourth pixel corresponding region 134 may have a shape rotated by 90° with respect to the first pixel corresponding region 131; that is, the overlapping width in the first direction may be k3 and the overlapping width in the second direction may be k1.

In the second pixel corresponding region 132, the second center nanopost a2 may be arranged to overlap other second nanoposts NP2 located around the second center nanopost a2 and having a smaller cross-sectional area than the second center nanopost a2, when viewed in the first direction (X direction) and the second direction (Y direction). The second pixel corresponding region 132 may have a form of 4-fold symmetry; that is, the overlapping width in the first direction and the overlapping width in the second direction may be equal to each other as k2.

In the pixel corresponding regions, the overlapping degrees between the center nanopost and the peripheral nanopost in the first direction and the second direction may vary depending on the pixel corresponding regions; that is, k2 may be different from k1 and k3.

Figure 15:
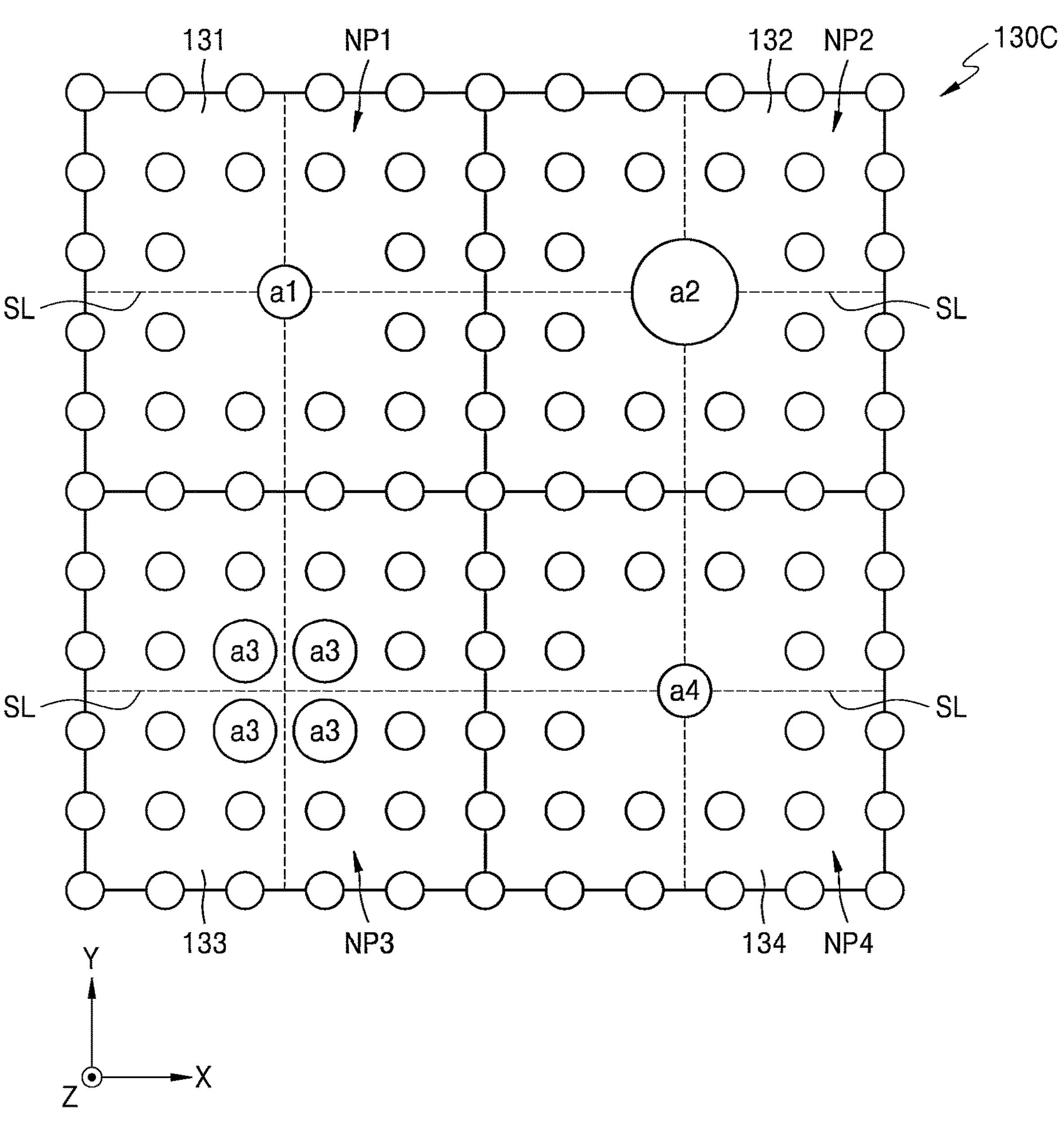

A color separating lens array 130C illustrated in FIG. 15 may be different from the color separating lens array 130 of FIG. 3E in terms of the arrangement of the first center nanopost a1 and the fourth center nanopost a4 in the first and fourth pixel corresponding regions 131 and 134 that are green pixel corresponding regions. When viewed in the third direction (Z direction), the first center nanopost a1 may be arranged to overlap the center of the first pixel corresponding region 131, that is, the center of the separation line SL that is the center line of the isolation structure in the first pixel 111 facing thereto. The fourth center nanopost a4 may also be arranged to overlap the center of the fourth pixel corresponding region 134, that is, the center of the separation line SL of the fourth pixel 114 facing thereto.

In the color separating lens arrays 130, 130A, 130B, and 130C described above, the other nanoposts other than the second center nanopost a2 included in the blue pixel corresponding region 132 may be arranged not to overlap the separation line SL of the pixel facing thereto, or the other nanoposts other than the second center nanopost a2 of the blue pixel corresponding region 132 and the first center nanopost a1 and the fourth center nanopost a4 of the green pixel corresponding regions 131 and 134 may be arranged not to overlap the separation line SL of the pixel facing thereto.

The nanopost arrangement having this criterion may be implemented in more various ways. For example, a unit region including the first to fourth pixel corresponding regions 131, 132, 133, and 134 may be divided into 4N×4N (N is a natural number) regions and nanoposts may be arranged in the partitioned regions, or a unit region including the first to fourth pixel corresponding regions 131, 132, 133, and 134 may be divided into (4N−2)×(4N−2) regions and nanoposts may be arranged on the boundary between the partitioned regions. In this way, after arranging nanoposts in 7×7, 8×8, 11×11, 12×12, 15×15, 16×16, or the like, four nanoposts at 2×2 positions of the center portion of the blue pixel corresponding region 132 may be merged into one and arranged at a position overlapping the center of the cross-shaped separation line SL of the pixel facing thereto. Alternatively, in addition, also in two green pixel corresponding regions 131 and 134, four nanoposts at 2×2 positions of the center portion thereof may be merged into one and arranged at a position overlapping the center of the cross-shaped separation line SL of the pixel facing thereto.

The color separating lens arrays 130, 130A, 130B, and 130C described above are designed based on an 11×11 arrangement.

Figure 16A:
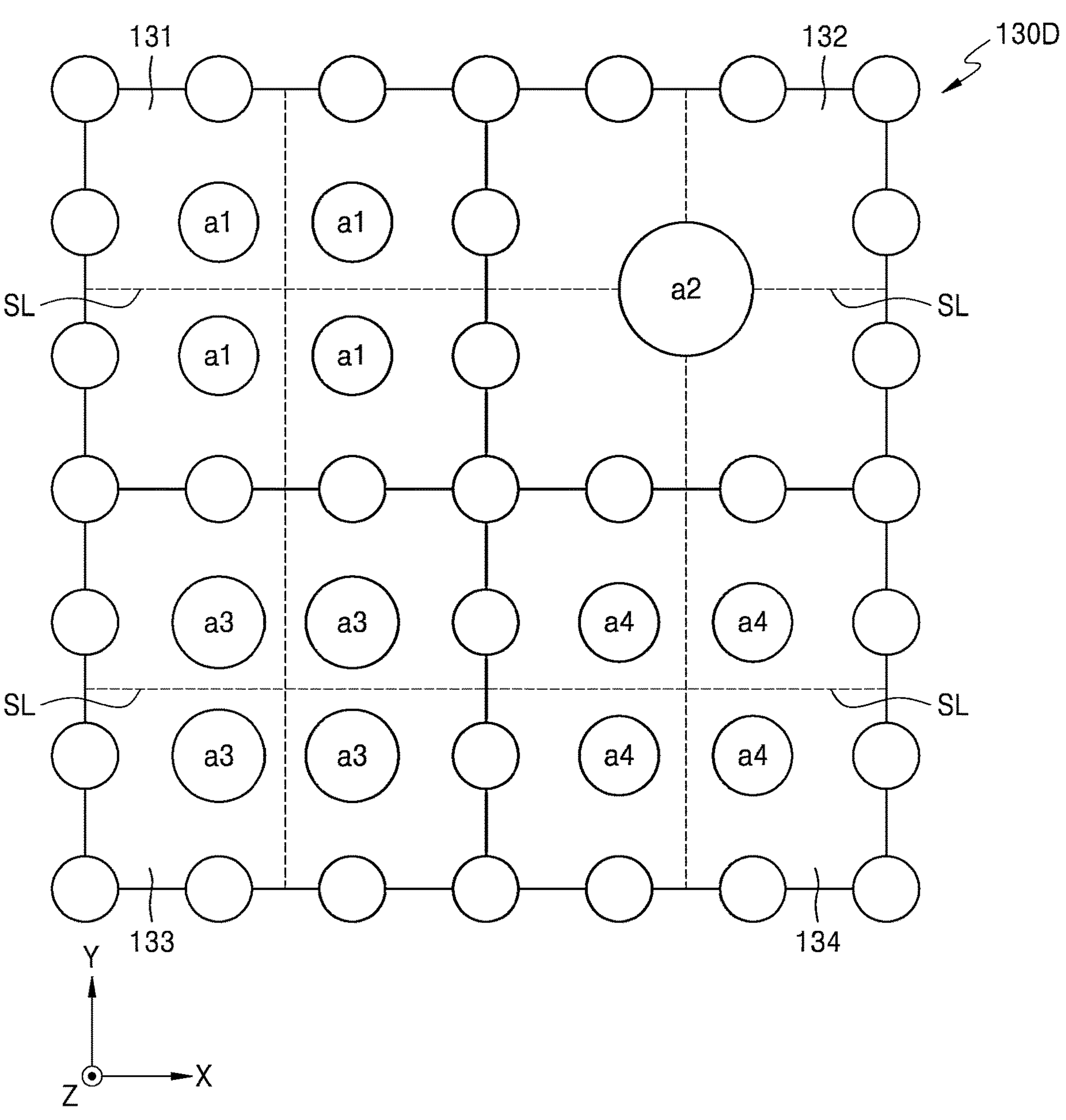

A color separating lens array 130D illustrated in FIG. 16A may have a shape based on an 11×11 arrangement, and only the second center nanopost a2 of the blue pixel corresponding region 132 may be arranged to overlap the center of the separation line SL of the pixel facing thereto. The other nanoposts thereof may be arranged not to overlap the separation line SL.

Figure 16B:
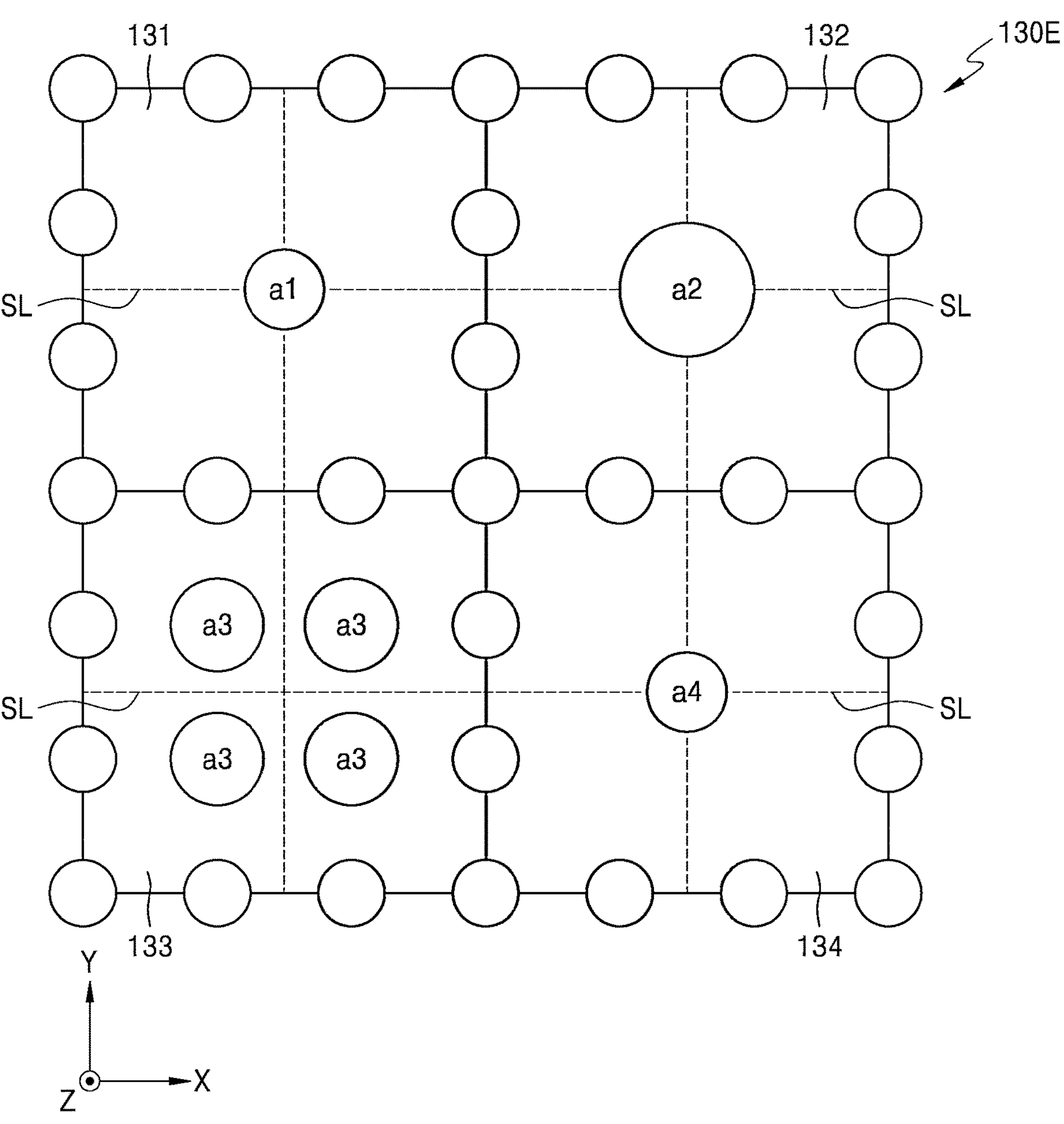

In a color separating lens array 130E illustrated in FIG. 16B, like the second center nanopost a2 of the blue pixel corresponding regions 132, the first center nanopost a1 and the fourth center nanopost a4 of the green pixel corresponding regions 131 and 134 may also be arranged to overlap the center of the separation line SL of the pixel facing thereto. The other nanoposts thereof may be arranged not to overlap the separation line SL.

Figure 16C:
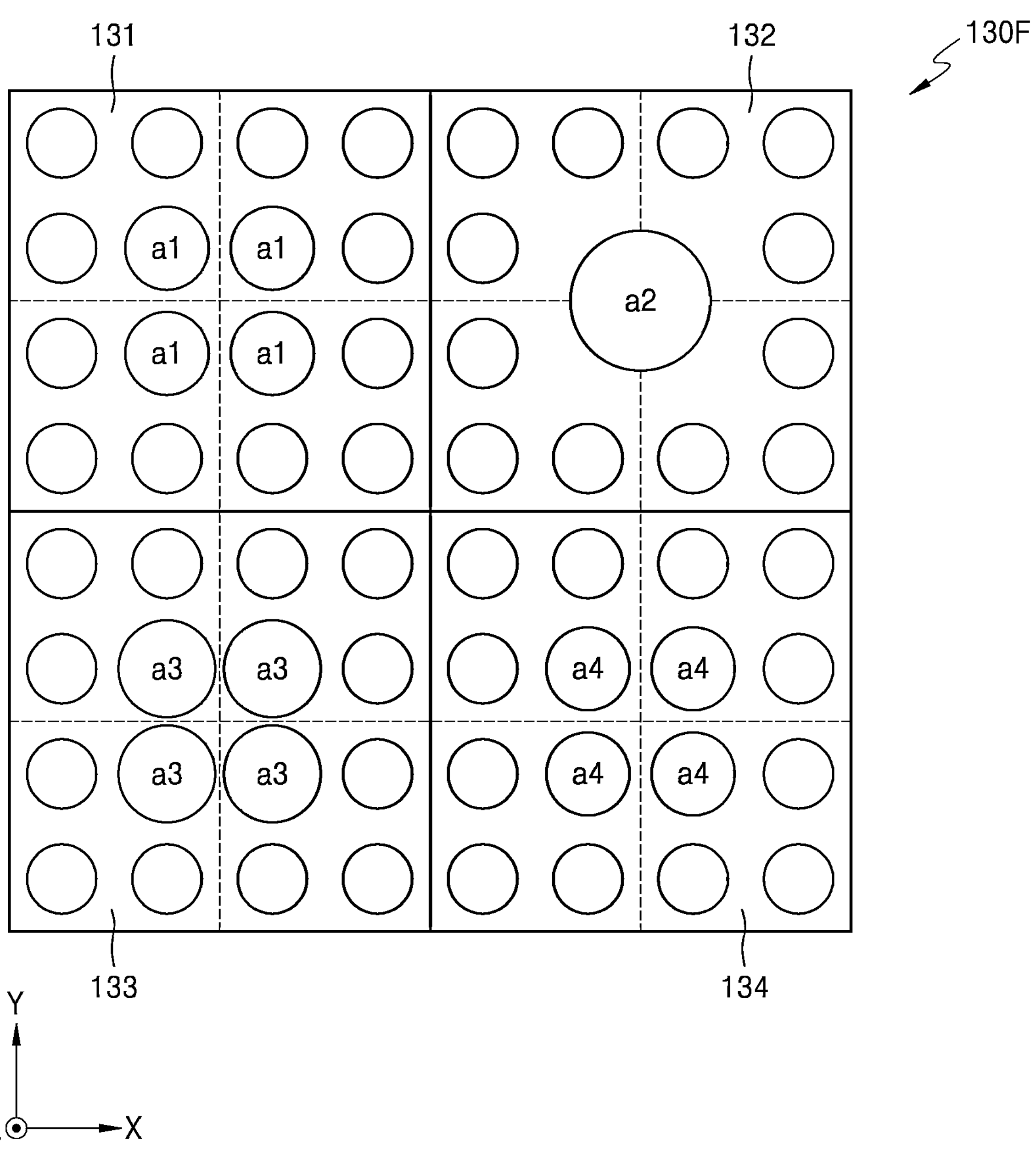
Figure 16D:
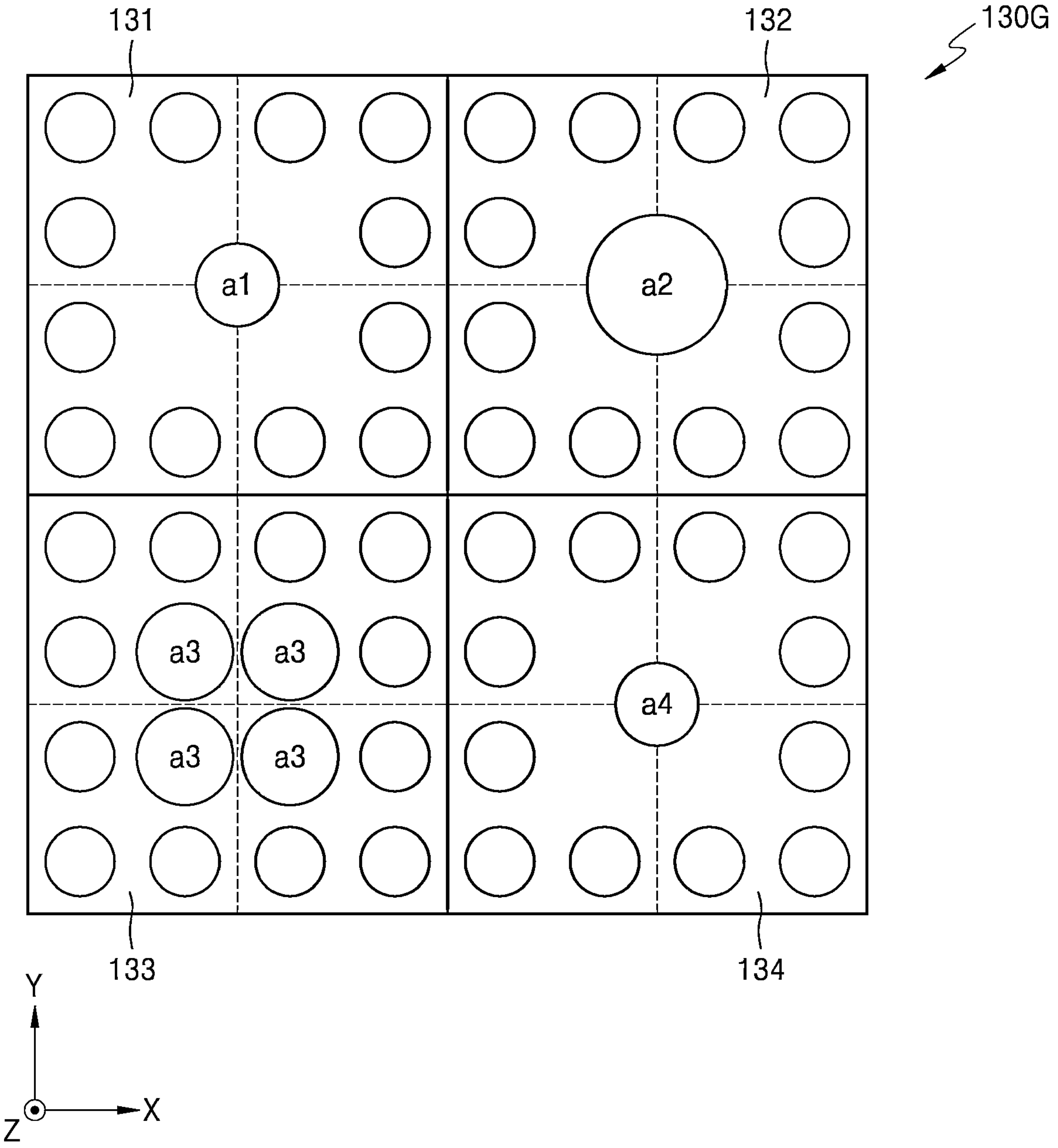

A color separating lens array 130F of FIG. 16C and a color separating lens array 130G of FIG. 16D illustrate an example of the design based on an 8×8 arrangement.

Figure 16E:
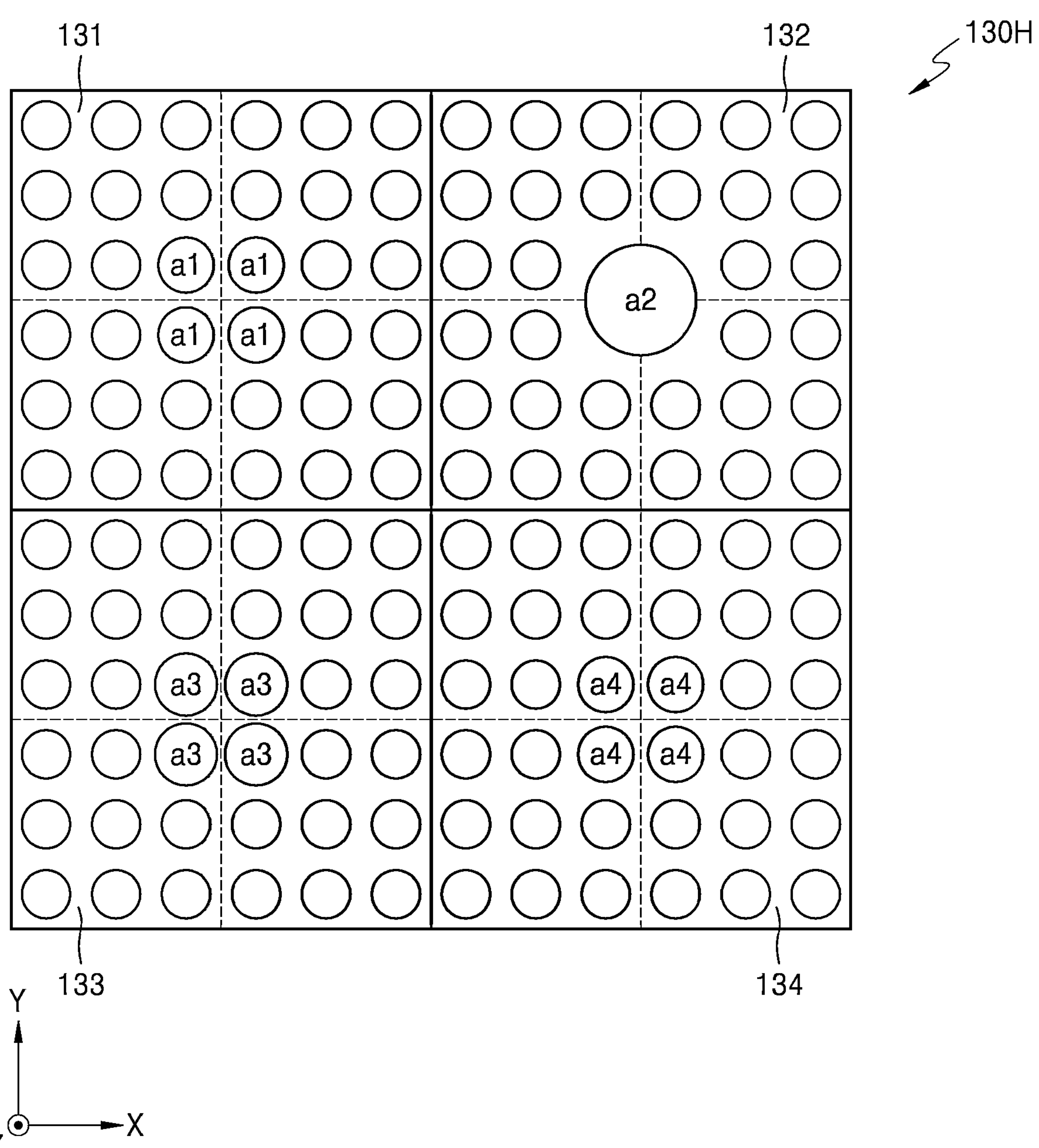
Figure 16F:
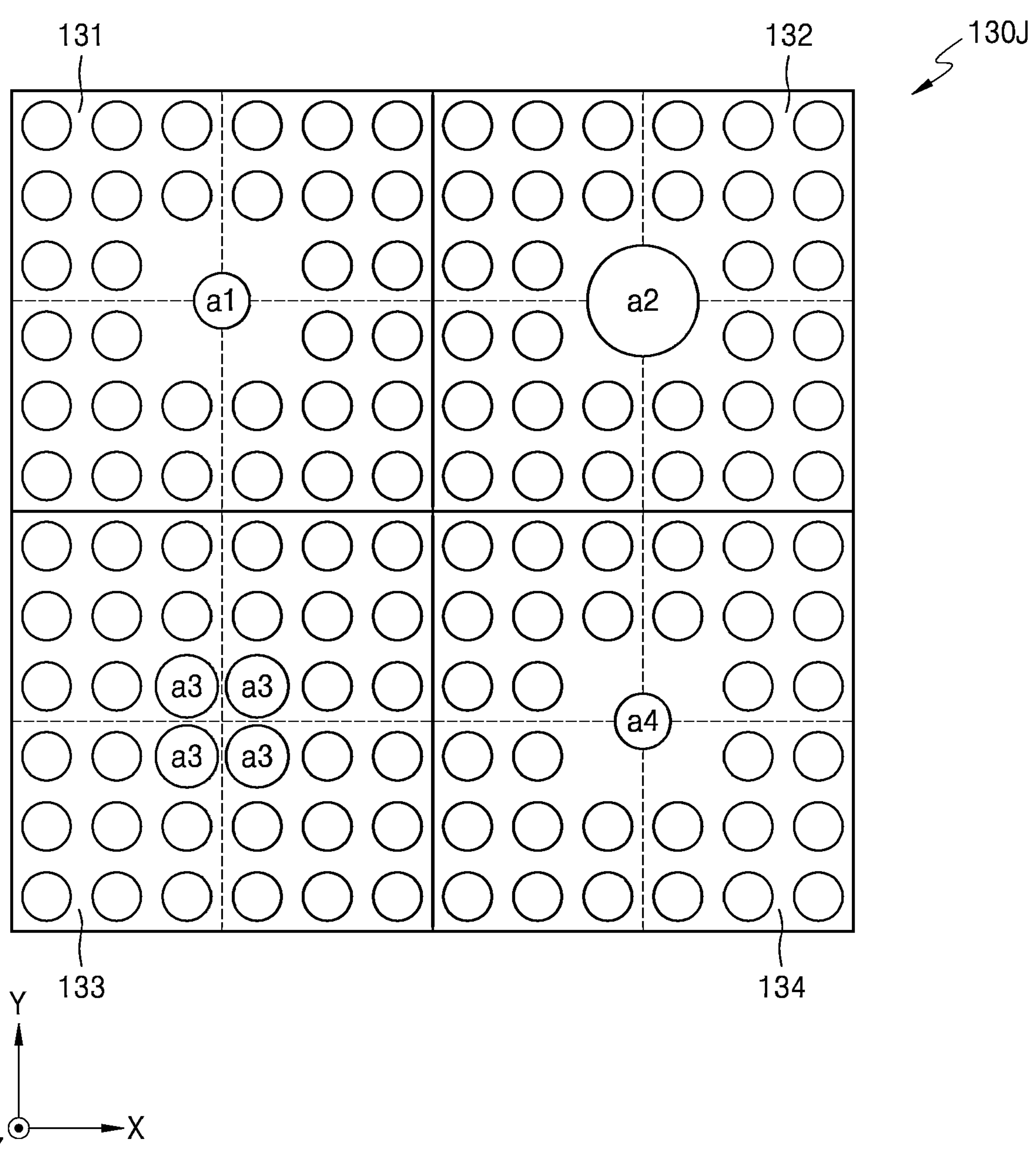

A color separating lens array 130H of FIG. 16E and a color separating lens array 130J of FIG. 16F illustrate an example of the design based on a 12×12 arrangement.

Figure 17:
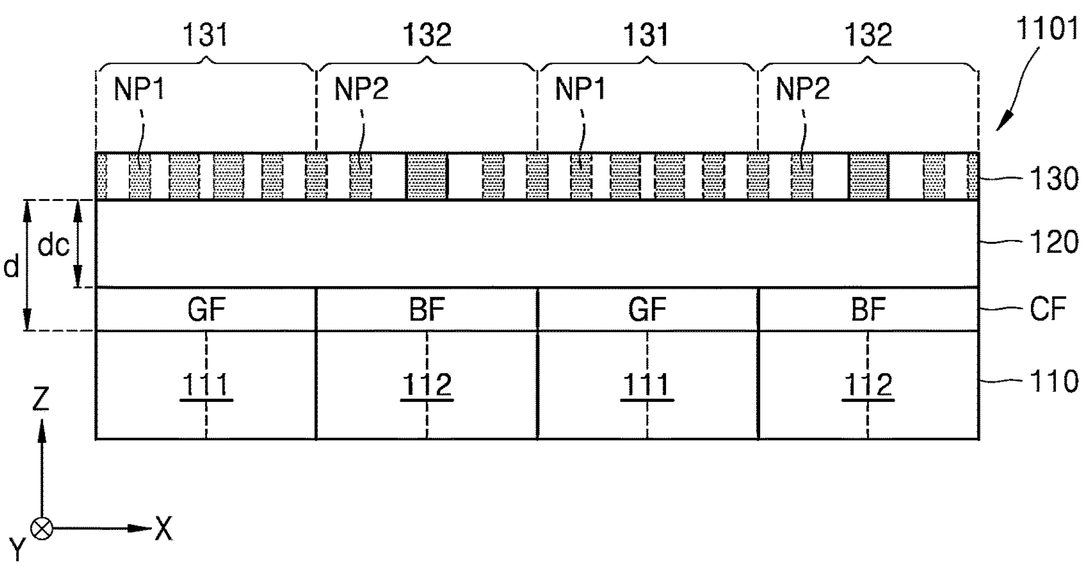
FIG. 17 is a cross-sectional view illustrating a schematic structure of a pixel array of an image sensor according to an embodiment.

FIG. 17 is a cross-sectional view illustrating a schematic structure of a pixel array of an image sensor according to an embodiment.

A pixel array 1101 of the present embodiment may further include a color filter CF arranged between the sensor substrate 110 and the color separating lens array 130. The color filter CF may include a green filter GF, a blue filter BF, a red filter, and a green filter corresponding to the first to fourth pixels 111, 112, 113 and 114, and FIG. 17 is a cross-sectional view corresponding to the cross-section of FIG. 4A.

Because light branched by wavelength by the color separating lens array 130 is incident on the color filter CF, light efficiency degradation due to the color filter CF may hardly occur and the color purity may be increased. When the color filter CF is included, the effective refractive index by the color filter CF and the spacer layer 120 may be considered when the distance d between the sensor substrate 110 and the color separating lens array 130 is set as described above. Considering the distance d and the thickness of the color filter CF determined as described above, a distance dc between the color separating lens array 130 and the color filter CF may be suitably set. For example, dc may be 2 μm or less. Alternatively, dc may be 1 μm or more and 2 μm or less.

Figure 18A:
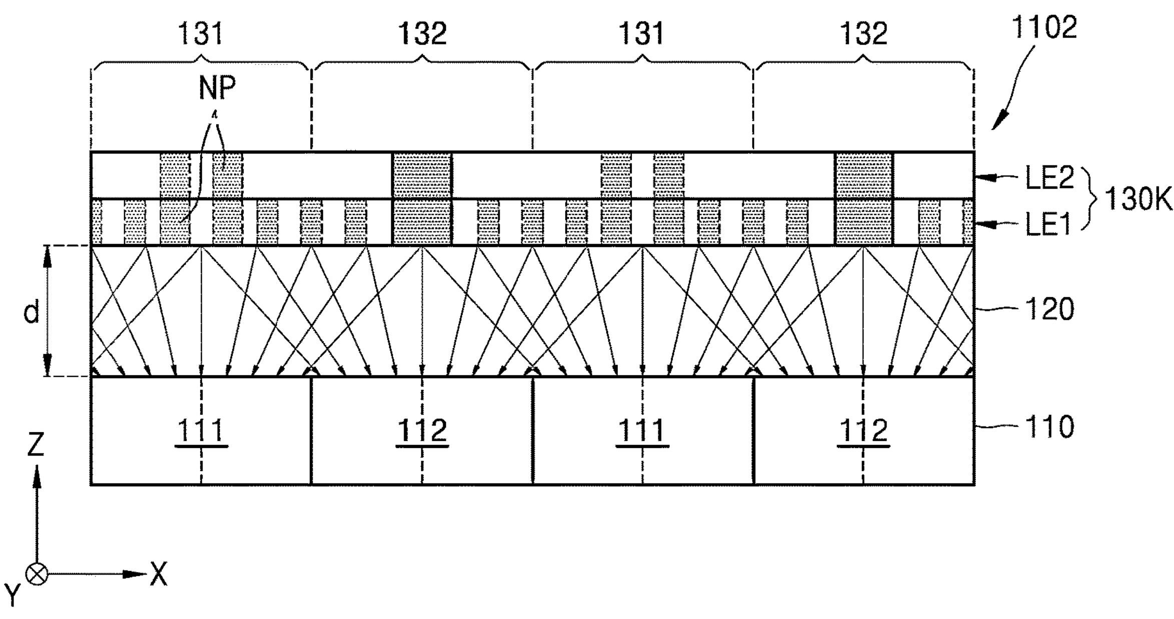
FIG. 18A is a cross-sectional view illustrating a schematic structure of a pixel array of an image sensor according to an embodiment.
Figure 18B:
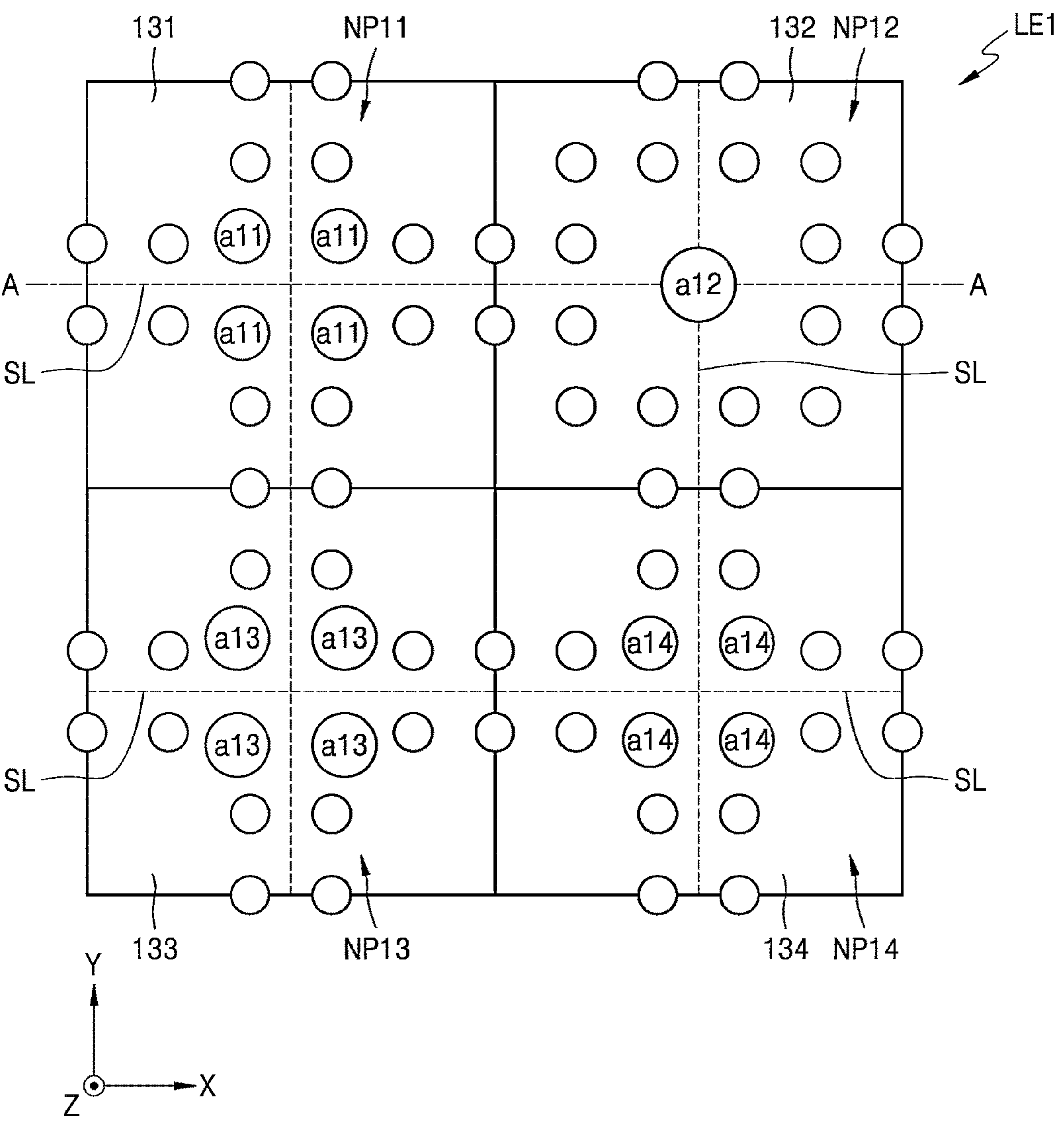
FIGS. 18B and 18C are respectively plan views illustrating nanopost arrays of a first layer and a second layer of a color separating lens array of the image sensor of FIG. 18A.
Figure 18C:
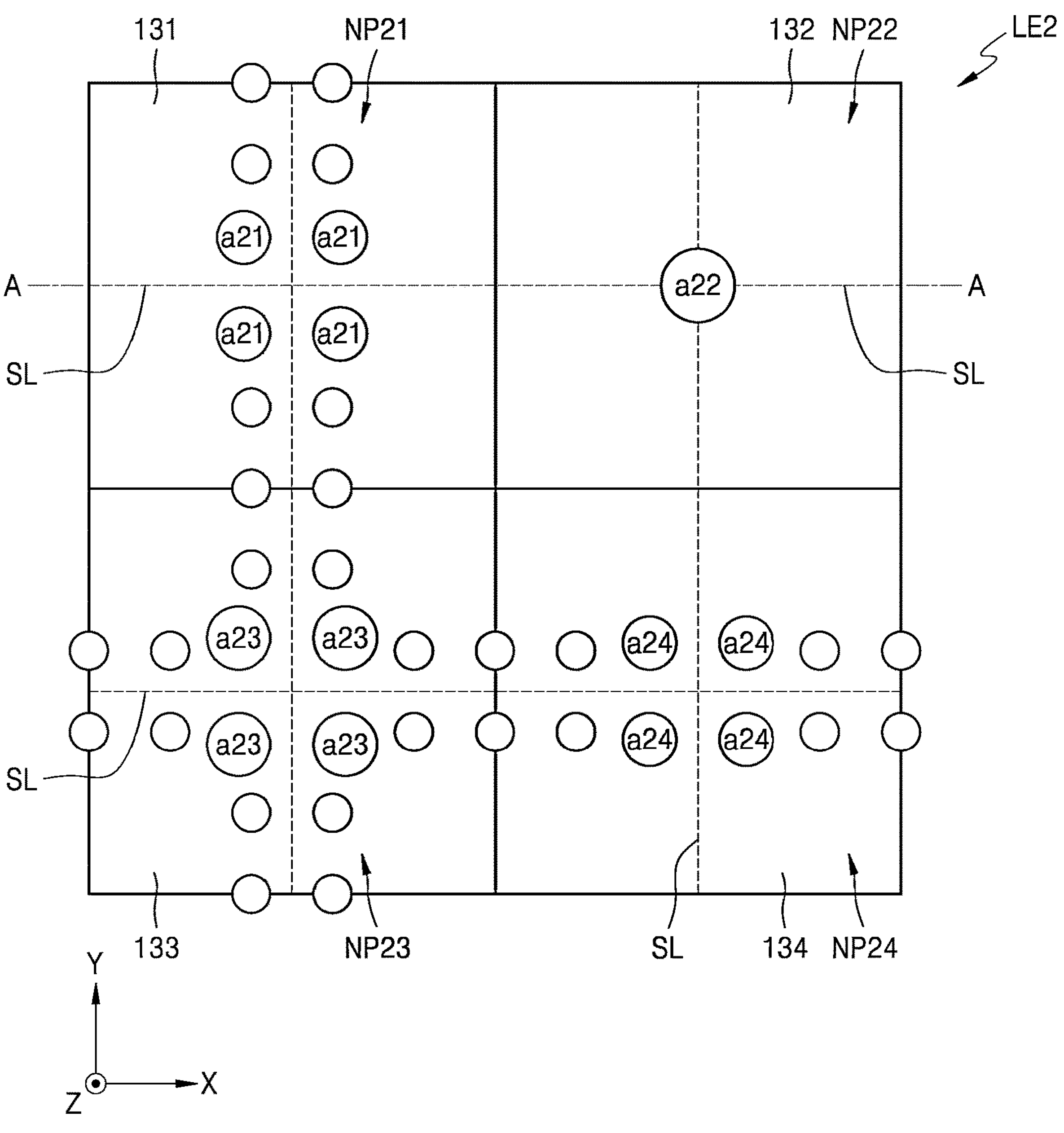

FIG. 18A is a cross-sectional view illustrating a schematic structure of a pixel array of an image sensor according to an embodiment, and FIGS. 18B and 18C are respectively plan views illustrating nanopost arrays of a first layer and a second layer of a color separating lens array of the image sensor of FIG. 18A. FIG. 18A is a cross-sectional view corresponding to a cross-section taken along line AA of FIG. 18B and FIG. 18C.

A pixel array 1102 of the present embodiment may be different from the above embodiments in that nanoposts NP included in a color separating lens array 130K are arranged as a plurality of layers, and the other configurations may be substantially the same as those of the above embodiments.

The color separating lens array 130K may include a first layer LE1 and a second layer LE2 stacked in the third direction (Z direction). Each of the first to fourth pixel corresponding regions 131, 132, 133, and 134 included in the color separating lens array 130K may include a plurality of first to fourth nanoposts arrangements NP11, NP12, NP13, and NP14 located in the first layer LE1, respectively and a plurality of first to fourth nanoposts arrangements NP21, NP22, NP23, and NP24 located in the second layer LE2, respectively.

The arrangement forms of the nanoposts NP of the first layer LE1 and the second layer LE2 may be different from each other, and the design criteria of the color separating lens arrays 130 and 130A to 139J described in the above embodiments may be independently applied to each of the first layer LE1 and the second layer LE2.

In the first layer LE1 and the second layer LE2 of the blue pixel corresponding region 132, each of the second center nanoposts a12 and a22 may be arranged to overlap the center of the separation line SL of the isolation structure DTI included in the blue pixel 112 facing thereto, and in the first layer LE1 and the second layer LE2 of the red pixel corresponding region 133, each of the third center nanoposts a13 and a23 may be arranged not to overlap the center of the separation line SL of the isolation structure DTI included in the red pixel 113 facing thereto.

In the first layer LE1 and the second layer LE2 of the green pixel corresponding regions 131 and 134, as illustrated, the center nanoposts a11, a14, a21, and a24 thereof may be arranged not to overlap the center of the separation line SL of the green pixels 111 and 114 facing thereto.

The second center nanopost a12 of the first layer LE1 and the second center nanopost a22 of the second layer LE2 are illustrated as having the same cross-sectional area; however, this is merely an example and they may have different cross-sectional areas. Likewise, the third center nanopost a13 of the first layer LE1 and the third center nanopost a23 of the second layer LE2 may also have different cross-sectional areas, and the first and fourth center nanoposts all and a14 of the first layer LE1 and the first and fourth center nanoposts a21 and a24 of the second layer LE2 may also have different cross-sectional areas.

Alternately, in the first layer LE1 and the second layer LE2 of the green pixel corresponding regions 131 and 134, like in the blue pixel corresponding region 132, the center nanoposts a13, a14, a23, and a24 thereof may be arranged to overlap the center of the separation line SL of the green pixels 111 and 114 facing thereto.

Alternatively, in the green pixel corresponding regions 131 and 134, the arrangement of the center nanoposts all and a14 of the first layer LE1 and the arrangement of the center nanoposts a21 and a24 of the second layer LE2 may be different from each other. That is, in one layer, the center nanoposts may be arranged to overlap the center of the separation line SL of the green pixels 111 and 114 facing thereto, and in another layer, the center nanoposts may be arranged not to overlap the center of the separation line SL of the green pixels 111 and 114 facing thereto.

An etch stop layer may be further arranged between the first layer LE1 and the second layer LE2. The etch stop layer may be provided to prevent damage to the first layer LE1 that may occur, for example, in the process of manufacturing the second layer LE2 on the first layer LE1 after forming the first layer LE1.

The color separating lens array 130K may have a multi-layer structure of three or more layers.

Figure 19:
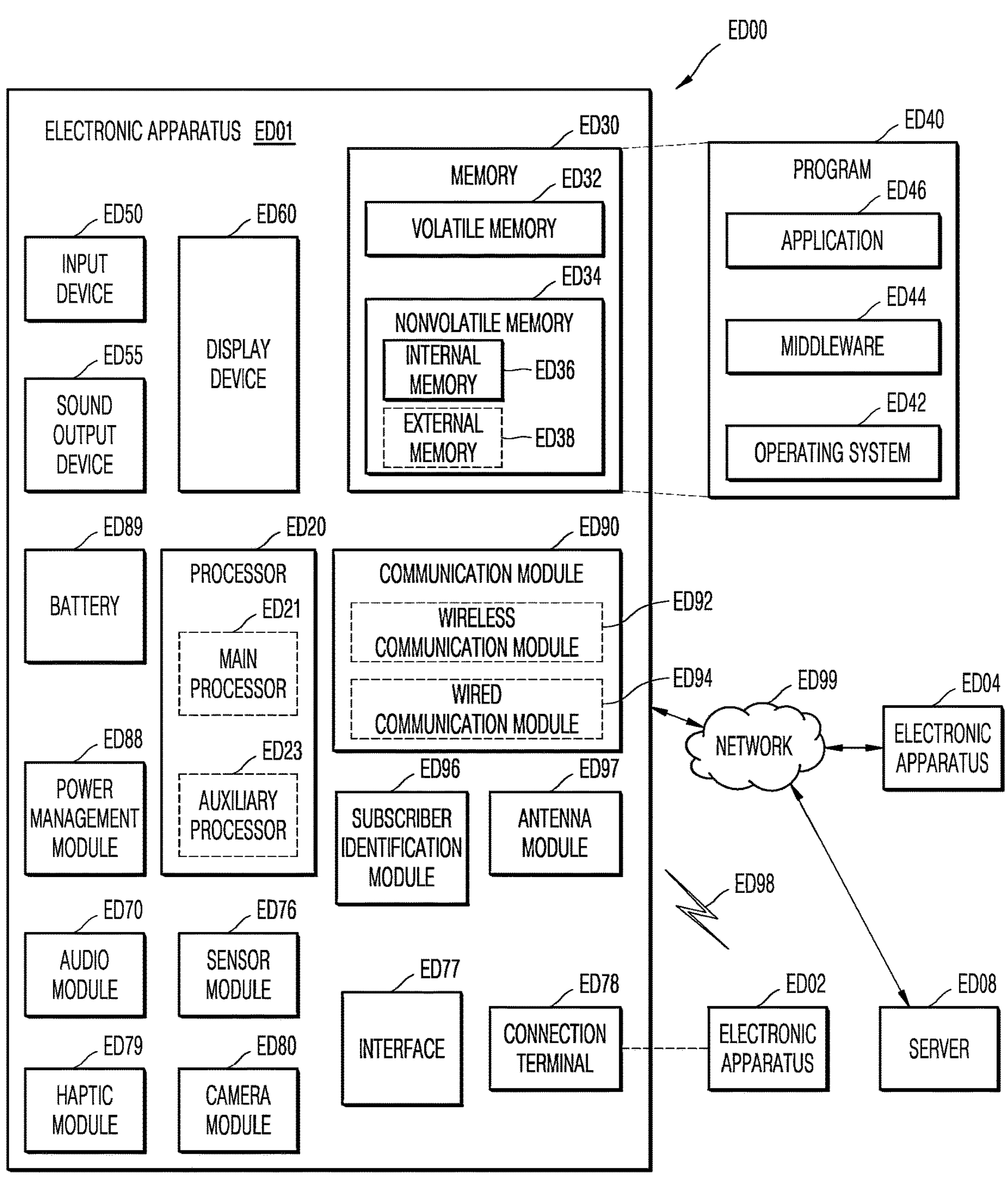
FIG. 19 is a block diagram schematically illustrating an electronic apparatus including an image sensor according to embodiments.

FIG. 19 is a block diagram schematically illustrating an electronic apparatus including an image sensor according to embodiments. Referring to FIG. 19, in a network environment EDO°, the electronic apparatus ED01 may communicate with another electronic apparatus ED02 via a first network ED98 (short-range wireless communication network or the like), or may communicate with another electronic apparatus ED04 and/or a server ED08 via a second network ED99 (long-range wireless communication network or the like). The electronic apparatus ED01 may communicate with the electronic apparatus ED04 via the server ED08. The electronic apparatus ED01 may include a processor ED20, a memory ED30, an input device ED50, a sound output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic apparatus ED01, some (display device ED60 or the like) of the elements may be omitted or another element may be added. Some of the elements may be configured as one integrated circuit. For example, the sensor module ED76 (a fingerprint sensor, an iris sensor, an illuminance sensor, or the like) may be embedded and implemented in the display device ED60 (display or the like).

The processor ED20 may control one or more elements (hardware, software elements, or the like) of the electronic apparatus ED01 connected to the processor ED20 by executing software (program ED40 or the like), and may perform various data processes or operations. As a portion of the data processing or operations, the processor ED20 may load a command and/or data received from another element (sensor module ED76, communication module ED90, or the like) to a volatile memory ED32, may process the command and/or data stored in the volatile memory ED32, and may store result data in a non-volatile memory ED34. The processor ED20 may include a main processor ED21 (central processing unit, application processor, or the like) and an auxiliary processor ED23 (graphic processing unit, image signal processor, sensor hub processor, communication processor, or the like) that may be operated independently from or along with the main processor ED21. The auxiliary processor ED23 may use less power than the main processor ED21 and may perform specialized functions.

The auxiliary processor ED23, on behalf of the main processor ED21 while the main processor ED21 is in an inactive state (sleep state) or along with the main processor ED21 while the main processor ED21 is in an active state (application executed state), may control functions and/or states related to some (display device ED60, sensor module ED76, communication module ED90, or the like) of the elements in the electronic apparatus ED01. The auxiliary processor ED23 (image signal processor, communication processor, or the like) may be implemented as a portion of another element (camera module ED80, communication module ED90, or the like) that is functionally related thereto.

The memory ED30 may store various data required by the elements (processor ED20, sensor module ED76, or the like) of the electronic apparatus ED01. The data may include, for example, input data and/or output data about software (program ED40 or the like) and commands related thereto. The memory ED30 may include the volatile memory ED32 and/or the non-volatile memory ED34.

The program ED40 may be stored as software in the memory ED30, and may include an operation system ED42, middle ware ED44, and/or an application ED46.

The input device ED50 may receive commands and/or data to be used in the elements (processor ED20 or the like) of the electronic apparatus ED01, from outside (user or the like) of the electronic apparatus ED01. The input device ED50 may include a microphone, a mouse, a keyboard, and/or a digital pen (stylus pen).

The sound output device ED55 may output a sound signal to the outside of the electronic apparatus ED01. The sound output device ED55 may include a speaker and/or a receiver. The speaker may be used for a general purpose such as multimedia reproduction or record play, and the receiver may be used to receive a call. The receiver may be coupled as a portion of the speaker or may be implemented as an independent device.

The display device ED60 may provide visual information to the outside of the electronic apparatus ED01. The display device ED60 may include a display, a hologram device, or a projector, and a control circuit for controlling the corresponding device. The display device ED60 may include a touch circuitry set to sense a touch, and/or a sensor circuit (pressure sensor or the like) that is set to measure the strength of a force generated by the touch.

The audio module ED70 may convert sound into an electrical signal or vice versa. The audio module ED 70 may obtain sound through the input device ED50, or may output sound via the sound output device ED55 and/or a speaker and/or a headphone of another electronic apparatus (electronic apparatus EDO or the like) connected directly or wirelessly to the electronic apparatus ED01.

The sensor module ED76 may sense an operating state (power, temperature, or the like) of the electronic apparatus ED01, or an outer environmental state (user state or the like) and may generate an electrical signal and/or data value corresponding to the sensed state. The sensor module ED76 may include a gesture sensor, a gyro-sensor, a pressure sensor, a magnetic sensor, an acceleration sensor, a grip sensor, a proximity sensor, a color sensor, an infrared (IR) sensor, a vivo sensor, a temperature sensor, a humidity sensor, and/or an illuminance sensor.

The interface ED77 may support one or more designated protocols that may be used in order for the electronic apparatus ED01 to be directly or wirelessly connected to another electronic apparatus (electronic apparatus ED02 or the like). The interface ED77 may include a high-definition multimedia interface (HDMI), a universal serial bus (USB) interface, an SD card interface, and/or an audio interface.

The connection terminal ED78 may include a connector by which the electronic apparatus ED01 may be physically connected to another electronic apparatus (electronic apparatus ED02 or the like). The connection terminal ED78 may include an HDMI connector, a USB connector, an SD card connector, and/or an audio connector (headphone connector or the like).

The haptic module ED79 may convert the electrical signal into a mechanical stimulus (vibration, motion, or the like) or an electrical stimulus that the user may sense through a tactile or motion sensation. The haptic module ED79 may include a motor, a piezoelectric device, and/or an electric stimulus device.

The camera module ED80 may obtain a still image and a video. The camera module ED80 may include a lens assembly including one or more lenses, the image sensor 1000 described above, image signal processors, and/or flashes. The lens assembly included in the camera module ED80 may collect light emitted from an object (subject) that is an object to be photographed.

The power management module ED88 may manage the power supplied to the electronic apparatus ED01. The power management module ED88 may be implemented as a portion of a power management integrated circuit (PMIC).

The battery ED89 may supply electric power to elements of the electronic apparatus ED01. The battery ED89 may include a primary battery that is not rechargeable, a secondary battery that is rechargeable, and/or a fuel cell.

The communication module ED90 may support establishment of a direct (wired) communication channel and/or a wireless communication channel between the electronic apparatus ED01 and another electronic apparatus (electronic apparatus ED02, electronic apparatus ED04, server ED08, or the like), and execution of communication through the established communication channel. The communication module ED90 may be operated independently from the processor ED20 (application processor or the like) and may include one or more communication processors that support the direct communication and/or the wireless communication. The communication module ED90 may include a wireless communication module ED92 (cellular communication module, a short-range wireless communication module, a global navigation satellite system (GNSS) communication module) and/or a wired communication module ED94 (local area network (LAN) communication module, a power line communication module, or the like). From among the communication modules, a corresponding communication module may communicate with another electronic apparatus via a first network ED09 (short-range communication network such as Bluetooth, WiFi direct, or infrared data association (IrDA)) or a second network ED99 (long-range communication network such as a cellular network, Internet, or computer network (LAN, WAN, or the like)). Such various kinds of communication modules may be integrated as one element (single chip or the like) or may be implemented as a plurality of elements (a plurality of chips) separately from one another. The wireless communication module ED92 may identify and authenticate the electronic apparatus ED01 in a communication network such as the first network ED98 and/or the second network ED99 by using subscriber information (international mobile subscriber identifier (IMSI) or the like) stored in the subscriber identification module ED96.

The antenna module ED97 may transmit/receive the signal and/or power to/from the outside (another electronic apparatus or the like). An antenna may include a radiator formed as a conductive pattern formed on a substrate (PCB or the like). The antenna module ED97 may include one or more antennas. When the antenna module ED97 includes a plurality of antennas, from among the plurality of antennas, an antenna that is suitable for the communication type used in the communication network such as the first network ED98 and/or the second network ED99 may be selected by the communication module ED90. The signal and/or the power may be transmitted between the communication module ED90 and another electronic apparatus via the selected antenna. Another component (RFIC or the like) other than the antenna may be included as a portion of the antenna module ED97.

Some of the elements may be connected to one another via the communication method among the peripheral devices (bus, general purpose input and output (GPIO), serial peripheral interface (SPI), mobile industry processor interface (MIPI), or the like) and may exchange signals (commands, data, or the like).

The command or data may be transmitted or received between the electronic apparatus ED01 and the external electronic apparatus ED04 via the server ED08 connected to the second network ED99. Other electronic apparatuses ED02 and ED04 may be apparatuses that are the same as or different kinds from the electronic apparatus ED01. All or some of the operations executed in the electronic apparatus ED01 may be executed in one or more apparatuses among the other electronic apparatuses ED02, ED04, and ED08. For example, when the electronic apparatus ED01 has to perform a certain function or service, the electronic apparatus ED01 may request one or more other electronic apparatuses to perform some or entire function or service, instead of executing the function or service by itself. One or more electronic apparatuses receiving the request may execute an additional function or service related to the request and may transmit the result of the execution to the electronic apparatus ED01. For this purpose, for example, a cloud computing, a distributed computing, or a client-server computing technique may be used.

Figure 20:
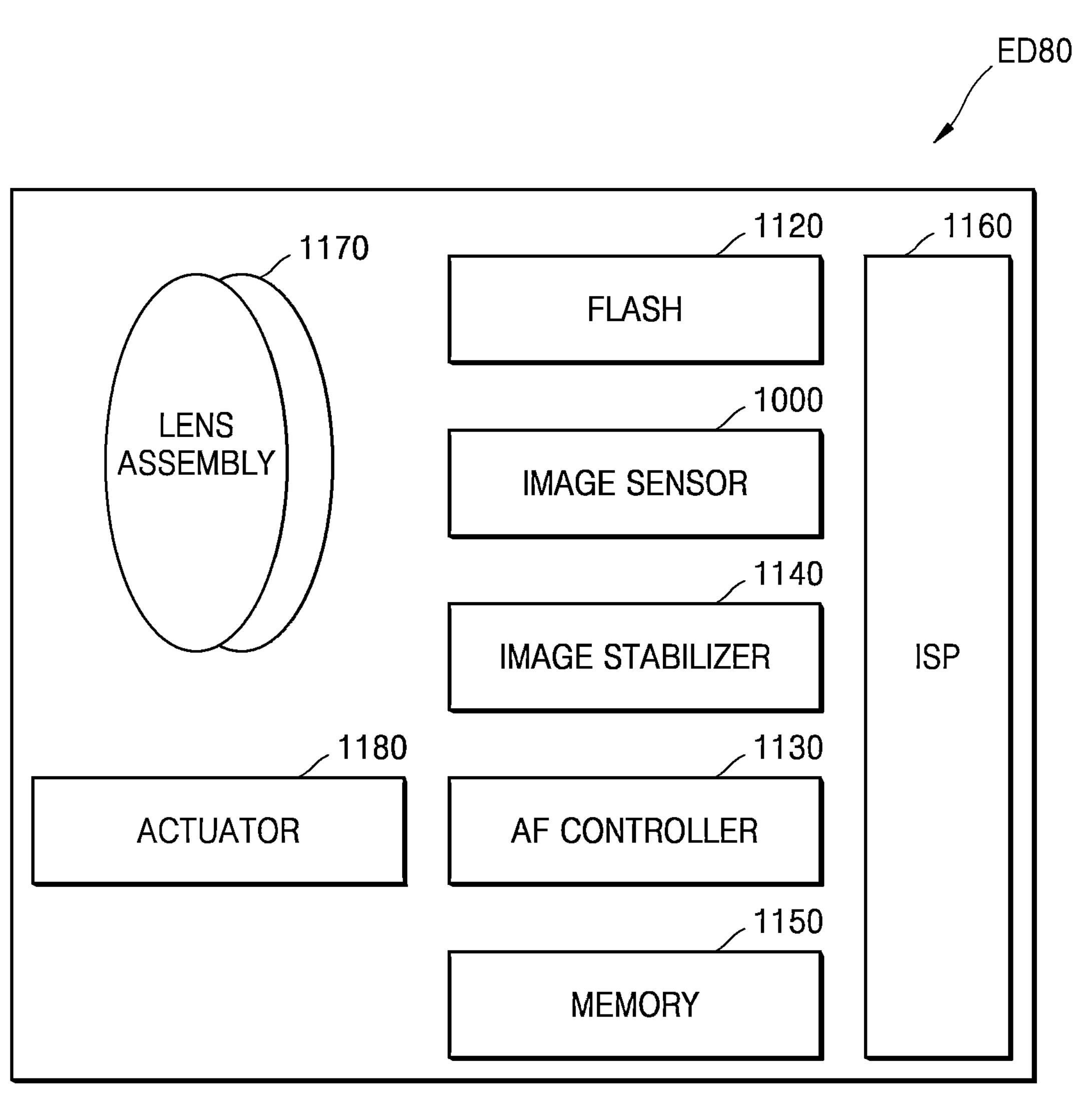
FIG. 20 is a block diagram schematically illustrating a camera module included in the electronic apparatus of FIG. 19.

FIG. 20 is a block diagram illustrating an example of the camera module ED80 included in the electronic apparatus ED01 of FIG. 19. Referring to FIG. 20, the camera module ED80 may include a lens assembly 1170, a flash 1120, an image sensor 1000, an image stabilizer 1140, an AF controller 1130, a memory 1150 (a buffer memory or the like), an actuator 1180, and/or an image signal processor (ISP) 1160.

The lens assembly 1170 may collect light emitted from an object, that is, an object to be photographed. The lens assembly 1170 may include one or more optical lenses. The lens assembly 1170 may include a path converting member that bends the path of light to direct the light toward the image sensor 1000. The camera module ED80 may have a vertical shape or a folded shape depending on whether the path converting member is included and the arrangement form with the optical lens. The camera module ED80 may include a plurality of lens assemblies 1170, and in this case, the camera module ED80 may include a dual camera module, a 360-degree camera, or a spherical camera. Some of the plurality of lens assemblies 1170 may have the same lens properties (viewing angle, focal length, autofocus, F number, optical zoom, or the like) or may have different lens properties. The lens assembly 1170 may include a wide-angle lens or a telephoto lens.

The actuator 1180 may drive the lens assembly 1170. For example, at least some of the optical lens and the path converting member constituting the lens assembly 1170 may be moved by the actuator 1180. The optical lens may be moved along an optical axis, and an optical zoom ratio may be adjusted by adjusting the distance between adjacent lenses by moving at least a portion of the optical lens included in the lens assembly 1170.

The actuator 1180 may adjust the position of any one optical lens included in the lens assembly 1170 such that the image sensor 1000 may be located at a focal length of the lens assembly 1170. The actuator 1180 may drive the lens assembly 1170 according to an AF driving signal received from the AF controller 1130.

The flash 1120 may emit light that is used to strengthen the light emitted or reflected from the object. The flash 1120 may emit visible light or infrared light. The flash 1120 may include one or more light emitting diodes (red-green-blue (RGB) LED, white LED, infrared LED, ultraviolet LED, or the like), and/or a Xenon lamp. The image sensor 1000 may be the image sensor 1000 described above with reference to FIG. 1, that is, may include any one of various color separating lens arrays 130 and 130A to 130K described above or any combined and/or modified structure thereof. The image sensor 1000 may obtain an image corresponding to the object by converting the light emitted or reflected from the object and then received through the lens assembly 1170 into an electrical signal.

As described above, each pixel of the image sensor 1000 may include a plurality of light sensing cells forming a plurality of channels, for example, a plurality of light sensing cells arranged in 2×2. Some of the pixels may be used as an AF pixel, and the image sensor 1000 may generate an AF driving signal from the signals of a plurality of channels in the AF pixel. Because the size and arrangement of the nanoposts of the color separating lens array included in the image sensor 1000 are designed to increase the autofocus contrast, the accuracy of AF driving may be improved.

In response to a motion of the camera module ED80 or the electronic apparatus ED01 including the camera module ED80, the image stabilizer 1140 may move one or more lenses included in the lens assembly 1170 or the image sensor 1000 in a certain direction or may control the operation characteristics of the image sensor 1000 (adjusting of a read-out timing or the like) to compensate for a negative influence of the motion. The image stabilizer 1140 may sense the movement of the camera module ED80 or the electronic apparatus ED01 by using a gyro sensor or an acceleration sensor arranged inside or outside the camera module ED80. The image stabilizer 1140 may be implemented as an optical type.

The AF controller 1130 may generate an AF driving signal from a signal value sensed from the AF pixel of the image sensor 1000. The AF controller 1130 may control the actuator 1180 according to the AF driving signal.

The memory 1150 may store some or all data of the image obtained through the image sensor 1000 for next image processing operation. For example, when a plurality of images are obtained at a high speed, obtained original data (Bayer-patterned data, high-resolution data, or the like) may be stored in the memory 1150 and only a low-resolution image may be displayed and then original data of a selected image (user selection or the like) may be transmitted to the image signal processor 1160. The memory 1150 may be integrated with the memory ED30 of the electronic apparatus ED01 or may include an additional memory that is operated independently.

The image signal processor 1160 may perform image processing on the image obtained through the image sensor 1000 or the image data stored in the memory 1150. The image processing may include depth map generation, three-dimensional modeling, panorama generation, feature extraction, image synthesis, and/or image compensation (noise reduction, resolution adjustment, brightness adjustment, blurring, sharpening, softening, or the like). The image signal processor 1160 may perform controlling (exposure time control, read-out timing control, or the like) of the elements (image sensor 1000 or the like) included in the camera module ED80. The image processed by the image signal processor 1160 may be stored again in the memory 1150 for additional process, or may be provided to an external element of the camera module ED80 (the memory ED30, the display device ED60, the electronic apparatus ED02, the electronic apparatus ED04, the server ED08, or the like). The image signal processor 1160 may be integrated with the processor ED20 or may be configured as an additional processor that is operated independently from the processor ED20. When the image signal processor 1160 is configured as an additional processor separately from the processor ED20, the image processed by the image signal processor 1160 may undergo additional image processing by the processor ED20 and then may be displayed on the display device ED60.

The AF controller 1130 may be integrated into the image signal processor 1160. The image signal processor 1160 may generate an AF signal by processing the signals from the autofocusing pixels of the image sensor 1000, and the AF controller 1130 may convert the AF signal into a driving signal for the actuator 1180 and transmit the driving signal to the actuator 1180.

The electronic apparatus ED01 may include one or more additional camera modules ED80 having different properties or functions. The camera module may also include a configuration similar to the configuration of the camera module ED80 of FIG. 19, and the image sensor included therein may be implemented as a charge coupled device (CCD) sensor and/or a complementary metal oxide Semiconductor (CMOS) sensor and may include one or more sensors selected from image sensors having different properties, such as an RGB sensor, a black and white (BW) sensor, an IR sensor, or a UV sensor. In this case, one of the camera modules ED80 may include a wide-angle camera and another may include a telephoto camera. Similarly, one of the camera modules ED80 may include a front camera and another may include a rear camera.

The image sensor 1000 according to embodiments may be applied to various electronic apparatuses. The image sensor according to embodiments may be applied to a mobile phone or a smartphone, a tablet, a smart tablet, a digital camera, a camcorder, a notebook computer, a television, a smart television, or the like. For example, a smartphone or a smart tablet may include a plurality of high-resolution cameras each having a high-resolution image sensor mounted thereon. Depth information of objects in an image may be extracted, outfocusing of the image may be adjusted, or objects in the image may be automatically identified by using the high-resolution cameras.

Also, the image sensor 1000 may be applied to a smart refrigerator, a security camera, a robot, a medical camera, or the like. For example, the smart refrigerator may automatically recognize food in the refrigerator by using the image sensor and may notify the user of the existence of a certain kind of food, kinds of food put into or taken out, or the like through a smartphone. Also, the security camera may provide an ultra-high-resolution image and may allow the user to recognize an object or a person in the image even in dark environment by using high sensitivity. The robot may be input to a disaster or industrial site that a person may not directly access, to provide the user with high-resolution images. The medical camera may provide high-resolution images for diagnosis or surgery and may dynamically adjust a field of view.

Also, the image sensor 1000 may be applied to a vehicle. The vehicle may include a plurality of vehicle cameras arranged at various positions. Each of the vehicle cameras may include an image sensor according to an embodiment. The vehicle may provide the driver with various information about inside or around the vehicle by using the plurality of vehicle cameras and may provide information necessary for autonomous driving by automatically recognizing objects or persons in the image.

The color separating lens array included in the image sensor described above may separate and condense light by wavelength without absorbing or blocking incident light and the light utilization efficiency of the image sensor may be improved.

Also, the color separating lens array may have a structure in which the focal length of light condensed onto a pixel sensing light of a short-wavelength band among the pixels of the image sensor may be shortened, and the autofocus contrast thereof may be increased.

Also, each pixel of the sensor substrate of the color separating lens array may include a plurality of light sensing cells and the amount of light directed toward the isolation structure separating adjacent light sensing cells may be reduced, so the light efficiency thereof may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. An image sensor comprising:

a sensor substrate comprising a first pixel sensing light of a first wavelength, a second pixel sensing light of a second wavelength shorter than the first wavelength, and a third pixel sensing light of a third wavelength longer than the first wavelength, wherein each of the first to third pixels comprises a plurality of light sensing cells; and a color separating lens array changing phase of light of the first wavelength, the second wavelength, and the third wavelength and condensing the phase-changed light of the first wavelength, the second wavelength, and the third wavelength onto the first pixel, the second pixel, and the third pixel respectively, wherein the color separating lens array comprises a first pixel corresponding region, a second pixel corresponding region, and a third pixel corresponding region respectively facing the first pixel, the second pixel and the third pixel, wherein the first pixel corresponding region comprises a plurality of first nanoposts, the second pixel corresponding region comprises a plurality of second nanoposts, and the third pixel corresponding region comprises a plurality of third nanoposts, a second center nanopost having a greatest cross-sectional width among the plurality of second nanoposts is arranged at a position overlapping a center of the second pixel, and a third center nanopost having a greatest cross-sectional width among the plurality of third nanoposts is arranged at a position not overlapping a center of the third pixel.

2. The image sensor of claim 1, wherein a width of the second center nanopost is greater than or equal to a width of the third center nanopost.

3. The image sensor of claim 2, wherein each of the first to third pixels includes an isolation structure having a shape separating adjacent light sensing cells, wherein the light sensing cells are disposed in a first direction and a second direction, the first direction and the second direction being perpendicular to each other, and when viewed in a third direction perpendicular to the first direction and the second direction, the second center nanopost is arranged to overlap a center of the isolation structure included in the second pixel.

4. The image sensor of claim 3, wherein when viewed in the third direction, second nanoposts other than the second center nanopost among the plurality of second nanoposts are arranged not to overlap the isolation structure included in the second pixel.

5. The image sensor of claim 4, wherein when viewed in the third direction, all of the plurality of first nanoposts is arranged not to overlap the isolation structure included in the first pixel.

6. The image sensor of claim 5, wherein a first center nanopost having a greatest cross-sectional width among the plurality of first nanoposts is arranged closer to a center of the first pixel corresponding region than other of the plurality of first nanoposts.

7. The image sensor of claim 6, wherein the second center nanopost and other second nanoposts among the plurality of second nanoposts are arranged to partially overlap each other when viewed in the first direction, and the first center nanopost and other first nanoposts among the plurality of first nanoposts are arranged to partially overlap each other when viewed in the first direction.

8. The image sensor of claim 7, wherein degrees of the overlapping are different from each other in the second pixel corresponding region and the first pixel corresponding region.

9. The image sensor of claim 6, wherein a width of the first center nanopost is less than or equal to the width of the second center nanopost and the width of the third center nanopost.

10. The image sensor of claim 3, wherein the third center nanopost among the plurality of third nanoposts is arranged closer to a center of the third pixel corresponding region than other of the plurality of third nanoposts.

11. The image sensor of claim 10, wherein the width of the third center nanopost is greater than or equal to a width of a first center nanopost having a greatest cross-sectional width among the plurality of first nanoposts.

12. The image sensor of claim 3, wherein when viewed in the third direction, a first center nanopost having a greatest cross-sectional width among the plurality of first nanoposts is arranged to overlap a center of the isolation structure included in the first pixel.

13. The image sensor of claim 12, wherein the second center nanopost and other second nanoposts among the plurality of second nanoposts are arranged to partially overlap each other when viewed in the first direction, and the first center nanopost and other first nanoposts among the plurality of first nanoposts are arranged to partially overlap each other when viewed in the first direction.

14. The image sensor of claim 13, wherein degrees of the overlapping are different from each other in the second pixel corresponding region and the first pixel corresponding region.

15. The image sensor of claim 12, wherein a width of the first center nanopost is less than or equal to the width of the second center nanopost.

16. The image sensor of claim 1, wherein each of the plurality of first to third nanoposts is stacked and arranged as a plurality of layers.

17. The image sensor of claim 1, wherein the sensor substrate further comprises a fourth pixel sensing a light of the first wavelength, and the first to fourth pixels are arranged in a Bayer pattern form.

18. The image sensor of claim 1, wherein a distance between the sensor substrate and the color separating lens array is less than a focal length of the the color separating lens array for light of the first wavelength.

19. The image sensor of claim 1, further comprising a color filter arranged between the sensor substrate and the color separating lens array, wherein a distance between the color separating lens array and the color filter is about 1 μm or more and about 2 μm or less.

20. An electronic apparatus comprising:

a lens assembly comprising one or more lenses and forming an optical image of an object;

an image sensor converting the optical image formed by the lens assembly into an electrical signal; and a processor configured to process the electrical signal generated by the image sensor, wherein the image sensor comprises:

a sensor substrate comprising a first pixel sensing light of a first wavelength, a second pixel sensing light of a second wavelength shorter than the first wavelength, and a third pixel sensing light of a third wavelength longer than the first wavelength, wherein each of the first to third pixels comprises a plurality of light sensing cells independently sensing light; and a color separating lens array changing phase of light of the first wavelength, the second wavelength, and the third wavelength and condensing the phase-changed light of the first wavelength, the second wavelength, and the third wavelength onto the first pixel, the second pixel, and the third pixel respectively, wherein the color separating lens array comprises a first pixel corresponding region, a second pixel corresponding region, and a third pixel corresponding region respectively facing the first pixel, the second pixel and the third pixel, wherein the first pixel corresponding region comprises a plurality of first nanoposts, the second pixel corresponding region comprises a plurality of second nanoposts, and the third pixel corresponding region comprises a plurality of third nanoposts, a second center nanopost having a greatest cross-sectional width among the plurality of second nanoposts is arranged at a position overlapping a center of the second pixel, and a third center nanopost having a greatest cross-sectional width among the plurality of third nanoposts is arranged at a position not overlapping a center of the third pixel.

* * * * *